(12) United States Patent
Ikeda et al.

(10) Patent No.: US 8,248,864 B2
(45) Date of Patent: Aug. 21, 2012

(54) SEMICONDUCTOR MEMORY DEVICE

(75) Inventors: Hidetoshi Ikeda, Kanagawa (JP);
Koichi Takeda, Kanagawa (JP)

(73) Assignee: Renesas Electronics Corporation,
Kawasaki, Kanagawa (JP)

( * ) Notice: Subject to any disclaimer, the term of this patent is extended or adjusted under 35 U.S.C. 154(b) by 227 days.

(21) Appl. No.: 12/801,859

(22) Filed: Jun. 29, 2010

(65) Prior Publication Data

US 2011/0019493 A1 Jan. 27, 2011

(30) Foreign Application Priority Data

Jul. 27, 2009 (JP) ................................. 2009-174043
Nov. 24, 2009 (JP) ................................. 2009-266234
May 11, 2010 (JP) ................................. 2010-109018

(51) Int. Cl.
*G11C 5/06* (2006.01)

(52) U.S. Cl. .................. 365/189.05; 365/203; 365/207

(58) Field of Classification Search ............. 365/189.05, 365/203, 207
See application file for complete search history.

(56) References Cited

U.S. PATENT DOCUMENTS

| 5,274,598 | A | * | 12/1993 | Fujii et al. ..................... 365/205 |
| 5,568,438 | A | | 10/1996 | Penchuk |
| 5,596,539 | A | * | 1/1997 | Passow et al. ............. 365/210.1 |
| 6,462,584 | B1 | * | 10/2002 | Proebsting ..................... 327/52 |
| 7,545,693 | B2 | * | 6/2009 | Toda ............................. 365/205 |
| 8,014,212 | B2 | * | 9/2011 | Nagata ..................... 365/189.03 |
| 2002/0015328 | A1 | * | 2/2002 | Dono et al. ............. 365/185.08 |
| 2007/0247941 | A1 | * | 10/2007 | Hirabayashi .................. 365/208 |

FOREIGN PATENT DOCUMENTS

| JP | 7-302497 A | 11/1995 |
| JP | 11-509667 T | 8/1999 |

* cited by examiner

*Primary Examiner* — Tuan T. Nguyen
(74) *Attorney, Agent, or Firm* — McGinn IP Law Group, PLLC

(57) ABSTRACT

Provided is a semiconductor memory device including a plurality of memory cells that are connected to a word line and read data, a plurality of bit line pairs that are connected respectively to the plurality of memory cells, a column selector that selects one of the plurality of bit line pairs according to a column selection signal, a sense amplifier circuit that has an input terminal pair connected to the column selector and is activated according to a sense amplifier activation signal, an offset voltage adjustment circuit that is connected to the sense amplifier circuit and adjusts an offset voltage of the sense amplifier circuit according to the weight control signal, and a weight control circuit that is connected to an output terminal pair of the sense amplifier circuit and outputs a weight control signal with a value corresponding to an output of the activated sense amplifier circuit.

30 Claims, 38 Drawing Sheets

| RSB | LE | OUT | OUTB | Z1 | Z2 |
|---|---|---|---|---|---|
| 0 | 0 | 0 | 0 | — | — |
| | | | 1 | — | — |
| | | 1 | 0 | — | — |
| | | | 1 | 0 | 0 |
| | 1 | * | * | — | — |
| 1 | 0 | * | * | HOLD | HOLD |
| | 1 | 0 | 0 | — | — |
| | | | 1 | 1 | 0 |
| | | 1 | 0 | 0 | 1 |
| | | | 1 | — | — |

"*"= GIVEN VALUE

Fig. 8

| RSB | LE | OUT | OUTB | Z1 | Z2 |
|---|---|---|---|---|---|
| 0 | 0 | 0 | 0 | — | — |
|   |   |   | 1 | — | — |
|   |   | 1 | 0 | — | — |
|   |   |   | 1 | 0 | 0 |
|   | 1 | * | * | — | — |
| 1 | 0 | * | * | HOLD | HOLD |
|   | 1 | 0 | 0 | — | — |
|   |   |   | 1 | 1 | 0 |
|   |   | 1 | 0 | 0 | 1 |
|   |   |   | 1 | 0 | 0 |

"*"= GIVEN VALUE

Fig. 17

| RSB | LE1 | LE2 | OUT | OUTB | Z11 | Z21 | Z12 | Z22 |
|---|---|---|---|---|---|---|---|---|
| 0 | 0 | 0 | 0 | 0 | — | — | — | — |
| 0 | 0 | 0 | 0 | 1 | — | — | — | — |
| 0 | 0 | 0 | 1 | 0 | — | — | — | — |
| 0 | 0 | 0 | 1 | 1 | 0 | 0 | 0 | 0 |
| 0 | 0 | 1 | * | * | — | — | — | — |
| 0 | 1 | * | * | * | — | — | — | — |
| 1 | 0 | 0 | 0 | 0 | HOLD | HOLD | HOLD | HOLD |
| 1 | 0 | 0 | 0 | 1 | HOLD | HOLD | HOLD | HOLD |
| 1 | 0 | 0 | 1 | 0 | HOLD | HOLD | HOLD | HOLD |
| 1 | 0 | 0 | 1 | 1 | HOLD | HOLD | HOLD | HOLD |
| 1 | 0 | 1 | 0 | 0 | HOLD | HOLD | — | — |
| 1 | 0 | 1 | 0 | 1 | HOLD | HOLD | 1 | 0 |
| 1 | 0 | 1 | 1 | 0 | HOLD | HOLD | 0 | 1 |
| 1 | 0 | 1 | 1 | 1 | HOLD | HOLD | — | — |
| 1 | 1 | 0 | 0 | 0 | — | — | HOLD | HOLD |
| 1 | 1 | 0 | 0 | 1 | 1 | 0 | HOLD | HOLD |
| 1 | 1 | 0 | 1 | 0 | 0 | 1 | HOLD | HOLD |
| 1 | 1 | 0 | 1 | 1 | — | — | HOLD | HOLD |
| 1 | 1 | 1 | * | * | — | — | — | — |

"*" = GIVEN VALUE

Fig. 31

SEMICONDUCTOR MEMORY DEVICE

INCORPORATION BY REFERENCE

This application is based upon and claims the benefit of priority from Japanese patent application Nos. 2009-174043 filed on Jul. 27, 2009, 2009-266234 filed on Nov. 24, 2009, and 2010-109018 filed on May 11, 2010, the disclosure of which is incorporated herein in its entirety by reference.

BACKGROUND

1. Field of the Invention

The present invention relates to a semiconductor memory device.

2. Description of Related Art

The scaling down of the semiconductor manufacturing process is an effective technique for an LSI to improve its performance. However, the scaling down of the manufacturing process has lead to an increase in variations among transistors, which makes it difficult to maintain the yield of LSI. Particularly, because SRAM (Static Random Access Memory), which is one of semiconductor memory devices, uses fine transistors, the effect of variations is significant. It is thus increasingly important to solve the issue of a decrease in yield in SRAM.

Memory cells (SRAM cells) and sense amplifiers are component elements of SRAM. If variation occurs in the SRAM cells, a read margin or a write margin of the SRAM cell is reduced. This causes read-data destruction or a write failure.

On the other hand, if variation occurs in the sense amplifier, an input offset voltage appears in the sense amplifier. The input offset voltage means an insensitive zone of an input voltage that occurs due to the left-to-right mismatch of the sense amplifier caused by variation. In order to make right determination about the data read from the SRAM cell, it is necessary that the bit line voltage difference exceeds the offset voltage in the sense amplifier at the time of activating the sense amplifier.

FIG. 38 shows a configuration of a typical SRAM 1. The SRAM 1 includes a memory cell array 10, a plurality of precharge circuits 20, a column selector 30, and a sense amplifier circuit 40.

In the memory cell array 10, a plurality of SRAM cells CELL are arranged in matrix. The SRAM cells are connected horizontally by word lines WL0 to WLm−1 and vertically by bit line pairs BL0 and BLB0 to BLn−1 and BLB1n−1. If one of the word lines is selected, cell currents flow from the SRAM cells connected to the selected word line. Consequently, each one of the bit line pairs connected to the SRAM cell is discharged. Then, the potentials of the relevant bit lines drop gradually from the precharge potential. The voltage difference thereby appears in the respective bit line pairs.

Next, one bit of n-bit column selection signal YS[n−1:0] is selected. Consequently, one pair of the bit line pairs BL0 and BLB0 to BLn−1 and BLB1n−1 is selected. The selected bit line pair and the sense amplifier circuit 40 are connected through the column selector 30. The bit-line voltage difference increases with time due to discharge by the cell current. After the bit-line voltage difference increases and exceeds the offset voltage of the sense amplifier circuit 40, the sense amplifier circuit 40 is activated. Consequently, read data OUT and OUTB appear in the sense amplifier outputs. Note that the time required from the word-line activation to the bit-line voltage difference exceeding the offset voltage of the sense amplifier circuit 40 is called bit line delay.

The longer bit line delay is required as the offset voltage of the sense amplifier circuit becomes larger due to an increase in variations caused by the scaling down of the manufacturing process. The bit line delay is dominant in operation delays of SRAM. Therefore, an increase in the bit line delay leads to degradation of the operating speed of SRAM. In order to avoid the degradation of the operating speed, it is needed to decrease the effect of the offset voltage in the sense amplifier circuit.

A sense amplifier circuit with circuit configuration including an offset voltage compensation mechanism that decreases an input offset voltage (which is referred to hereinafter as an offset voltage compensation sense amplifier) is disclosed in Japanese Unexamined Patent Application Publication No. 7-302497. The offset voltage compensation sense amplifier disclosed therein decreases the offset voltage by providing negative feedback to a fully differential amplifier and charging capacitors connected to input terminals.

Further, the similar offset voltage compensation sense amplifier is disclosed in Published Japanese Translation of PCT International Publication for Patent Application, No 11-509667. The offset voltage compensation sense amplifier disclosed therein decreases the offset voltage by providing negative feedback to a differential amplifier using a cascode connection and charging capacitors connected to output terminals.

SUMMARY

The offset voltage compensation sense amplifiers disclosed in Japanese Unexamined Patent Application Publications Nos. 7-302497 and Published Japanese Translation of PCT International Publication for Patent Application, No 11-509667 respectively use an analog amplifier with negative feedback in order to decrease the offset. If the transistor gate length is reduced by the scaling down of the semiconductor manufacturing process, it becomes difficult to obtain a high voltage gain in the analog amplifier. It is thus difficult to achieve the offset voltage compensation sense amplifiers disclosed in Japanese Unexamined Patent Application Publications Nos. 7-302497 and Published Japanese Translation of PCT International Publication for Patent Application, No 11-509667 in the scaled-down process.

An exemplary aspect of the present invention is a semiconductor memory device which includes a plurality of memory cells that are connected to a word line and read data, a plurality of bit line pairs that are connected respectively to the plurality of memory cells, a precharge circuit that pre-charges the plurality of bit line pairs according to a precharge signal, a column selector that selects one of the plurality of bit line pairs according to a column selection signal, a sense amplifier circuit that has an input terminal pair connected to the column selector and is activated according to a sense amplifier activation signal, a weight control circuit that is connected to an output terminal pair of the sense amplifier circuit and outputs a weight control signal with a value corresponding to an output of the activated sense amplifier circuit, and an offset voltage adjustment circuit that is connected to the sense amplifier circuit and adjusts an offset voltage of the sense amplifier circuit according to the weight control signal.

In the semiconductor memory device according to the exemplary aspect of the present invention, the weight control circuit outputs the weight control signal with a value corresponding to an output of the activated sense amplifier circuit, and the offset voltage adjustment circuit adjusts an offset voltage of the sense amplifier circuit according to the weight control signal. In this manner, the semiconductor memory device performs a determination operation with use of the sense amplifier circuit itself in order to reduce the offset voltage of the sense amplifier circuit, and thus an amplification operation is not necessary. This eliminates the need for an analog amplifier.

Because the sense amplifier circuit according to the exemplary aspect of the present invention does not require an analog amplifier, it is suitable for the scaling process.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 8 shows a truth table to describe the operation of the weight control circuit according to the first exemplary embodiment;

FIG. 17 shows a truth table to describe the operation of a weight control circuit according to the third exemplary embodiment;

FIG. 31 shows a truth table to describe the operation of the weight control circuit according to the fifth exemplary embodiment;

DETAILED DESCRIPTION OF THE EXEMPLARY EMBODIMENTS

[First Exemplary Embodiment]

Figure 1:
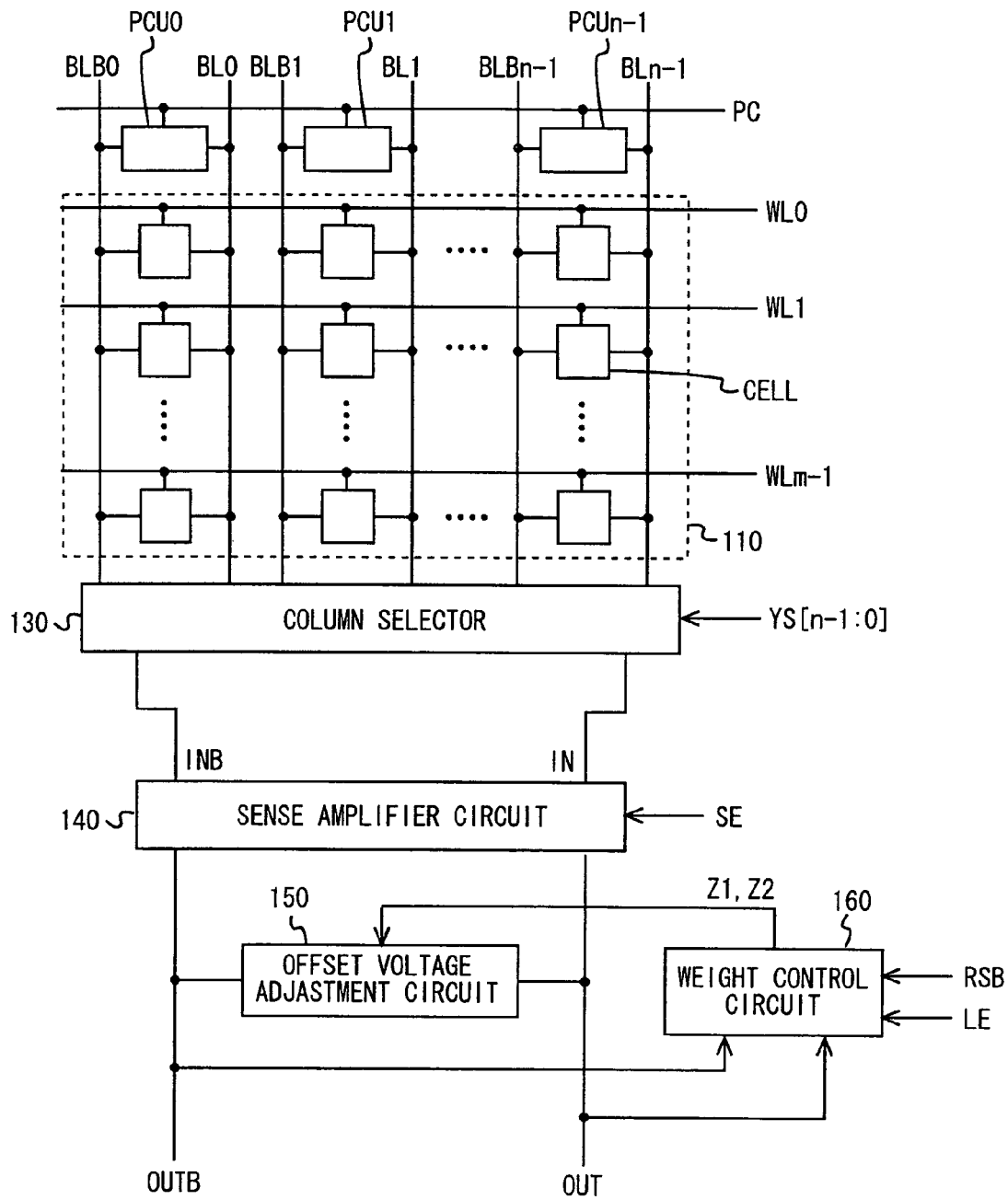
FIG. 1 shows a configuration of SRAM according to a first exemplary embodiment.

A first exemplary embodiment of the present invention is described hereinafter in detail with reference to the drawings. In the first exemplary embodiment, the present invention is applied to SRAM, which is an example of a semiconductor memory device. FIG. 1 shows a configuration of SRAM 100 according to the first exemplary embodiment. Referring to FIG. 1, the SRAM 100 includes a memory cell array 110, precharge circuits PCU0 to PCUn−1 (n is an integer of one or greater), a column selector 130, a sense amplifier circuit 140, an offset voltage adjustment circuit 150, and a weight control circuit 160.

In the memory cell array 110, a plurality of SRAM cells CELL are arranged in matrix. The SRAM cells are connected horizontally by word lines WL0 to WLm−1 (m is an integer of one or greater) and vertically by bit line pairs BL0 and BLB0 to BLn−1 and BLB1n−1.

The precharge circuits PCU0 to PCUn−1 are respectively connected to the corresponding bit line pairs BL0 and BLB0 to BLn−1 and BLB1n−1. The precharge circuits PCU0 to PCUn-1 pre-charge the bit line pairs BL0 and BLB0 to BLn-1 and BLB1n-1 to given potentials according to a precharge signal PC.

The column selector 130 is connected to the bit line pairs BL0 and BLB0 to BLn-1 and BLB1n-1. The column selector 130 selects one pair from the bit line pairs BL0 and BLB0 to BLn-1 and BLB1n-1 according to an input n-bit column selection signal YS[n-1:0]. The column selector 130 then establishes continuity between the selected bit line pair and the sense amplifier circuit 140, which is described later.

The sense amplifier circuit 140 is connected to the column selector 130 by sense amplifier input terminal pair IN and INB. The sense amplifier circuit 140 is activated according to a sense amplifier activation signal SE. Thus, the sense amplifier circuit 140 receives the potentials of the bit line pair selected by the column selector 130 at the sense amplifier input terminal pair IN and INB and outputs output data OUT and OUTB according to the potentials of the selected bit line pair.

The offset voltage adjustment circuit 150 is connected to the output of the sense amplifier circuit 140. The offset voltage adjustment circuit 150 performs a weight setting operation, which is described later, according to weight control signals Z1 and Z2 that are output from the weight control circuit 160. The offset voltage adjustment circuit 150 thereby sets the weights of drivabilities of the output terminals OUT and OUTB of the sense amplifier circuit 140.

The weight control circuit 160 is connected to the output of the sense amplifier circuit 140. The weight control circuit 160 is activated by a weight control activation signal LE. The weight control circuit 160 performs offset voltage determination of the sense amplifier circuit 140, which is described later, and outputs the weight control signals Z1 and Z2 based on its result. The offset voltage adjustment circuit 150 is controlled by the weight control signals Z1 and Z2 to thereby set the weights of drivabilities of the output terminals OUT and OUTB of the sense amplifier circuit 140.

The principle of the above-described offset voltage determination is described hereinafter. First, the input potentials of the sense amplifier input terminal pair IN and INB are respectively pre-charged to a power supply voltage VDD by the sense amplifier circuit 140. In this state, the sense amplifier activation signal SE rises, so that the sense amplifier circuit 140 is activated. At this time, "0" or "1" appears as the output data OUT and OUTB of the sense amplifier circuit 140 depending on the polarity of the offset voltage and which of the input terminal pair of the sense amplifier circuit 140 the offset voltage is inserted to. The weight control circuit 160 determines the offset voltage of the sense amplifier circuit 140 based on the value of the output data. This is referred to hereinafter as the offset voltage determination operation.

Based on the determination result of the offset voltage, the weight control circuit 160 controls the offset voltage adjustment circuit 150 and unbalances the drivabilities between the left and right of the sense amplifier circuit 140 so as to reduce the offset voltage. The offset voltage of the sense amplifier circuit 140 is thereby reduced. This is referred to hereinafter as the weight setting operation. A specific operation related to the weight setting according to the first exemplary embodiment is described later.

Figure 2:
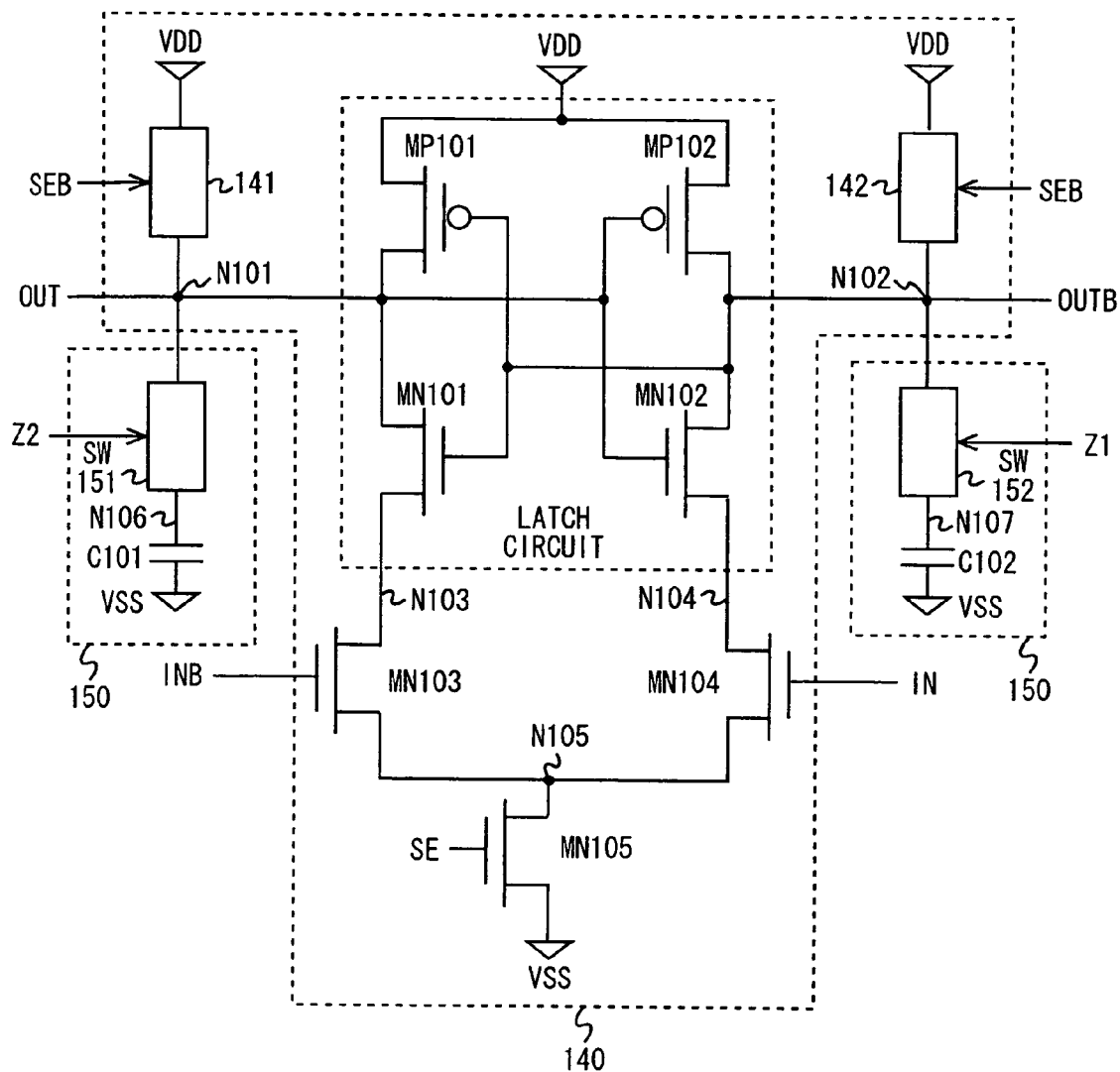
FIG. 2 shows a first configuration of a sense amplifier circuit and an offset voltage adjustment circuit according to the first exemplary embodiment.

FIG. 2 shows the connection and detailed configuration of the sense amplifier circuit 140 and the offset voltage adjustment circuit 150. Referring to FIG. 2, the sense amplifier circuit 140 includes NMOS transistors MN101 to MN105, PMOS transistors MP101 and MP102, and precharge switch circuits 141 and 142.

The PMOS transistor MP101 has a source connected to a power supply voltage terminal VDD, a drain connected to a node N101, and a gate connected to a node N102. The PMOS transistor MP102 has a source connected to the power supply voltage terminal VDD, a drain connected to the node N102, and a gate connected to the node N101.

The NMOS transistor MN101 has a drain connected to the node N101, a source connected to a node N103, and a gate connected to the node N102. The NMOS transistor MN102 has a drain connected to the node N102, a source connected to a node N104, and a gate connected to the node N101.

The PMOS transistors MP101 and MP102 and the NMOS transistors MN101 and MN102 constitute a latch circuit.

The NMOS transistor MN103 has a drain connected to the node N103, and a source connected to a node N105. A sense amplifier input signal INB is input to a gate of the NMOS transistor MN103. The NMOS transistor MN104 has a drain connected to the node N104, and a source connected to the node N105. A sense amplifier input signal IN is input to a gate of the NMOS transistor MN104. The NMOS transistors MN103 and MN104 constitute an input transistor of the sense amplifier circuit 140.

The NMOS transistor MN105 has a drain connected to the node N105, and a source connected to a ground voltage terminal VSS. A sense amplifier activation signal SE is input to a gate of the NMOS transistor MN105. When the NMOS transistor MN105 becomes on-state in response to the sense amplifier activation signal SE, the sense amplifier circuit 140 is activated.

The precharge switch circuit 141 has one end connected to the power supply voltage terminal VDD and the other end connected to the node N101. The precharge switch circuit 141 is driven by the inverted signal of the sense amplifier activation signal SE. The precharge switch circuit 142 has one end connected to the power supply voltage terminal VDD and the other end connected to the node N102. The precharge switch circuit 142 is driven by the inverted signal of the sense amplifier activation signal SE.

Note that the nodes N101 and N102 respectively serve as the output terminals OUT and OUTB of the sense amplifier circuit 140. For the sake of convenience, the symbols "OUT" and "OUTB" indicate terminal names and also indicate output data appearing at the output terminals OUT and OUTB or their potentials.

The offset voltage adjustment circuit 150 includes switch circuits SW151 and SW152 and load capacitors C101 and C102. The switch circuit SW151 has one end connected to the node N101 and the other end connected to a node N106. The switch circuit SW151 is driven by the weight control signal Z2. The load capacitor C101 has one end connected to the node N106 and the other end connected to the ground voltage terminal VSS. The switch circuit SW152 has one end connected to the node N102 and the other end connected to a node N107. The switch circuit SW152 is driven by the weight control signal Z1. The load capacitor C102 has one end connected to the node N107 and the other end connected to the ground voltage terminal VSS.

The capacitance values of the load capacitors C101 and C102 are designed such that, when the SRAM 100 incorporates a plurality of sense amplifier circuits, the maximum value of the offset voltage of the plurality of sense amplifier circuits is reduced to 50% by the weight setting operation, for example. Such a capacitance value is just an example, and it is not limited to 50%.

Figure 3:
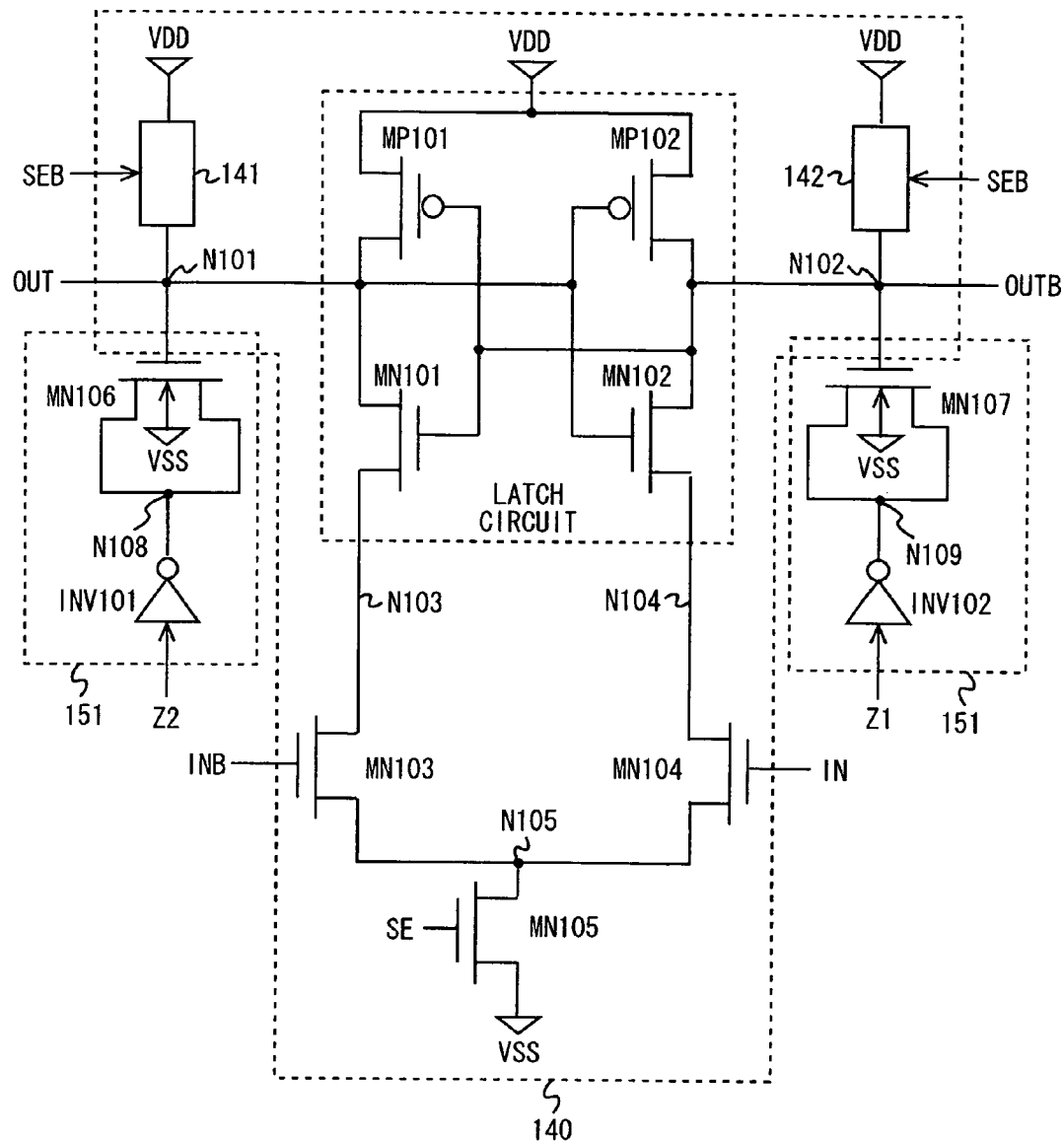
FIG. 3 shows a second configuration of the sense amplifier circuit and the offset voltage adjustment circuit according to the first exemplary embodiment.

FIG. 3 shows the sense amplifier circuit 140 shown in FIG. 2 and an offset voltage adjustment circuit 151, which is an alternative element of the offset voltage adjustment circuit 150. The sense amplifier circuit 140 has the same configuration as that of FIG. 2, and a detailed explanation thereof is omitted. The offset voltage adjustment circuit 151 includes NMOS transistors MN106 and MN107, and inverters INV101 and INV102.

The weight control signal Z2 is input to an input terminal of the inverter INV101. An output terminal of the inverter INV101 is connected to a node N108. The weight control signal Z1 is input to an input terminal of the inverter INV102. An output terminal of the inverter INV102 is connected to a node N109.

The NMOS transistor MN106 has a source and a drain connected to the node N108 and a gate connected to the node N101. As the substrate potential of the NMOS transistor MN106, the ground voltage VSS is applied from the ground voltage terminal VSS. The NMOS transistor MN107 has a source and a drain connected to the node N109 and a gate connected to the node N102. As the substrate potential of the NMOS transistor MN107, the ground voltage VSS is applied from the ground voltage terminal VSS.

The offset voltage adjustment circuit 151 uses the gate capacitors of the NMOS transistors MN106 and MN107 as alternatives of the load capacitors C101 and C102 of the offset voltage adjustment circuit 150 in FIG. 2.

The use of such a configuration eliminates the need for the switch circuits SW151 and SW152 compared to the configuration of the offset voltage adjustment circuit 150 shown in FIG. 2. Thus, the offset voltage adjustment circuit 151 has an advantage that it has a smaller circuit area than the offset voltage adjustment circuit 150.

Further, the gate areas of the NMOS transistors MN106 and MN107 are designed such that, when the SRAM 100 incorporates a plurality of sense amplifier circuits, for example, the maximum value of the offset voltage of the plurality of sense amplifier circuits is reduced to 50% by the weight setting operation. Such a size is just an example, and it is not limited to 50%.

Figure 4:
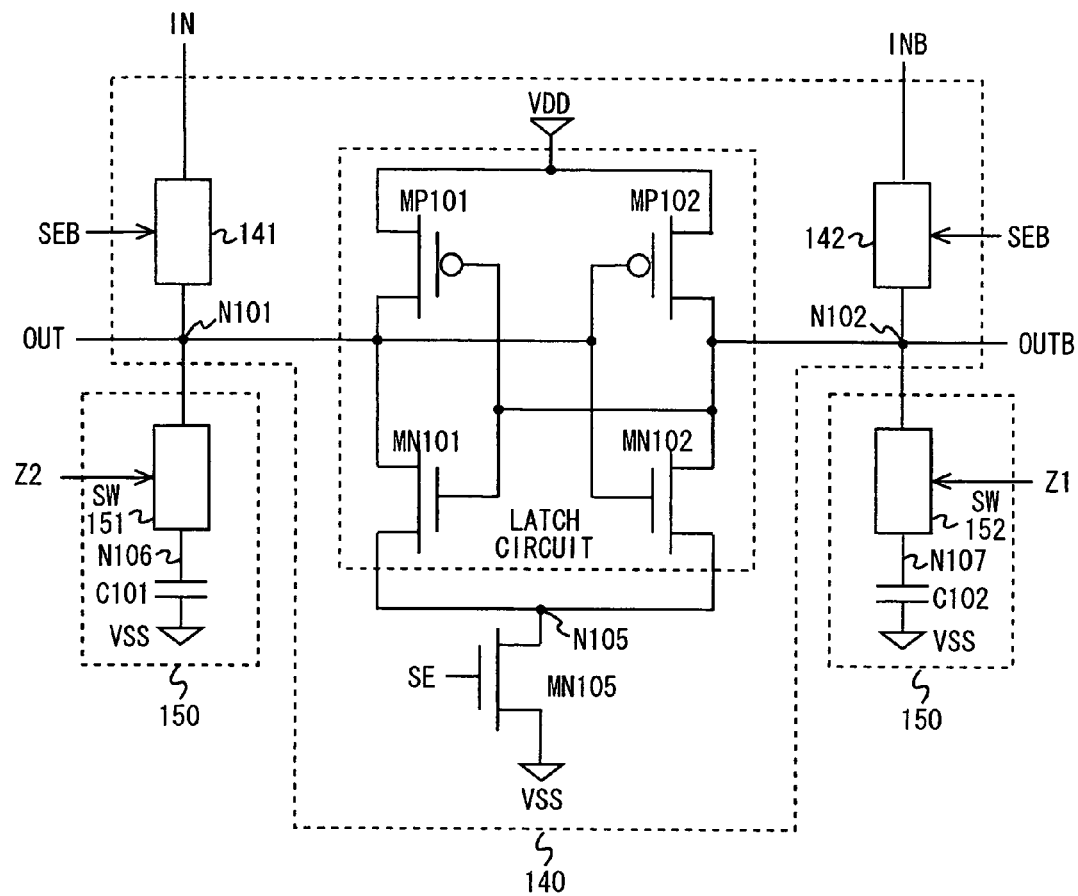
FIG. 4 shows a third configuration of the sense amplifier circuit and the offset voltage adjustment circuit according to the first exemplary embodiment.

FIG. 4 shows the connection and detailed configuration of the sense amplifier circuit 140 of a different variation from that of FIG. 2 and the offset voltage adjustment circuit 150. Referring to FIG. 4, the sense amplifier circuit 140 includes NMOS transistors MN101, MN102 and MN105, PMOS transistors MP101 and MP102, and precharge switch circuits 141 and 142. In FIG. 4, the elements denoted by the same reference symbols as in FIG. 2 are the same or similar elements as those in FIG. 2. FIG. 4 is different from FIG. 2 in that the NMOS transistors MN103 and MN104 are eliminated and the sense amplifier input signal IN is input to one end of the precharge switch circuit 141, and the sense amplifier input signal INB is input to one end of the precharge switch circuit 142. Note that the capacitance values of the load capacitors C101 and C102 are designed such that, when the SRAM 100 incorporates a plurality of sense amplifier circuits, the maximum value of the offset voltage of the plurality of sense amplifier circuits is reduced to 50% by the weight setting operation, for example, just like the circuit of FIG. 2. Such a capacitance value is also just an example, and it is not limited to 50%.

Figure 5:
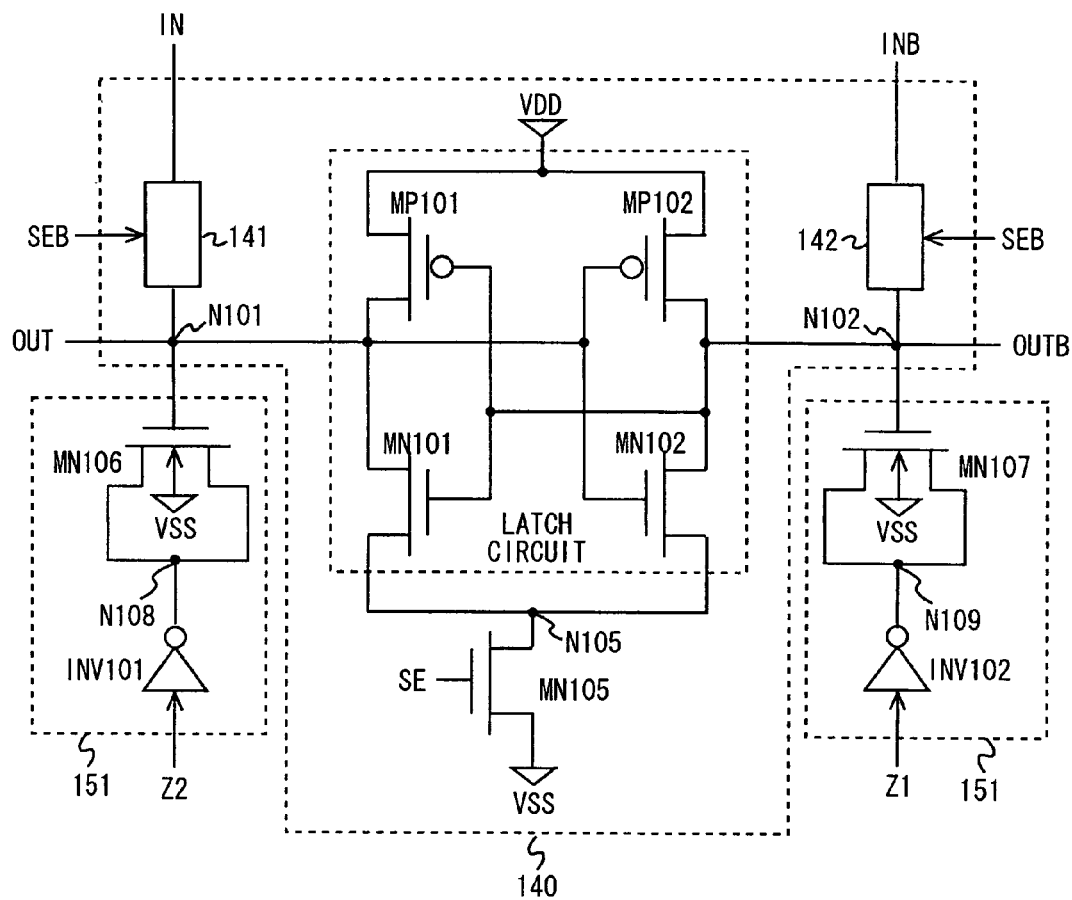
FIG. 5 shows a fourth configuration of the sense amplifier circuit and the offset voltage adjustment circuit according to the first exemplary embodiment.

FIG. 5 shows the sense amplifier circuit 140 shown in FIG. 4 and an offset voltage adjustment circuit 151, which is an alternative element of the offset voltage adjustment circuit 150. The sense amplifier circuit 140 has the same configuration as that of FIG. 4, and a detailed explanation thereof is omitted. The offset voltage adjustment circuit 151 includes NMOS transistors MN106 and MN107, and inverters INV101 and INV102.

The weight control signal Z2 is input to an input terminal of the inverter INV101. An output terminal of the inverter INV101 is connected to a node N108. The weight control signal Z1 is input to an input terminal of the inverter INV102. An output terminal of the inverter INV102 is connected to a node N109.

The NMOS transistor MN106 has a source and a drain connected to the node N108 and a gate connected to the node N101. As the substrate potential of the NMOS transistor MN106, the ground voltage VSS is applied from the ground voltage terminal VSS. The NMOS transistor MN107 has a source and a drain connected to the node N109 and a gate connected to the node N102. As the substrate potential of the NMOS transistor MN107, the ground voltage VSS is applied from the ground voltage terminal VSS.

The offset voltage adjustment circuit 151 uses the gate capacitors of the NMOS transistors MN106 and MN107 as alternatives of the load capacitors C101 and C102 of the offset voltage adjustment circuit 150 in FIG. 4.

The use of such a configuration eliminates the need for the switch circuits SW151 and SW152 compared to the configuration of the offset voltage adjustment circuit 150 shown in FIG. 4. Thus, the offset voltage adjustment circuit 151 has an advantage that it has a smaller circuit area than the offset voltage adjustment circuit 150.

Further, the gate areas of the NMOS transistors MN106 and MN107 are designed such that, when the SRAM 100 incorporates a plurality of sense amplifier circuits, the maximum value of the offset voltage of the plurality of sense amplifier circuits is reduced to 50% by the weight setting operation, for example. Such a size is just an example, and it is not limited to 50%.

Figure 6:
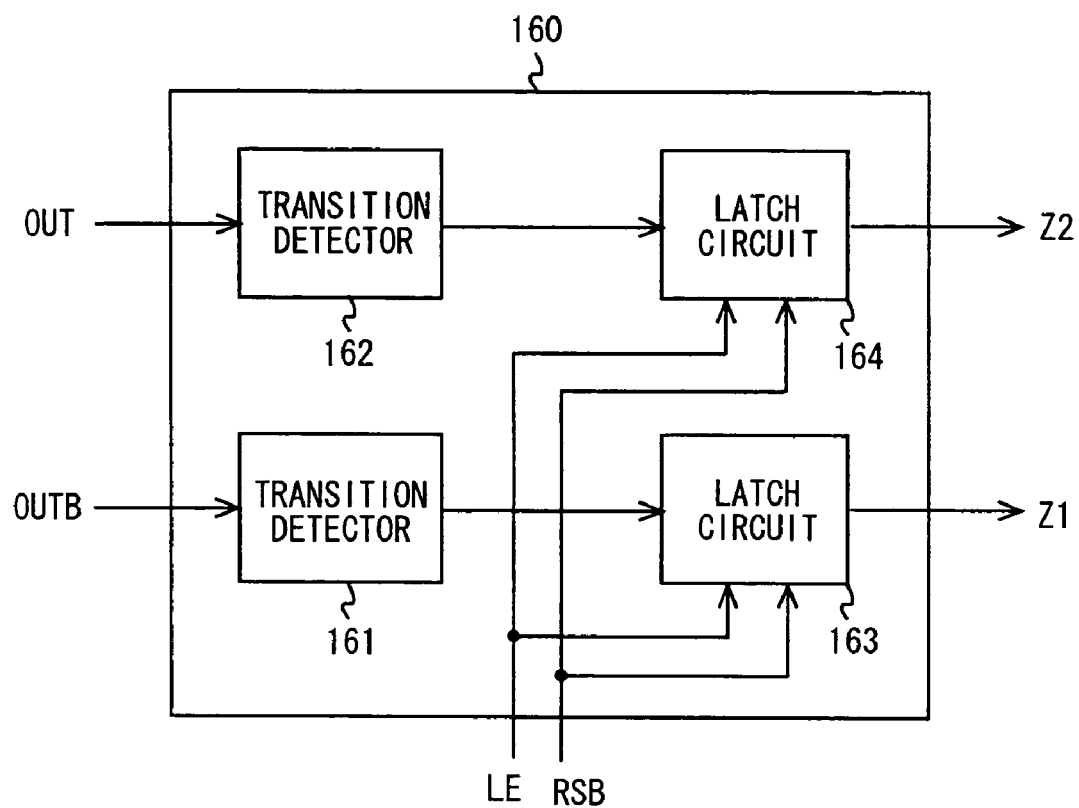
FIG. 6 shows a configuration of a weight control circuit according to the first exemplary embodiment.

FIG. 6 shows a configuration of the weight control circuit 160. Referring to FIG. 6, the weight control circuit 160 includes transition detectors 161 and 162 and latch circuits 163 and 164. The transition detectors 161 and 162 are connected to the output terminals OUT and OUTB, respectively. The latch circuits 163 and 164 are connected to the transition detectors 161 and 162, respectively. Further, the weight control activation signal LE and a reset signal RSB are input to the latch circuits 163 and 164. The latch circuits 163 and 164 respectively output the weight control signals Z1 and Z2.

Figure 7:
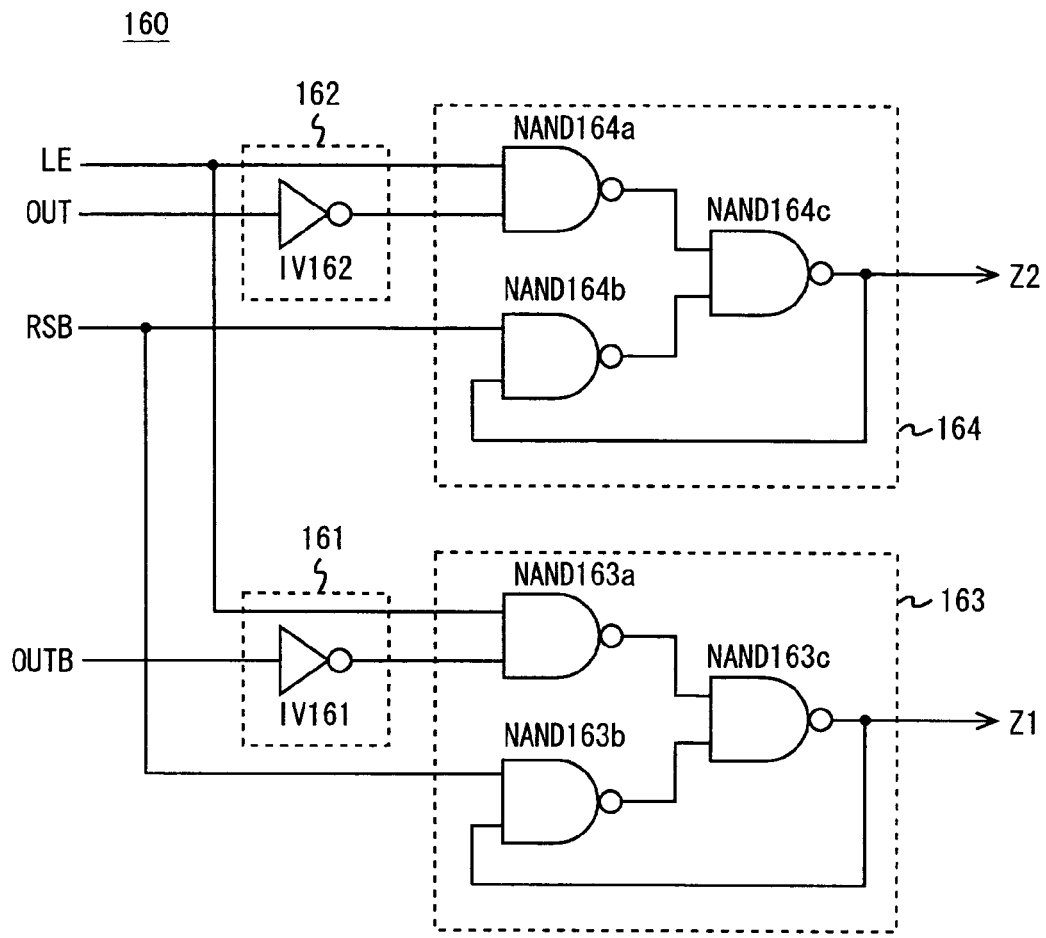
FIG. 7 shows a detailed configuration of the weight control circuit according to the first exemplary embodiment.

FIG. 7 shows a detailed configuration of the weight control circuit 160. Referring to FIG. 7, the transition detectors 161 and 162 include inverters IV161 and IV162, respectively. The logic threshold values of the inverters IV161 and IV162 are set lower than usual. The logic threshold values of the inverters IV161 and IV162 are set to about 40% of the power supply voltage VDD, for example.

The latch circuit 163 includes NAND circuits NAND163a, NAND163b and NAND163c.

The control activation signal LE is input to one input terminal of the NAND circuit NAND163a, and an output signal of the inverter IV161 is input to the other input terminal of the NAND circuit NAND163a. The NAND circuit NAND163a outputs an output signal to one input terminal of the NAND circuit NAND 163c.

The reset signal RSB is input to one input terminal of the NAND circuit NAND163b, and an output signal of the NAND circuit NAND163c is input to the other input terminal of the NAND circuit NAND163b. The NAND circuit NAND163b outputs an output signal to the other input terminal of the NAND circuit NAND163c.

The output signal of the NAND circuit NAND163a is input to one input terminal of the NAND circuit NAND163c, and the output signal of the NAND circuit NAND163b is input to the other input terminal of the NAND circuit NAND163c. The NAND circuit NAND163b outputs the weight control signal Z1 as an output signal.

The latch circuit 164 includes NAND circuits NAND164a, NAND 164b and NAND164c.

The control activation signal LE is input to one input terminal of the NAND circuit NAND164a, and an output signal of the inverter IV162 is input to the other input terminal of the NAND circuit NAND164a. The NAND circuit NAND164a outputs an output signal to one input terminal of the NAND circuit NAND164c.

The reset signal RSB is input to one input terminal of the NAND circuit NAND164b, and an output signal of the NAND circuit NAND164c is input to the other input terminal of the NAND circuit NAND 164b. The NAND circuit NAND 164b outputs an output signal to the other input terminal of the NAND circuit NAND 164c.

The output signal of the NAND circuit NAND164a is input to one input terminal of the NAND circuit NAND 164c, and the output signal of the NAND circuit NAND 164b is input to the other input terminal of the NAND circuit NAND164c. The NAND circuit NAND164b outputs the weight control signal Z2 as an output signal.

The weight control circuit 160 having such a configuration performs a logical operation according to the truth table shown in FIG. 8. First, when the value of the reset signal RSB is "0" (Low level), the weight control activation signal LE is "0", and the values of the output data OUT and OUTB are both "1", the values of the weight control signals Z1 and Z2 are both "0". This is referred to hereinafter as the reset operation of the latch circuit. Further, when the value of the reset signal RSB is "0", combinations of the other values of the weight control activation signal LE and the output data OUT and OUTB are all inhibit input.

When the value of the reset signal RSB is "1" (High level) and the value of the weight control activation signal LE is "1", the weight control signals Z1 and Z2 shown in FIG. 8 are output according to the values of the output data OUT and OUTB. For example, when the values of the output data OUT and OUTB are "0" and "1", respectively, the values of the weight control signals Z1 and Z2 are "1" and "0", respectively. Further, when the values of the output data OUT and OUTB are "1" and "0", respectively, the values of the weight control signals Z1 and Z2 are "0" and "1", respectively. At the same time, the values of the weight control signals Z1 and Z2 are stored in the latch circuits 163 and 164, respectively. This is referred to hereinafter as the latch operation of the latch circuits. Note that the case where the values of the output data OUT and OUTB are "0" and "0", and "1" and "1", respectively, is inhibit input for the reason described later.

When the value of the reset signal RSB is "1" and the value of the weight control activation signal LE is "0", the latch circuits 163 and 164 hold the current values of the weight control signals Z1 and Z2 regardless of the values of the output data OUT and OUTB.

Figure 9:
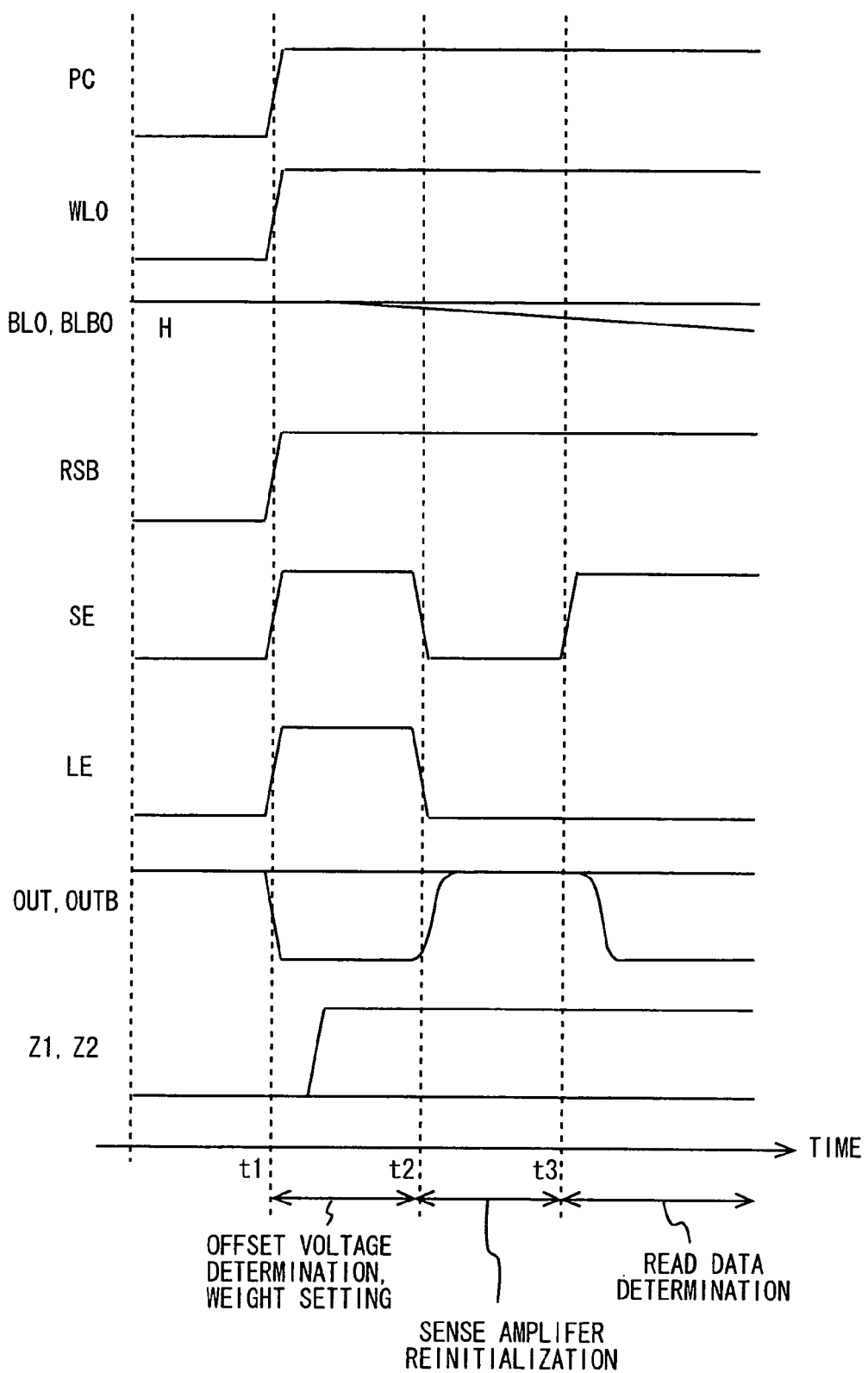
FIG. 9 shows a timing chart to describe the operation of SRAM according to the first exemplary embodiment.

FIG. 9 shows an operational timing chart of the SRAM 100 described above. The operation of the SRAM 100 is described hereinafter with reference to the operational timing chart shown in FIG. 9. Note that data of the SRAM cell CELL that is connected to the word line WL0 and the bit line pair BL0 and BLB0 is read in this example. Specifically, the word line WL0 is selected out of the word lines WL0 to WLm-1, and the column selector 130 selects the bit line pair BL0 and BLB0 according to the column selection signal YS[n-1:0]. Further, in the period when the precharge signal PC is Low level, the sense amplifier input terminal pair IN and INB conducted and selected by the column selector 130 is pre-charged to the power supply voltage VDD together with the bit lines.

Referring to FIG. 9, before time t1, the bit line pair BL0 and BLB0 is pre-charged to the power supply voltage VDD by the precharge circuit PCU0. At this time, the values of the weight control activation signal LE and the reset signal RSB are "0". The reset operation of the latch circuits 163 and 164 constituting the weight control circuit 160 is thereby performed, and the values of the weight control signals Z1 and Z2 are both reset to "0".

Next, at time t1, the word-line signal WL0 is activated. According to the data stored in the selected SRAM cell CELL, one potential of the bit line pair BL0 and BLB0 starts dropping gradually. Further, in response to the column selection signal YS[n-1:0], the column selector 130 selects the bit line pair BL0 and BLB0. Therefore, the input terminal pair of the sense amplifier circuit 140 and the bit line pair BL0 and BLB0 are connected.

Further, at the same time as when the word-line signal is activated at time t1, the reset signal RSB and the sense amplifier activation signal SE rise. The sense amplifier activation signal SE thereby becomes High level, and the sense amplifier circuit 140 is activated. At this time, because one potential of the bit line pair BL0 and BLB0 does not drop to the logic threshold value for starting the sense operation of the sense amplifier circuit 140, High level is input as a logic signal to both of the sense amplifier input terminal pair IN and INB. Thus, "0" or "1" is output as the output data OUT according to the polarity of the offset voltage of the sense amplifier circuit 140. The operation is the offset voltage determination operation. Note that the inverted signal of the output data OUT is output as the output data OUTB.

Further, at the same time as when the sense amplifier circuit 140 is activated, the weight control activation signal LE rises. The latch operation is thereby performed in the latch circuits 163 and 164 constituting the weight control circuit 160. Thus, the output data OUT and OUTB are stored in the latch circuits 163 and 164, and the weight control signals Z1 and Z2 are output. The logical operation is performed according to the truth table shown in FIG. 8 described above. For example, when the values of the output data OUT and OUTB are "1" and "0", respectively, the weight control signals Z1 and Z2 are (Z1, Z2)=(0, 1). Thus, the switch circuit SW151 driven by the weight control signal Z2 becomes continuous, and the node N101 and the load capacitor C101 are thereby electrically connected. Consequently, the drive capability on the output terminal OUT side (the node N101 side) of the sense amplifier circuit 140 decreases. Hereinafter, the decrease in the drive capability on the output terminal OUT side (the node N101 side) is referred to as "weight setting×(-1)" where necessary. The effective offset voltage of the sense amplifier circuit 140 is thereby reduced compared to the original offset voltage.

On the other hand, when the values of the output data OUT and OUTB are "0" and "1", respectively, the weight control signals Z1 and Z2 are (Z1, Z2)=(1, 0). Thus, the switch circuit SW152 driven by the weight control signal Z1 becomes continuous, and the node N102 and the load capacitor C102 are thereby electrically connected. Consequently, the drive capability on the output terminal OUTB side (the node N102 side) of the sense amplifier circuit 140 decreases. Hereinafter, the decrease in the drive capability on the output terminal OUTB side (the node N102 side) is referred to as "weight setting×1" where necessary. The effective offset voltage of the sense amplifier circuit 140 is thereby reduced compared to the original offset voltage.

Then, at time t2, the weight control activation signal LE and the sense amplifier activation signal SE fall. The latch operation thereby ends in the latch circuits 163 and 164 constituting the weight control circuit 160, and the sense amplifier circuit 140 is re-initialized. After that, the latch circuits 163 and 164 hold the values of the weight control signals Z1 and Z2 regardless of the values of the output data OUT and OUTB as shown in the truth table of FIG. 8.

The operation when using the offset voltage adjustment circuit 151 in place of the offset voltage adjustment circuit 150 is the same. The operation after the time t1 in the case of using the offset voltage adjustment circuit 151 is described hereinbelow.

At the same time as when the sense amplifier circuit 140 is activated, the weight control activation signal LE rises. The latch circuits 163 and 164 constituting the weight control circuit 160 thereby perform the latch operation according to the above-described truth table shown in FIG. 8. For example, when the values of the output data OUT and OUTB are "1" and "0", respectively, the weight control signals Z1 and Z2 are (Z1, Z2)=(0, 1). Thus, the inverter INV101 to which the weight control signal Z2 is input outputs the inverted signal "0". By the output signal of the inverter INV101, the drain and source potentials of the NMOS transistor MN106 are controlled. When the inverter INV101 outputs "0", the NMOS transistor MN106 turns on. This is equivalent to the state where the gate capacitor of the NMOS transistor MN106 is connected to the output terminal of the sense amplifier circuit 140. Consequently, the drive capability on the output terminal OUT side (the node N101 side) of the sense amplifier circuit 140 decreases. Hereinafter, the decrease in the drive capability on the output terminal OUT side (the node N101 side) is referred to as "weight setting×(−1)" where necessary. The effective offset voltage of the sense amplifier circuit 140 is thereby reduced compared to the original offset voltage.

On the other hand, when the values of the output data OUT and OUTB are "0" and "1", respectively, the weight control signals Z1 and Z2 are (Z1, Z2)=(1, 0). Thus, the inverter INV102 to which the weight control signal Z1 is input outputs the inverted signal "0". By the output signal of the inverter INV102, the drain and source potentials of the NMOS transistor MN107 are controlled. When the inverter INV102 outputs "0", the NMOS transistor MN107 turns on. This is equivalent to the state where the gate capacitor of the NMOS transistor MN107 is connected to the output terminal of the sense amplifier circuit 140. Consequently, the drive capability on the output terminal OUTB side (the node N102 side) of the sense amplifier circuit 140 decreases. Hereinafter, the decrease in the drive capability on the output terminal OUTB side (the node N102 side) is referred to as "weight setting×1" where necessary. The effective offset voltage of the sense amplifier circuit 140 is thereby reduced compared to the original offset voltage.

In this manner, the connection between the load capacitors C101 and C102 or the NMOS transistors MN106 and MN107 and the nodes N101 and N102 is switched so as to reduce the offset voltage of the sense amplifier circuit 140 by the weight control signals Z1 and Z2 of the weight control circuit 160. This operation is the weight setting operation in the first exemplary embodiment.

After the lapse of a sufficient length of time from the activation of the sense amplifier circuit 140, when the sense amplifier circuit 140 operates normally, the output data OUT and OUTB are defined as the signals inverted from each other. Thus, a combination in which the values of the output data OUT and OUTB are "0" and "0" or "1" and "1" does not occur.

After completion of the offset voltage determination and weight setting operation described above, the process proceeds to the determination operation of actual read data from the selected SRAM cell CELL. Specifically, when the sense amplifier activation signal SE rises at time t3, the read data corresponding to the data stored in the selected SRAM cell CELL appears at the output of the sense amplifier circuit 140.

Figure 10:
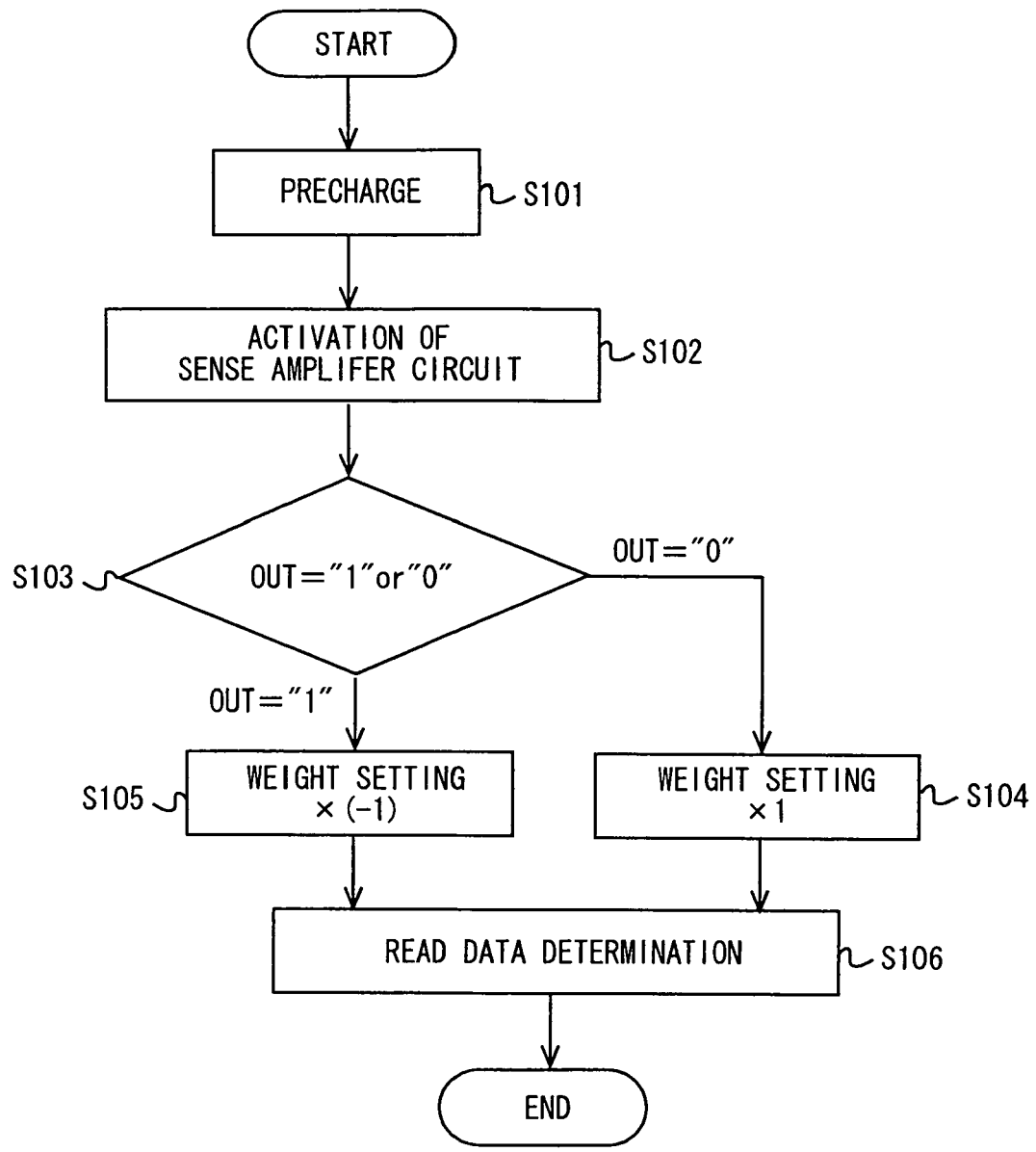
FIG. 10 is a flowchart to describe the operation of SRAM according to the first exemplary embodiment.

FIG. 10 is a flowchart showing the offset voltage determination operation and the weight setting operation according to the first exemplary embodiment described above. Referring to FIG. 10, the bit line pairs BL0 and BLB0 to BLn−1 and BLBn−1 are pre-charged to the power supply voltage VDD by the precharge circuits PCU0 to PCUn−1 (S101). Then, the sense amplifier circuit 140 is activated to make the offset voltage determination (S102).

At this time, the weight control circuit 160 determines whether the value of the output data OUT is "1" or "0" as the offset voltage determination (S103). When the value of the output data OUT is "1", the weight control signals Z1 and Z2 are (Z1, Z2)=(0, 1), and the weight setting×(−1) is made in the offset voltage adjustment circuit 150 (S104). When the value of the output data OUT is "0", the weight control signals Z1 and Z2 are (Z1, Z2)=(1, 0), and the weight setting×1 is made in the offset voltage adjustment circuit 150 (S105).

After that, the determination about read data from the selected SRAM cell CELL is performed (S106).

Figure 11:
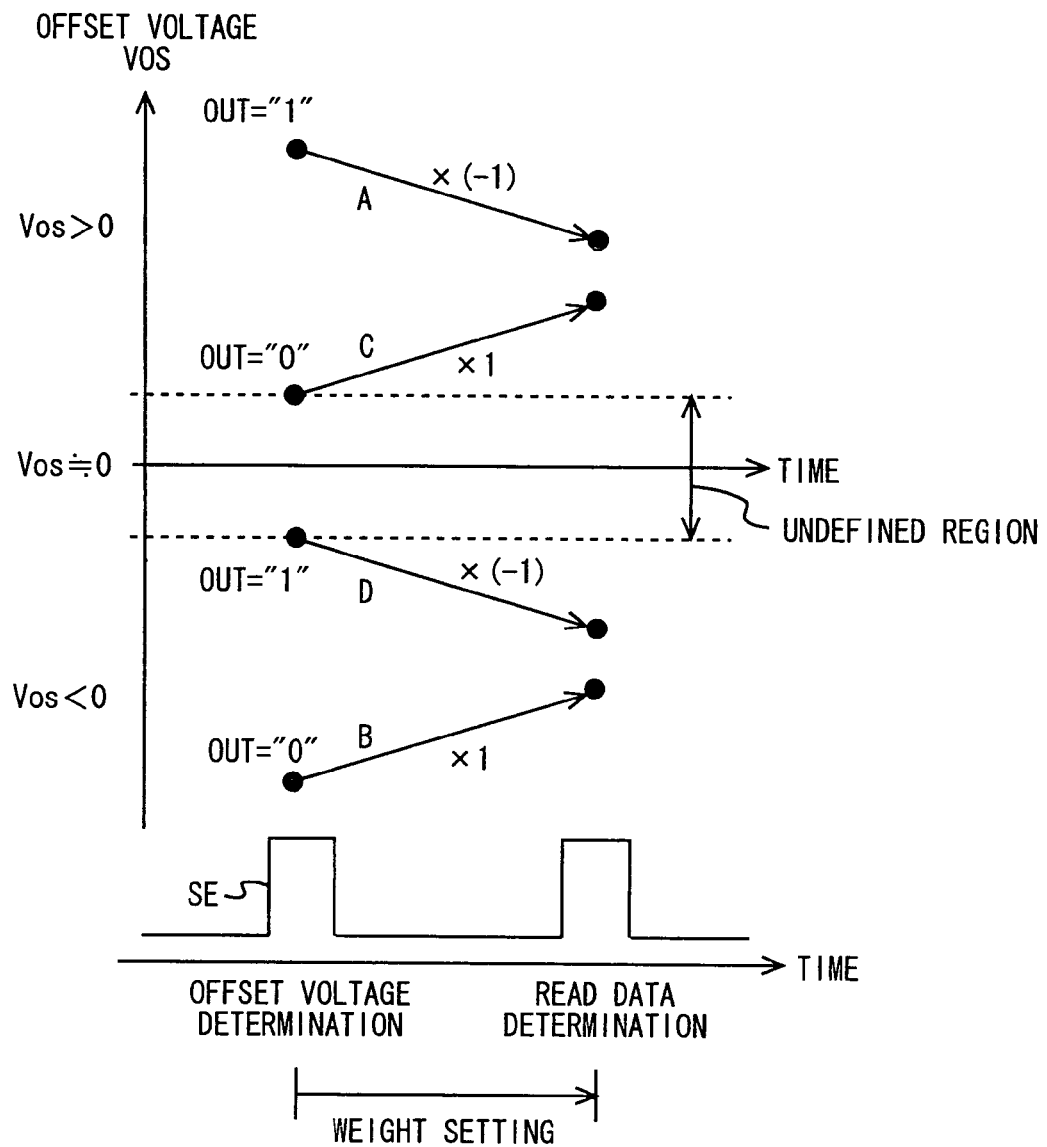
FIG. 11 is a schematic view to describe the effect of SRAM according to the first exemplary embodiment.

FIG. 11 is a schematic view to describe the offset voltage reduction effect according to the first exemplary embodiment described above. In FIG. 11, "Vos" indicates the offset voltage of the sense amplifier circuit 140, and when Vos>0, the output terminal OUT has a higher offset voltage than the output terminal OUTB. On the contrary, when Vos<0, the output terminal OUT has a smaller offset voltage than the output terminal OUTB.

Consider first the case where Vos>0 (the output terminal OUT has a larger offset voltage than the output terminal OUTB) and the output data OUT is "1" at the time of the offset voltage determination, which is the pattern A in FIG. 11. In this case, the weight setting×(−1) is made, so that the effective offset voltage of the sense amplifier circuit 140 is reduced. Then, at the time of the read data determination, the sense amplifier circuit 140 operates with the effectively reduced offset voltage.

Consider next the case where Vos<0 (the output terminal OUT has a smaller offset voltage than the output terminal OUTB) and the output data OUT is "0" at the time of the offset voltage determination, which is the pattern B in FIG. 11. In this case, the weight setting×1 is made, so that the effective offset voltage of the sense amplifier circuit 140 is reduced. Then, at the time of the read data determination, the sense amplifier circuit 140 operates with the effectively reduced offset voltage.

As described above, in the SRAM 100 according to the first exemplary embodiment, the above-described offset voltage determination and weight setting operation are performed before the read determination operation of the stored data in the SRAM cell CELL. The effective offset voltage of the sense amplifier circuit 140 is thereby lowered at the time of the read determination operation of the stored data in the SRAM cell CELL. It is thereby possible to reduce the bit line delay and avoid the reduction of the operating speed of the SRAM 100.

The techniques disclosed in Japanese Unexamined Patent Application Publications Nos. 07-302497 and Published Japanese Translation of PCT International Publication for Patent Application, No 11-509667 mentioned above use an analog amplifier, and if the transistor gate length is reduced by the scaling down of the semiconductor manufacturing process, it becomes difficult to obtain a high voltage gain in the analog amplifier. Further, with the lower voltage operation of LSI, the dynamic range of the analog amplifier decreases. In addition, a bias current is consumed in the analog amplifier. It is thus difficult to implement the techniques in the scaled-down process and realize lower voltage and lower power consumption.

On the other hand, the SRAM 100 according to the first exemplary embodiment performs the offset voltage determination operation by using the sense amplifier itself in order to reduce the offset voltage. Therefore, the amplification operation is not necessary, thus eliminating the need for the analog amplifier. It is thus suitable for the scaling process and the low voltage and low power consumption operation, thereby overcoming the above problem in the related art.

Note that, in the first exemplary embodiment, by performing the offset voltage determination and weight setting operation, the effect of reducing the offset voltage of the sense amplifier with a large offset voltage is obtained.

In the case where Vos>0 and the output data OUT is "0" at the time of the offset voltage determination as shown in the pattern C of FIG. 11, the output data OUT is "0" at the time of the offset voltage determination in spite of Vos>0. In this case, it is assumed that the offset voltage of the sense amplifier circuit 140 is very low. However, because the output data OUT is "0", the weight setting×1 is made. Consequently, the offset voltage of the sense amplifier circuit 140 increases adversely.

Likewise, in the pattern D of FIG. 11, the output data OUT is "1" at the time of the offset voltage determination in spite of Vos<0. It is thus assumed that the offset voltage of the sense amplifier circuit 140 is very low. However, in this case also, the weight setting×(−1) is made because the output data OUT is "1". Consequently, the offset voltage of the sense amplifier circuit 140 increases adversely.

In this manner, in the first exemplary embodiment, there is a possibility that a large offset voltage is applied to the sense amplifier circuit with a small offset voltage. However, the operating speed of the SRAM 100 as a whole is determined by the sense amplifier with the highest offset voltage. Thus, the SRAM 100 according to the first exemplary embodiment reduces the offset voltage of the sense amplifier with a large offset voltage and thereby improves the operating speed of the SRAM 100 as a whole, and therefore the above issue raises no substantial problem.

[Second Exemplary Embodiment]

Figure 12:
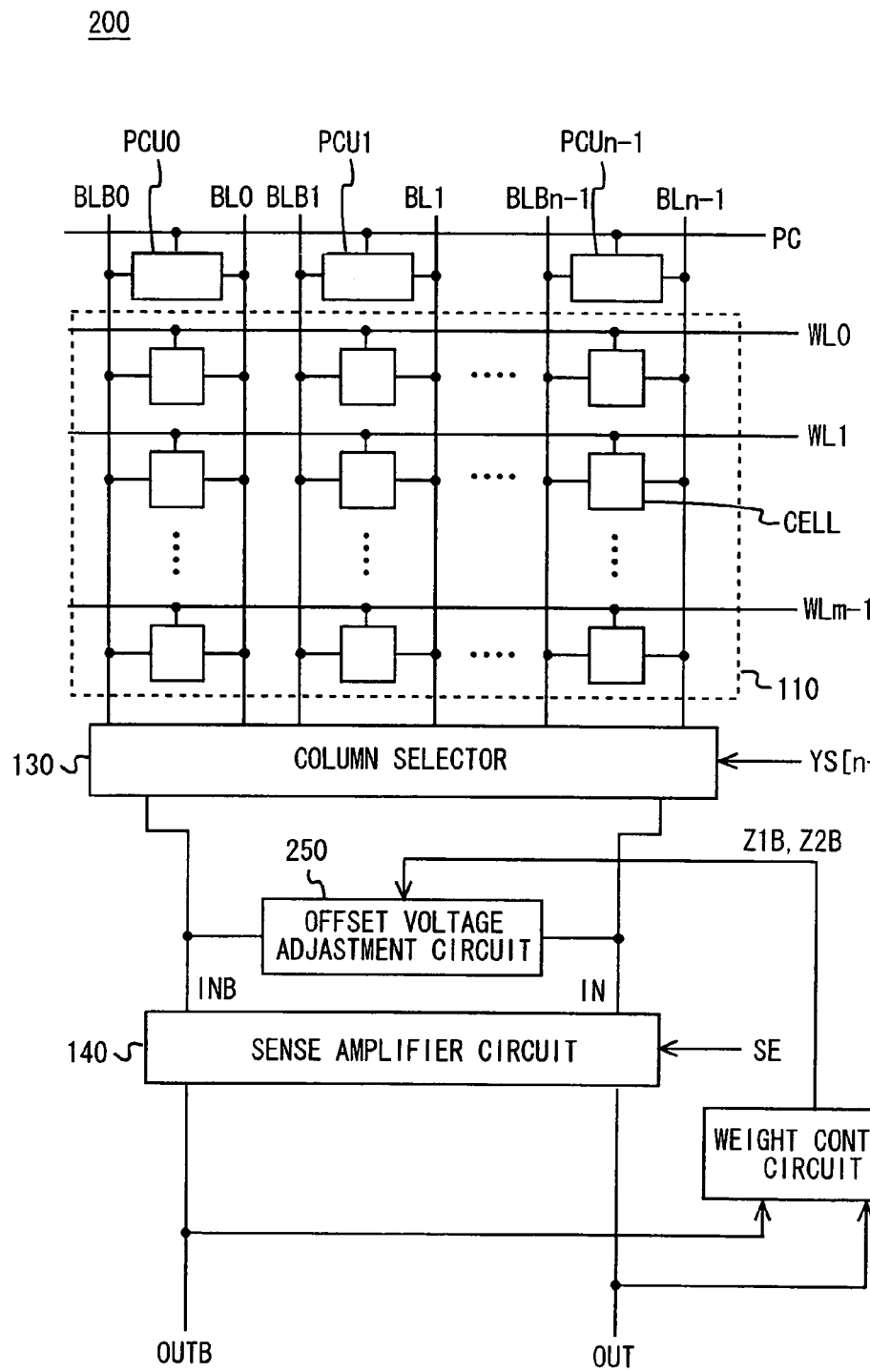
FIG. 12 shows a configuration of SRAM according to a second exemplary embodiment.

A second exemplary embodiment of the present invention is described hereinafter in detail with reference to the drawings. In the second exemplary embodiment, like the first exemplary embodiment, the present invention is applied to SRAM. FIG. 12 shows a configuration of SRAM 200 according to the second exemplary embodiment. Referring to FIG. 12, the SRAM 200 includes a memory cell array 110, precharge circuits PCU0 to PCUn−1, a column selector 130, a sense amplifier circuit 140, an offset voltage adjustment circuit 250, and a weight control circuit 160. Note that, in FIG. 12, the elements denoted by the same reference symbols as in FIG. 1 are the same or similar elements as those in FIG. 1. The second exemplary embodiment is different from the first exemplary embodiment in the configuration and the connected position of the offset voltage adjustment circuit 250. Thus, in the second exemplary embodiment, the different point is mainly described, and the same configuration as that of the first exemplary embodiment is not redundantly described.

Referring to FIG. 12, the offset voltage adjustment circuit 250 is connected to the sense amplifier input terminal pair IN and INB of the sense amplifier circuit 140. Further, the offset voltage adjustment circuit 250 performs a weight setting operation, which is described later, according to signals Z1B and Z2B (referred to hereinafter as the weight control signals Z1B and Z2B), which are the inverted signals of the weight control signals Z1 and Z2 that are output from the weight control circuit 160. The offset voltage adjustment circuit 250 thereby sets the weights of drivabilities of the output terminals OUT and OUTB of the sense amplifier circuit 140.

The weight control circuit 160 is connected to the output of the sense amplifier circuit 140, just like in the first exemplary embodiment. The weight control circuit 160 is activated by the weight control activation signal LE. The weight control circuit 160 according to the second exemplary embodiment performs the offset voltage determination of the sense amplifier circuit 140 and outputs the weight control signals Z1B and Z2B to the offset voltage adjustment circuit 250 based on its result. The offset voltage adjustment circuit 250 is controlled by the weight control signals Z1B and Z2B to thereby set the weights of drivabilities of the output terminals OUT and OUTB of the sense amplifier circuit 140.

Figure 13:
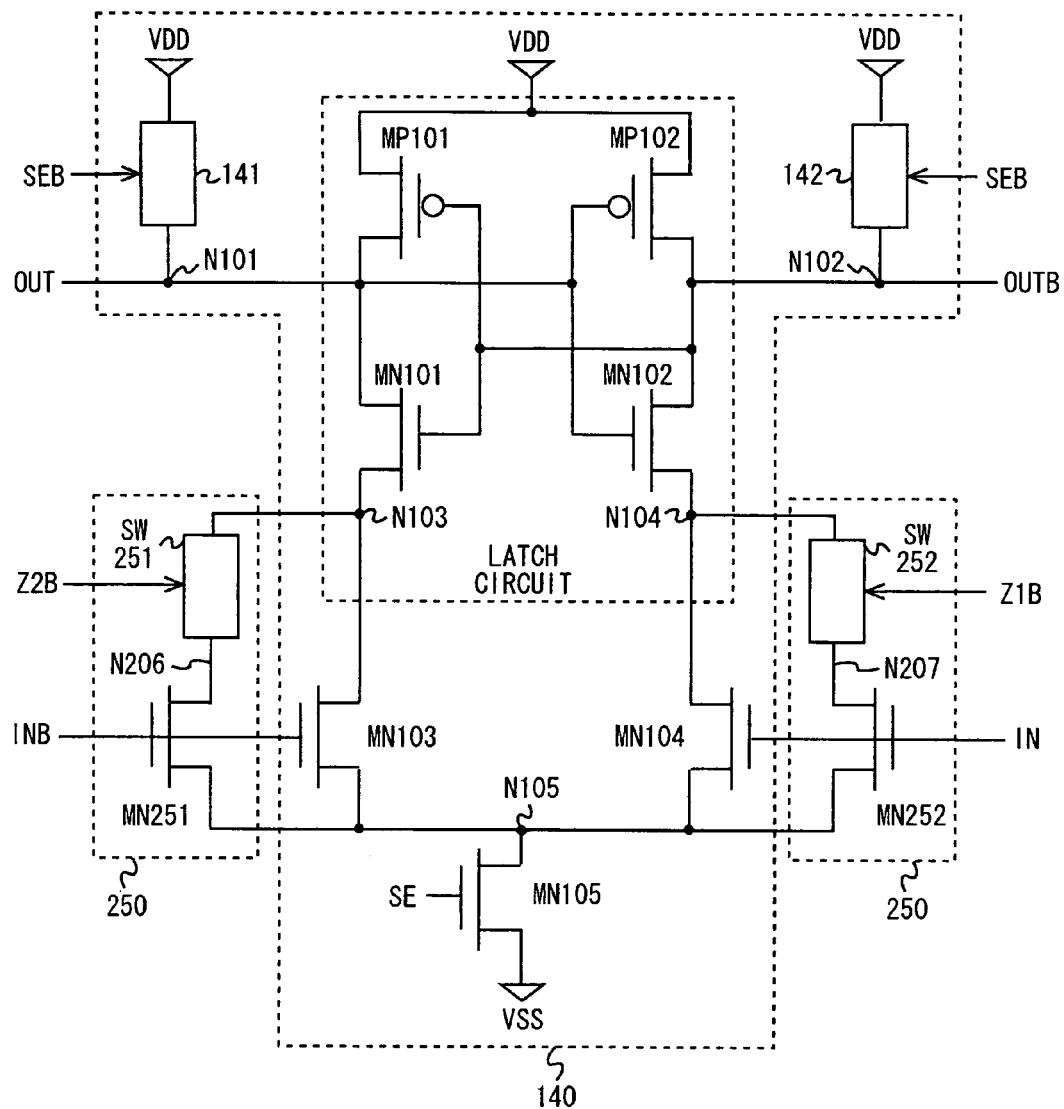
FIG. 13 shows a first configuration of a sense amplifier circuit and an offset voltage adjustment circuit according to the second exemplary embodiment.

FIG. 13 shows the connection and detailed configuration of the sense amplifier circuit 140 and the offset voltage adjustment circuit 250. The configuration of the sense amplifier circuit 140 is the same as that of FIG. 2, and a detailed explanation thereof is omitted. Referring to FIG. 13, the offset voltage adjustment circuit 250 includes switch circuits SW251 and SW252, and NMOS transistors MN251 and MN252. The switch circuit SW251 has one end connected to a node N103 and the other end connected to a node N206. The switch circuit SW251 is driven by the weight control signal Z2B. The NMOS transistor MN251 has a drain connected to the node N206, a source connected to a node N105, and a gate connected to the sense amplifier input terminal INB. Further, the gate width of the NMOS transistor MN251 is set to the same value as the gate width of the NMOS transistor MN103 of the sense amplifier circuit 140, for example. However, the value of the gate width is just an example, and it is not particularly limited thereto.

The switch circuit SW252 has one end connected to a node N104 and the other end connected to a node N207. The switch circuit SW252 is driven by the weight control signal Z1B. The NMOS transistor MN252 has a drain connected to the node N207, a source connected to the node N105, and a gate connected to the sense amplifier input terminal IN. Further, the gate width of the NMOS transistor MN252 is set to the same value as the gate width of the NMOS transistor MN104 of the sense amplifier circuit 140, for example. However, the value of the gate width is just an example, and it is not particularly limited thereto.

Figure 14:
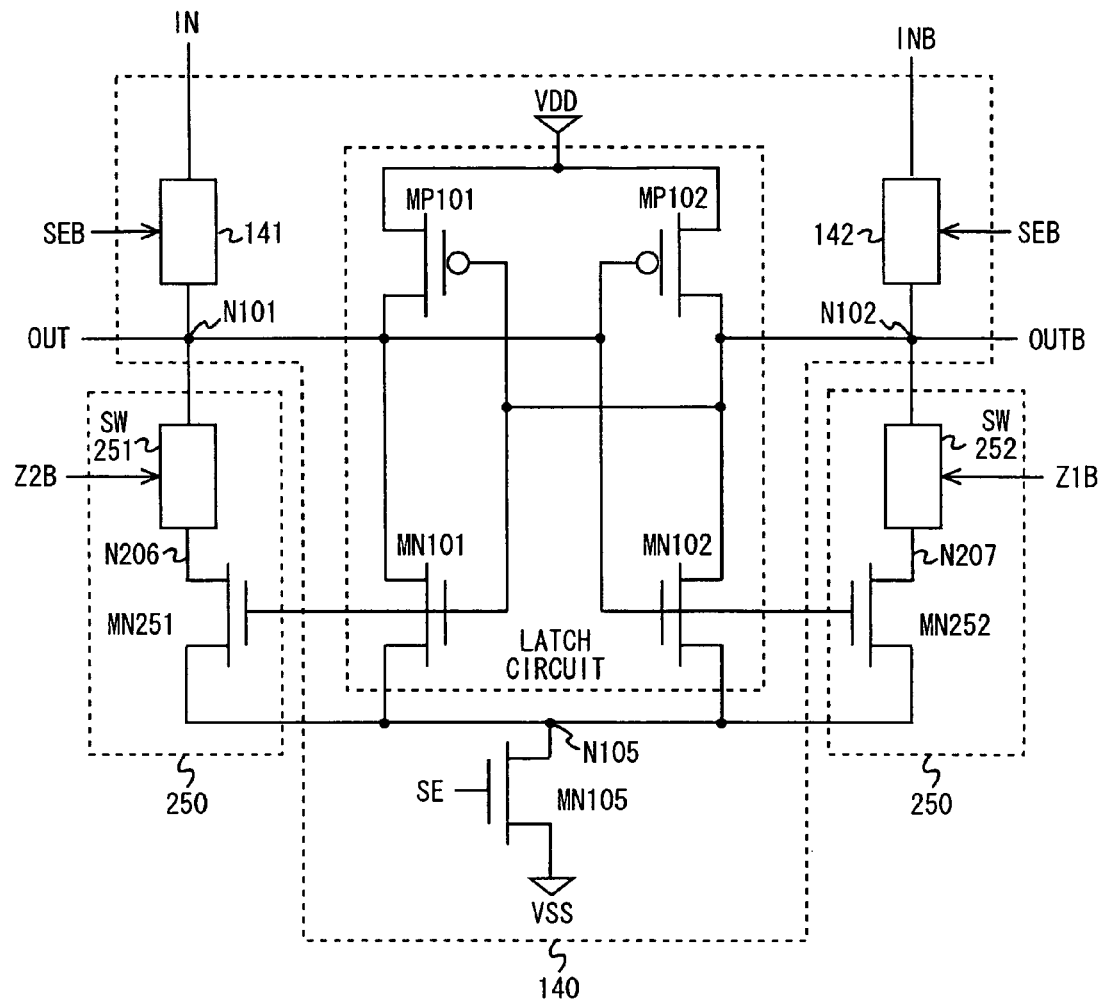
FIG. 14 shows a second configuration of the sense amplifier circuit and the offset voltage adjustment circuit according to the second exemplary embodiment.

FIG. 14 shows a configuration where the offset voltage adjustment circuit 250 having the same configuration as that of FIG. 13 is connected to the sense amplifier circuit 140 of a different variation from that of FIG. 13. The configuration of the sense amplifier circuit 140 is the same as that of FIG. 4, and a detailed explanation thereof is omitted. Referring to FIG. 14, the offset voltage adjustment circuit 250 includes switch circuits SW251 and SW252, and NMOS transistors MN251 and MN252.

The switch circuit SW251 has one end connected to a node N101 and the other end connected to a node N206. The switch circuit SW251 is driven by the weight control signal Z2B. The NMOS transistor MN251 has a drain connected to the node N206, a source connected to a node N105, and a gate connected to a node N102. Further, the gate width of the NMOS transistor MN251 is set to the same value as the gate width of the NMOS transistor MN103 of the sense amplifier circuit 140, for example. However, the value of the gate width is just an example, and it is not particularly limited thereto.

The switch circuit SW252 has one end connected to a node N102 and the other end connected to a node N207. The switch circuit SW252 is driven by the weight control signal Z1B. The NMOS transistor MN252 has a drain connected to the node N207, a source connected to the node N105, and a gate connected to a node N101. Further, the gate width of the NMOS transistor MN252 is set to the same value as the gate width of the NMOS transistor MN104 of the sense amplifier circuit 140, for example. However, the value of the gate width is just an example, and it is not particularly limited thereto.

The weight control circuit 160 used in the second exemplary embodiment is basically the same as the circuit shown in FIGS. 6 and 7 of the first exemplary embodiment described above. However, the weight control signals Z1B and Z2B are the inverted signals of the weight control signals Z1 and Z2, which are generated by inverters or the like. Further, the timing chart and the flow chart of the SRAM 200 according to the second exemplary embodiment respectively correspond to those shown in FIGS. 9 and 10 in the first exemplary embodiment, and the timing chart and the flow chart are omitted.

The operation of the SRAM 200 is described hereinbelow. In this exemplary embodiment, like the first exemplary embodiment, data of the SRAM cell CELL that is connected to the word line WL0 and the bit line pair BL0 and BLB0 is read, for example. Specifically, the word line WL0 is selected out of the word lines WL0 to WLm−1, and the column selector 130 selects the bit line pair BL0 and BLB0 according to the column selection signal YS[n−1:0]. Further, the configuration of the offset voltage adjustment circuit 250 and the sense amplifier circuit 140 is the same as that shown in FIG. 13. Further, in the period when the precharge signal PC is Low level, the sense amplifier input terminal pair IN and INB conducted and selected by the column selector 130 is precharged to the power supply voltage VDD together with the bit lines.

In the same manner as shown in FIG. 9, before time t1, the bit line pair BL0 and BLB0 is pre-charged to the power supply voltage VDD by the precharge circuit PCU0. At this time, the values of the weight control activation signal LE and the reset signal RSB are "0". The reset operation is thereby performed in the latch circuits 163 and 164 constituting the weight control circuit 160, and the values of the weight control signals Z1 and Z2 are both reset to "0". At time t1, the word-line signal WL0 is activated. According to the data stored in the selected SRAM cell CELL, one potential of the bit line pair BL0 and BLB0 starts dropping gradually. Further, in response to the column selection signal YS[n−1:0], the column selector 130 selects the bit line pair BL0 and BLB0. Therefore, the input terminal pair of the sense amplifier circuit 140 and the bit line pair BL0 and BLB0 are connected.

Further, at the same time as when the word-line signal is activated, the reset signal RSB and the sense amplifier activation signal SE rise just like in the first exemplary embodiment. The sense amplifier activation signal SE thereby becomes High level, and the sense amplifier circuit 140 is activated. Thus, "0" or "1" is output as the output data OUT according to the sign of the offset voltage of the sense amplifier circuit 140. The operation is the offset voltage determination operation.

Further, at the same time as when the sense amplifier circuit 140 is activated, the weight control activation signal LE rises. The latch operation is thereby performed in the latch circuits 163 and 164 constituting the weight control circuit 160. Thus, the output data OUT and OUTB are stored in the latch circuits 163 and 164, and the weight control signals Z1 and Z2 are output. The logical operation is performed according to the truth table shown in FIG. 8. For example, when the values of the output data OUT and OUTB are "1" and "0", respectively, the weight control signals Z1 and Z2 are (Z1, Z2)=(0, 1), and the weight control signals Z1B and Z2B, which are the inverted signals, are (Z1B, Z2B)=(1, 0). Thus, only the switch circuit SW251 driven by the weight control signal Z2B is disconnected. Consequently, the drive capability on the output terminal OUT side (the node N101 side) of the sense amplifier circuit 140 decreases, and the weight setting×(−1) is made. The effective offset voltage of the sense amplifier circuit 140 is thereby reduced compared to the original offset voltage.

On the other hand, when the values of the output data OUT and OUTB are "0" and "1", respectively, the weight control signals Z1 and Z2 are (Z1, Z2)=(1, 0), and the weight control signals Z1B and Z2B, which are the inverted signals, are (Z1B, Z2B)=(0, 1). Thus, only the switch circuit SW252 driven by the weight control signal Z1B is disconnected. Consequently, the drive capability on the output terminal OUTB side (the node N102 side) of the sense amplifier circuit 140 decreases, and the weight setting×1 is made. The effective offset voltage of the sense amplifier circuit 140 is thereby reduced compared to the original offset voltage. This is the weight setting operation.

In this manner, by the weight control signals Z1B and Z2B (the inverted signals of the weight control signals Z1 and Z2) of the weight control circuit 160, On and Off of the switch circuits SW251 and SW252 are controlled so as to reduce the offset voltage of the sense amplifier circuit 140. The above-described operation is the offset voltage determination and weight setting operation in the second exemplary embodiment.

Then, at time t2, the weight control activation signal LE and the sense amplifier activation signal SE fall. The latch operation thereby ends in the latch circuits 163 and 164 constituting the weight control circuit 160, and the sense amplifier circuit 140 is re-initialized. After that, the latch circuits 163 and 164 hold the values of the weight control signals Z1 and Z2 regardless of the values of the output data OUT and OUTB as shown in the truth table of FIG. 8.

After completion of the offset voltage determination and weight setting operation described above, the process proceeds to the determination operation of actual read data from the selected SRAM cell CELL. Specifically, when the sense amplifier activation signal SE rises at time t3, the read data corresponding to the data stored in the selected SRAM cell CELL appears at the output of the sense amplifier circuit 140.

The SRAM 200 according to the second exemplary embodiment which has the above-described configuration also has the effect of reducing the offset voltage of the sense amplifier circuit 140 in the same manner as shown in FIG. 11 of the first exemplary embodiment.

[Third Exemplary Embodiment]

Figure 15:
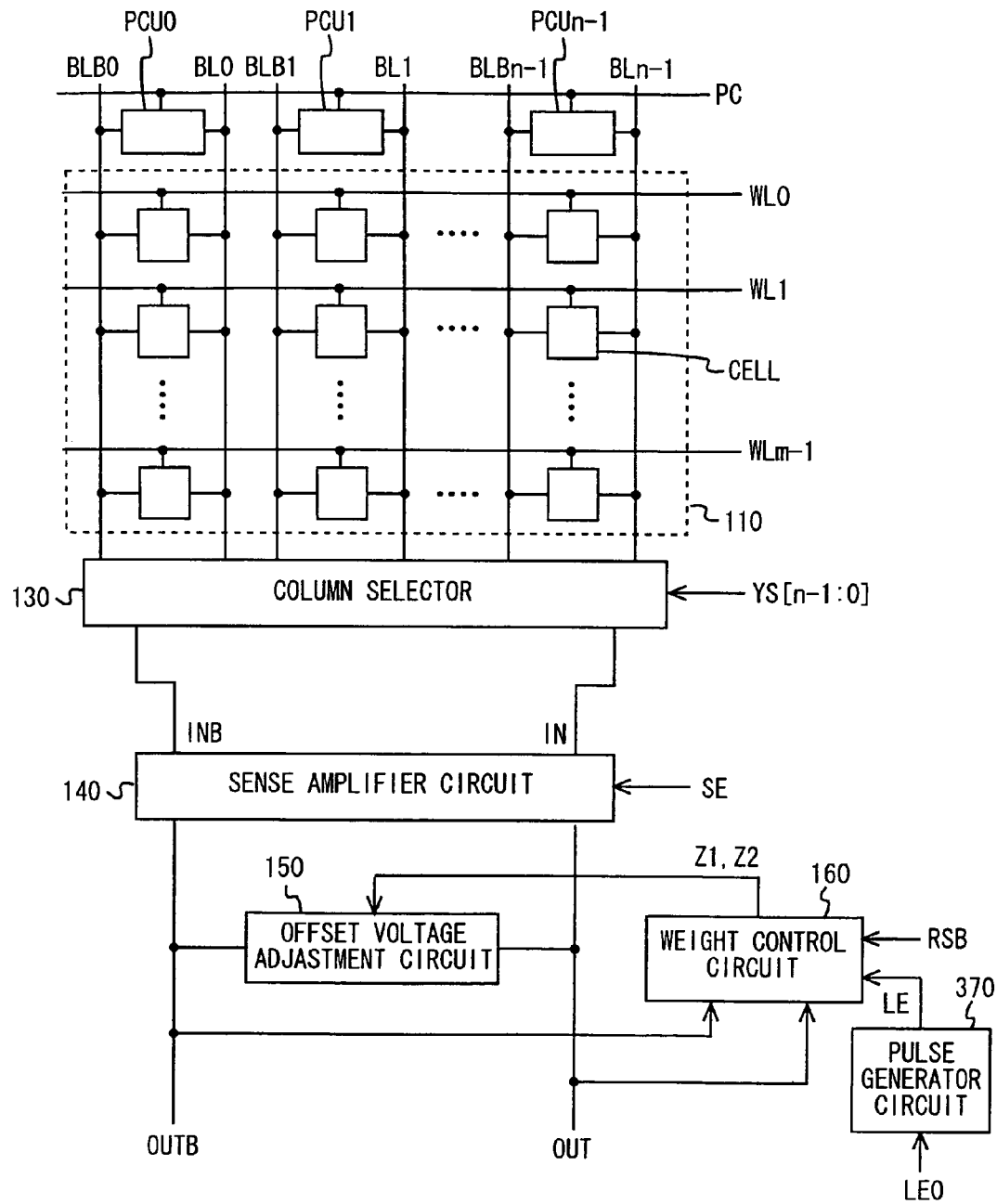
FIG. 15 shows a configuration of SRAM according to a third exemplary embodiment.

A third exemplary embodiment of the present invention is described hereinafter in detail with reference to the drawings. In the third exemplary embodiment, like the first exemplary embodiment, the present invention is applied to SRAM. FIG. 15 shows a configuration of SRAM 300 according to the third exemplary embodiment. Referring to FIG. 15, the SRAM 300 includes a memory cell array 110, precharge circuits PCU0 to PCUn−1, a column selector 130, a sense amplifier circuit 140, an offset voltage adjustment circuit 150, a weight control circuit 160, and a pulse generator circuit 370. Note that, in FIG. 15, the elements denoted by the same reference symbols as in FIG. 1 are the same or similar elements as those in FIG. 1. The third exemplary embodiment is different from the first exemplary embodiment in that the pulse generator circuit 370 is added. Thus, in the third exemplary embodiment, the different point is mainly described, and the same configuration as that of the first exemplary embodiment is not redundantly described.

Referring to FIG. 15, a control signal LE0 is input to the pulse generator circuit 370. Receiving the control signal LE0, the pulse generator circuit 370 generates the weight control activation signal LE having a given pulse width Tdly and outputs it to the weight control circuit 160. The pulse width Tdly is set to a value from 50 ps to 400 ps, for example.

The weight control circuit 160 is connected to the output of the sense amplifier circuit 140. The weight control circuit 160 is activated by the weight control activation signal LE with the pulse width Tdly generated by the pulse generator circuit 370. Then, the weight control circuit 160 performs the offset voltage determination of the sense amplifier circuit 140 and outputs the weight control signals Z1 and Z2 based on its result. The offset voltage adjustment circuit 150 is controlled by the weight control signals Z1 and Z2 to thereby set the weights of drivabilities of the output terminals OUT and OUTB of the sense amplifier circuit 140.

Figure 16:
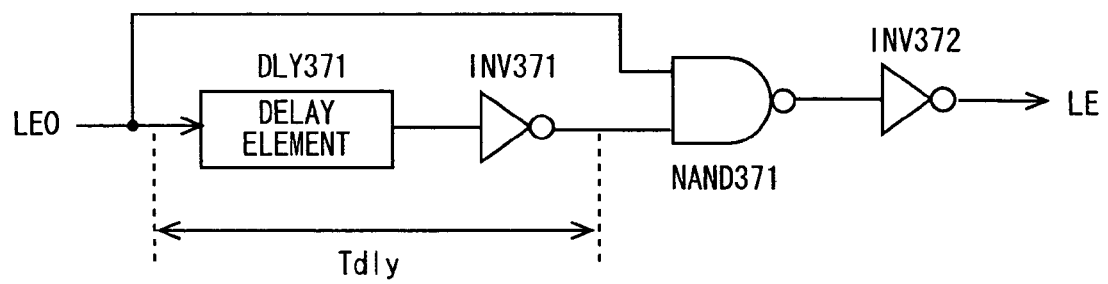
FIG. 16 shows a configuration of a pulse generator circuit according to the third exemplary embodiment.

A circuit shown in FIG. 16 is used as the pulse generator circuit 370 in order to generate the weight control activation signal LE having a short pulse width. Referring to FIG. 16, the pulse generator circuit 370 includes a delay element DLY 371, inverters IV371 and IV372, and a NAND circuit NAND371.

The delay element DLY 371 receives the control signal LE0 and outputs it to the input terminal of the inverter IV371 with a certain delay. The output signal of the delay element DLY 371 is input to the inverter IV371. Then, the inverter IV371 outputs the inverted signal of the input signal to one input terminal of the NAND circuit NAND371.

The output signal of the inverter IV371 is input to one input terminal of the NAND circuit NAND371, and the control signal LE0 is input to the other input terminal of the NAND circuit NAND371. The NAND circuit NAND371 outputs an output signal to the input terminal of the inverter IV372. The output signal of the NAND circuit NAND371 is input to the input terminal of the inverter IV372, and the inverter IV372 outputs its inverted signal as the weight control activation signal LE.

Note that the pulse width of the weight control activation signal LE is determined by a propagation delay Tdly from when the control signal LE0 is input to the delay element DLY 371 to when it is output from the inverter IV371.

The weight control circuit 160 performs a logical operation according to the truth table shown in FIG. 17. Note that, when the value of the reset signal RSB is "0" (Low level), the operation is the same as that shown in the truth table of FIG. 8, and an explanation thereof is omitted.

When the value of the reset signal RSB is "1" (High level) and the value of the weight control activation signal LE is "1", the weight control signals Z1 and Z2 shown in FIG. 17 are output according to the values of the output data OUT and OUTB. For example, when the values of the output data OUT and OUTB are "1" and "0", respectively, the values of the weight control signals Z1 and Z2 are "0" and "1", respectively. Further, when the values of the output data OUT and OUTB are "0" and "1", respectively, the values of the weight control signals Z1 and Z2 are "1" and "0", respectively. Further, when the values of the output data OUT and OUTB are "1" and "1", respectively, the values of the weight control signals Z1 and Z2 are "0" and "0", respectively. Note that the case where the values of the output data OUT and OUTB are "0" and "0" is inhibited input.

The configurations of the offset voltage adjustment circuit 150 to which the weight control signals Z1 and Z2 are input and the sense amplifier circuit 140 are the same as those shown in FIG. 2 or 4 of the first exemplary embodiment. Further, the offset voltage adjustment circuit 150 may be replaced with the offset voltage adjustment circuit 151 shown in FIG. 3 or 5.

Figure 18:
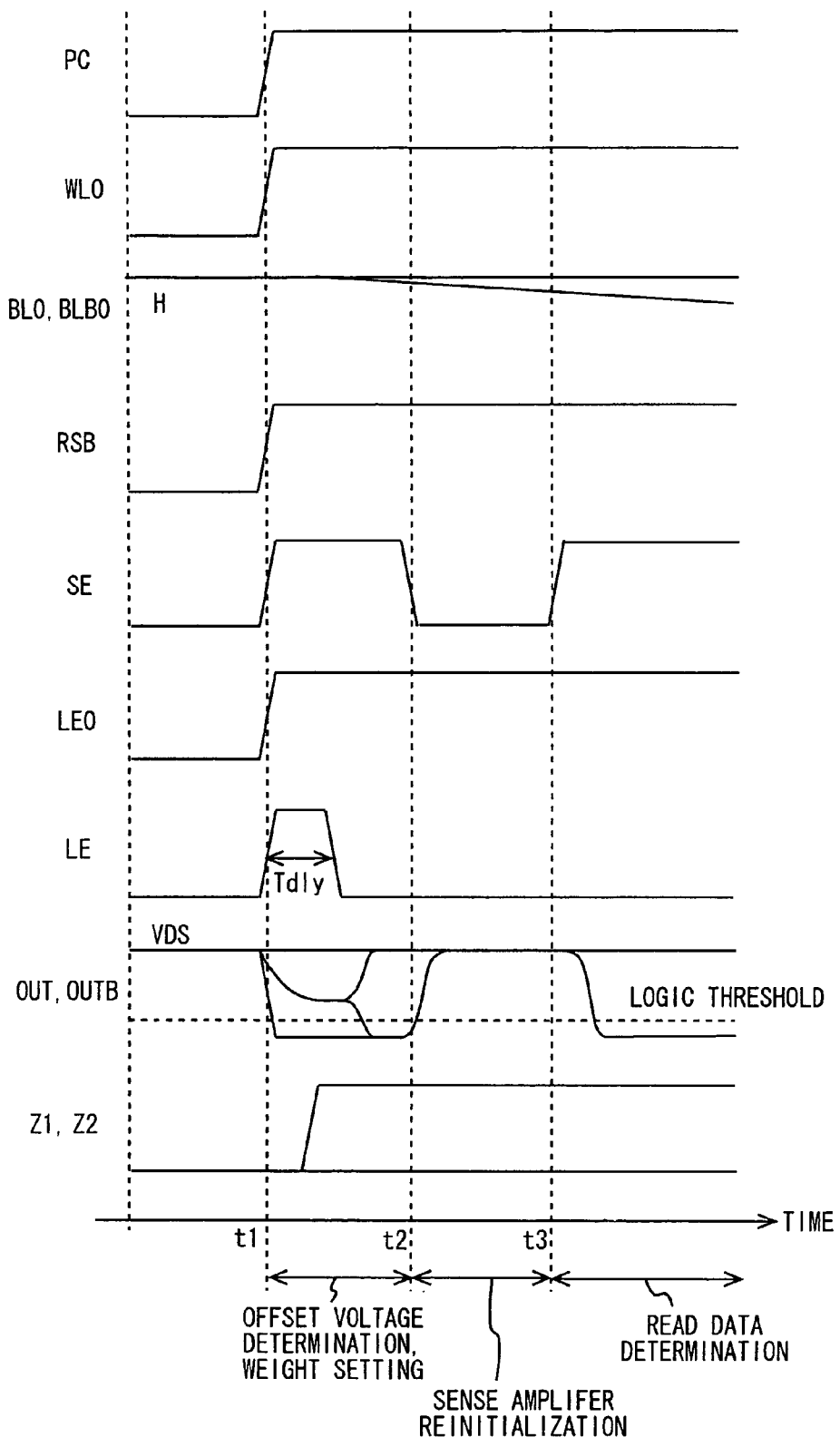
FIG. 18 shows a timing chart to describe the operation of SRAM according to the third exemplary embodiment.

FIG. 18 shows an operational timing chart of the SRAM 300 described above. The operation of the SRAM 300 is described hereinafter with reference to the operational timing chart shown in FIG. 18. Note that data of the SRAM cell CELL that is connected to the word line WL0 and the bit line pair BL0 and BLB0 is read in this example. Specifically, the word line WL0 is selected out of the word lines WL0 to WLm−1, and the column selector 130 selects the bit line pair BL0 and BLB0 according to the column selection signal YS[n−1:0]. The configuration of the offset voltage adjustment circuit 150 and the sense amplifier circuit 140 is the same as that shown in FIG. 2. Further, in the period when the precharge signal PC is Low level, the sense amplifier input terminal pair IN and INB conducted and selected by the column selector 130 is pre-charged to the power supply voltage VDD together with the bit lines.

Referring to FIG. 18, before time t1, the bit line pair BL0 and BLB0 is pre-charged to the power supply voltage VDD by the precharge circuit PCU0. At this time, the values of the weight control activation signal LE and the reset signal RSB are "0". The reset operation is thereby performed in the latch circuits 163 and 164 constituting the weight control circuit 160, and the values of the weight control signals Z1 and Z2 are both reset to "0".

At time t1, the word-line signal WL0 is activated. According to the data stored in the selected SRAM cell CELL, one potential of the bit line pair BL0 and BLB0 starts dropping gradually. Further, in response to the column selection signal YS[n−1:0], the column selector 130 selects the bit line pair BL0 and BLB0. Therefore, the input terminal pair of the sense amplifier circuit 140 and the bit line pair BL0 and BLB0 are connected.

Further, at the same time as when the word-line signal is activated at time t1, the reset signal RSB and the sense amplifier activation signal SE rise. The sense amplifier activation signal SE thereby becomes High level, and the sense amplifier circuit 140 is activated. Thus, "0" or "1" is output as the output data OUT according to the polarity of the offset voltage of the sense amplifier circuit 140. Furthermore, at the same time as when the word-line signal is activated at time t1, the control signal LE0 rises.

When the control signal LE0 rises, the weight control activation signal LE having the pulse width Tdly by the pulse generator circuit 370 rises, and the offset voltage determination operation is performed. During the period when the weight control activation signal LE is High level, if the output data OUT and OUTB are both "1", the weight control signals Z1 and Z2 are (Z1, Z2)=(0, 0). Thus, the load capacitors C101 and C102 are not electrically connected to the node N101 and N102, respectively, and the process proceeds to the read data determination operation. Alternatively, when the output data OUT is defined as "0" or "1", and the output data OUTB is defined as the inverted value of the output data OUT during the period when the weight control activation signal LE is High level, the weight control circuit 160 performs the same logical operation as that of the first exemplary embodiment, and the weight setting operation is performed. The operation is the weight setting operation according to the third exemplary embodiment.

The weight control activation signal LE falls at time t2, which is after the lapse of the delay time Tdly from the rising edge of the weight control activation signal LE. The latch operation thereby ends in the latch circuits 163 and 164 constituting the weight control circuit 160. After that, the latch circuits 163 and 164 hold the values of the weight control signals Z1 and Z2 regardless of the values of the output data OUT and OUTB as shown in the truth table of FIG. 17.

After completion of the offset voltage determination and weight setting operation described above, the process proceeds to the determination operation of actual read data from the selected SRAM cell CELL. Specifically, when the sense amplifier activation signal SE rises at time t3, the read data corresponding to the data stored in the selected SRAM cell CELL appears at the output of the sense amplifier circuit 140.

Figure 19:
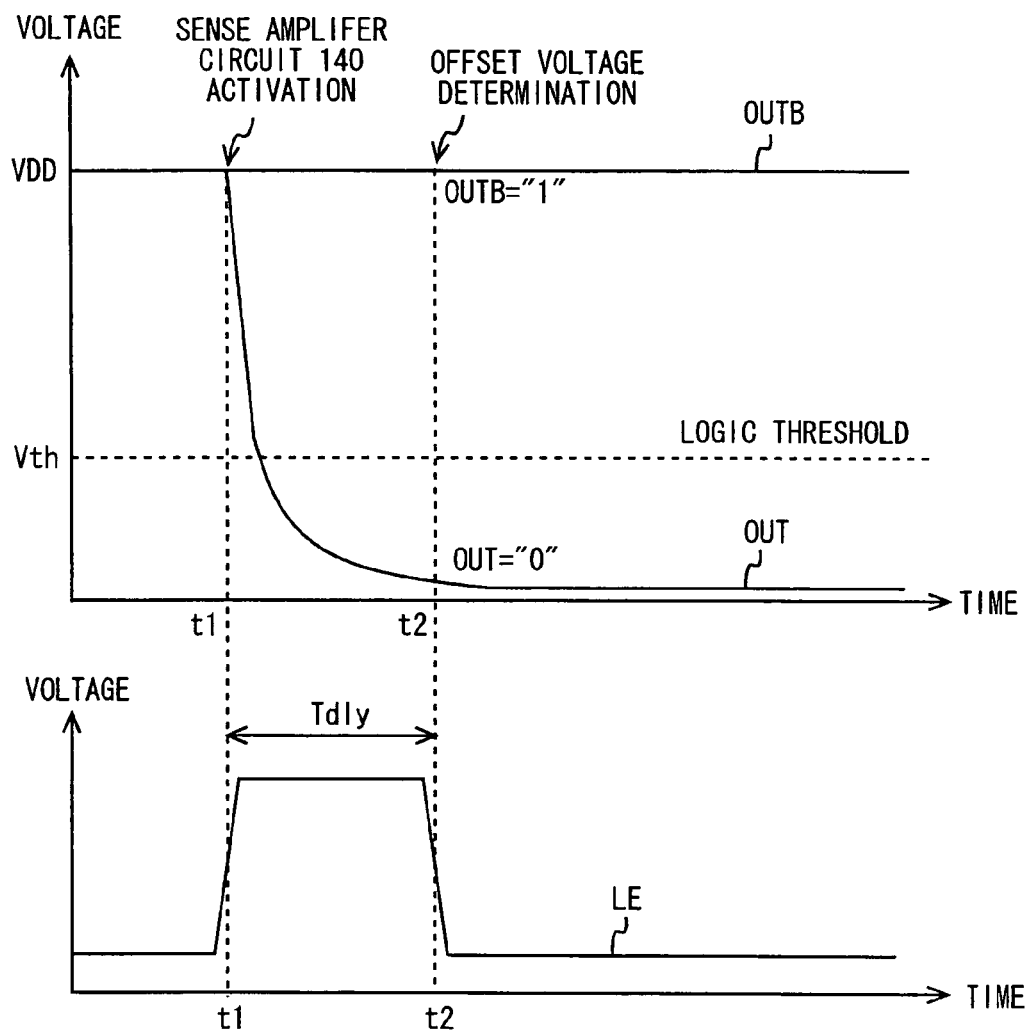
FIG. 19 is a timing chart to describe in detail the offset voltage determination operation of SRAM according to the third exemplary embodiment.

The offset voltage determination operation which is started at time t1 described above is described in further detail with reference to FIGS. 19 and 20. The timing chart of FIG. 19 shows the case where the offset voltage of the sense amplifier circuit 140 is high. The timing chart of FIG. 20 shows the case where the offset voltage of the sense amplifier circuit 140 is low.

First, in the case where the offset voltage of the sense amplifier circuit 140 is sufficiently high as shown in FIG. 19, if the sense amplifier circuit 140 is activated for the offset voltage determination at time t1, one of the output data OUT and OUTB drops instantaneously from the power supply voltage VDD according to the polarity of the offset voltage. Thus, the value of the output data OUT is defined in a short time.

Figure 20:
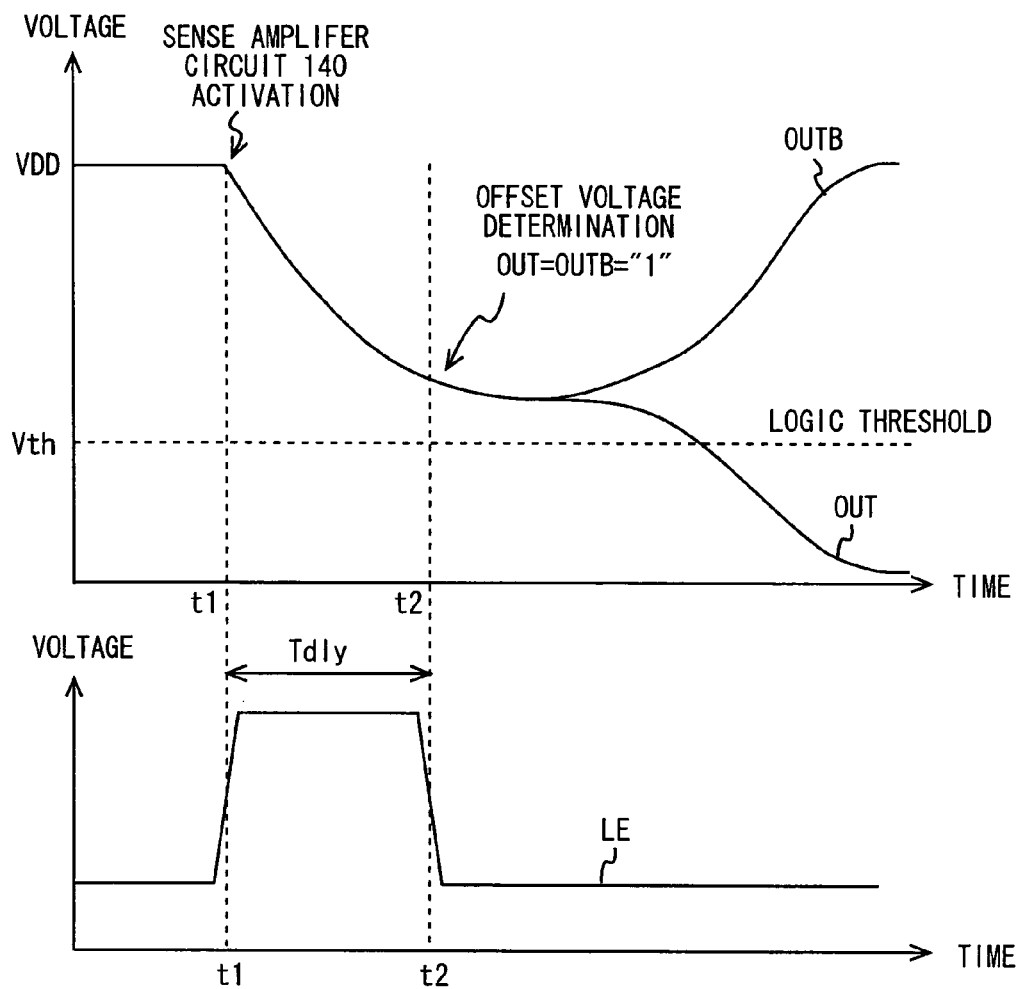
FIG. 20 is a timing chart to describe in detail the offset voltage determination operation of SRAM according to the third exemplary embodiment.

On the other hand, in the case where the offset voltage of the sense amplifier circuit 140 is sufficiently low, e.g. when the offset voltage is substantially zero, as shown in FIG. 20, if the sense amplifier circuit 140 is activated at time t1, the output data OUT and OUTB start dropping gradually from the power supply voltage VDD to an intermediate voltage. Then, when the given period Tdly has passed, one of the output data OUT and OUTB transitions toward the power supply voltage VDD and the other one transitions to the ground voltage GND, and the value of the output data OUT is defined.

At this time, if the weight control circuit 160 performs the offset voltage determination operation within the delay period Tdly of the pulse generator circuit 370, the potentials of the output terminals OUT and OUTB of the sense amplifier circuit 140 are both higher than a threshold voltage value Vth, and thus the output data OUT and OUTB are both "1".

In this manner, in the third exemplary embodiment, the weight control circuit 160 performs the offset voltage determination operation within the delay period Tdly from the activation of the sense amplifier circuit 140 and thereby determines whether the offset voltage of the sense amplifier circuit 140 is sufficiently low. Then, when the offset voltage of the sense amplifier circuit 140 is sufficiently low, the operation to change the weight setting of drive capability is not performed, thereby overcoming the concern that an unnecessary offset voltage is applied.

Figure 21:
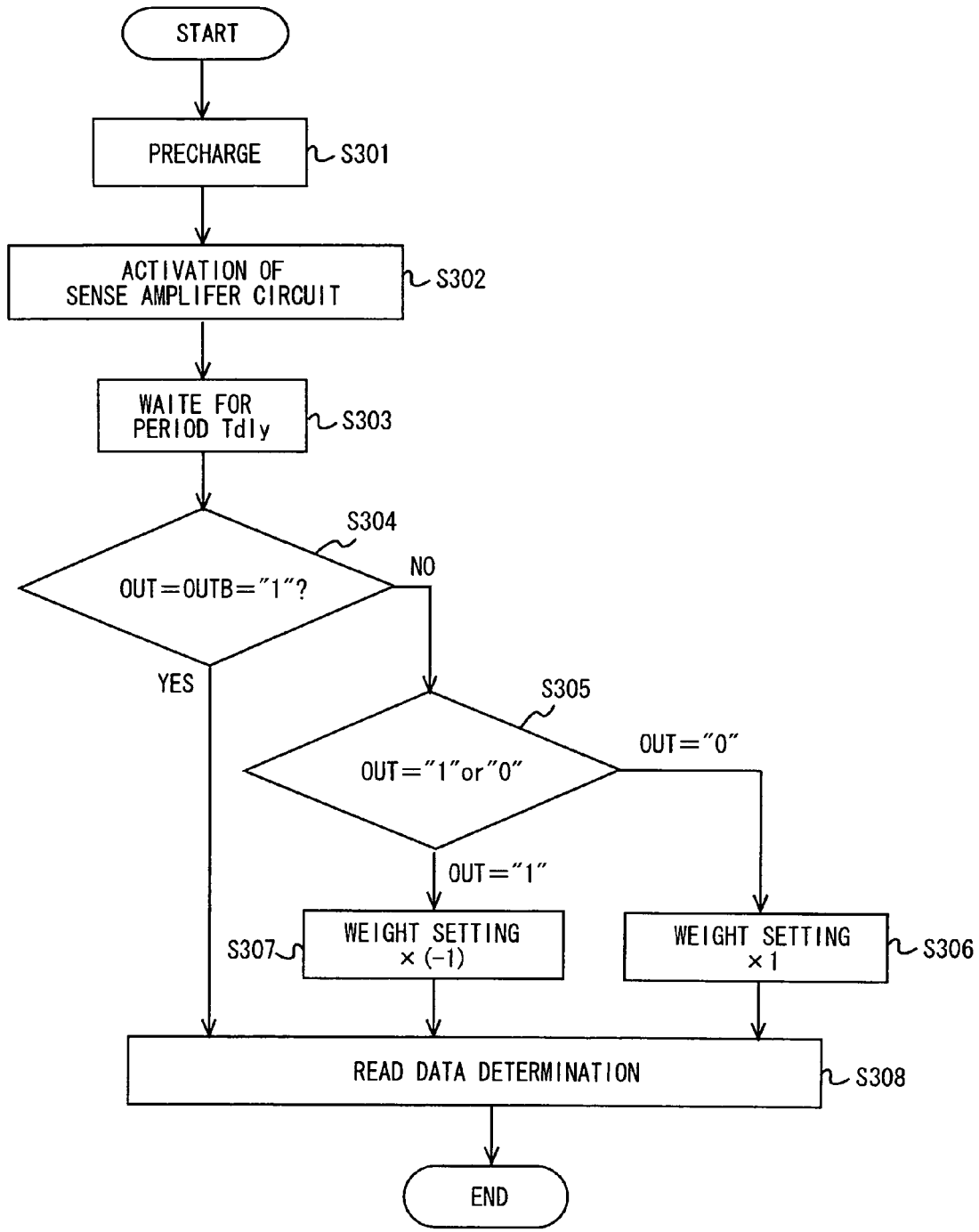
FIG. 21 is a flowchart to describe the operation of SRAM according to the third exemplary embodiment.

FIG. 21 is a flowchart showing the offset voltage determination operation and the weight setting operation according to the third exemplary embodiment. Referring to FIG. 21, the bit line pairs BL0 and BLB0 to BLn-1 and BLBn-1 are pre-charged to the power supply voltage VDD by the pre-charge circuits PCU0 to PCUn-1 (S301). Next, the sense amplifier circuit 140 is activated to make the offset voltage determination (S302). Then, the weight control circuit 160 waits for the given period Tdly to perform the offset voltage determination operation (S303).

Then, the weight control circuit 160 performs the offset voltage determination operation and determines whether the output data OUT and OUTB satisfy OUT=OUTB=1 (304). When the values of the output data OUT and OUTB do not satisfy OUT=OUTB=1 (NO in S304), the weight control circuit 160 determines whether the value of the output data OUT is "1" or "0" (S305).

When the value of the output data OUT is "1", the weight control signals Z1 and Z2 are (Z1, Z2)=(0, 1), and the weight setting×(−1) is made in the offset voltage adjustment circuit 150 (S306). When the value of the output data OUT is "0", the weight control signals Z1 and Z2 are (Z1, Z2)=(1, 0), and the weight setting×1 is made in the offset voltage adjustment circuit 150 (S307).

When the values of the output data OUT and OUTB satisfy OUT=OUTB=1 in S304 (YES in S304), or after the weight setting of the offset voltage adjustment circuit 150 in S306 or S307, the determination about read data from the selected SRAM cell CELL is performed (S308).

Figure 22:
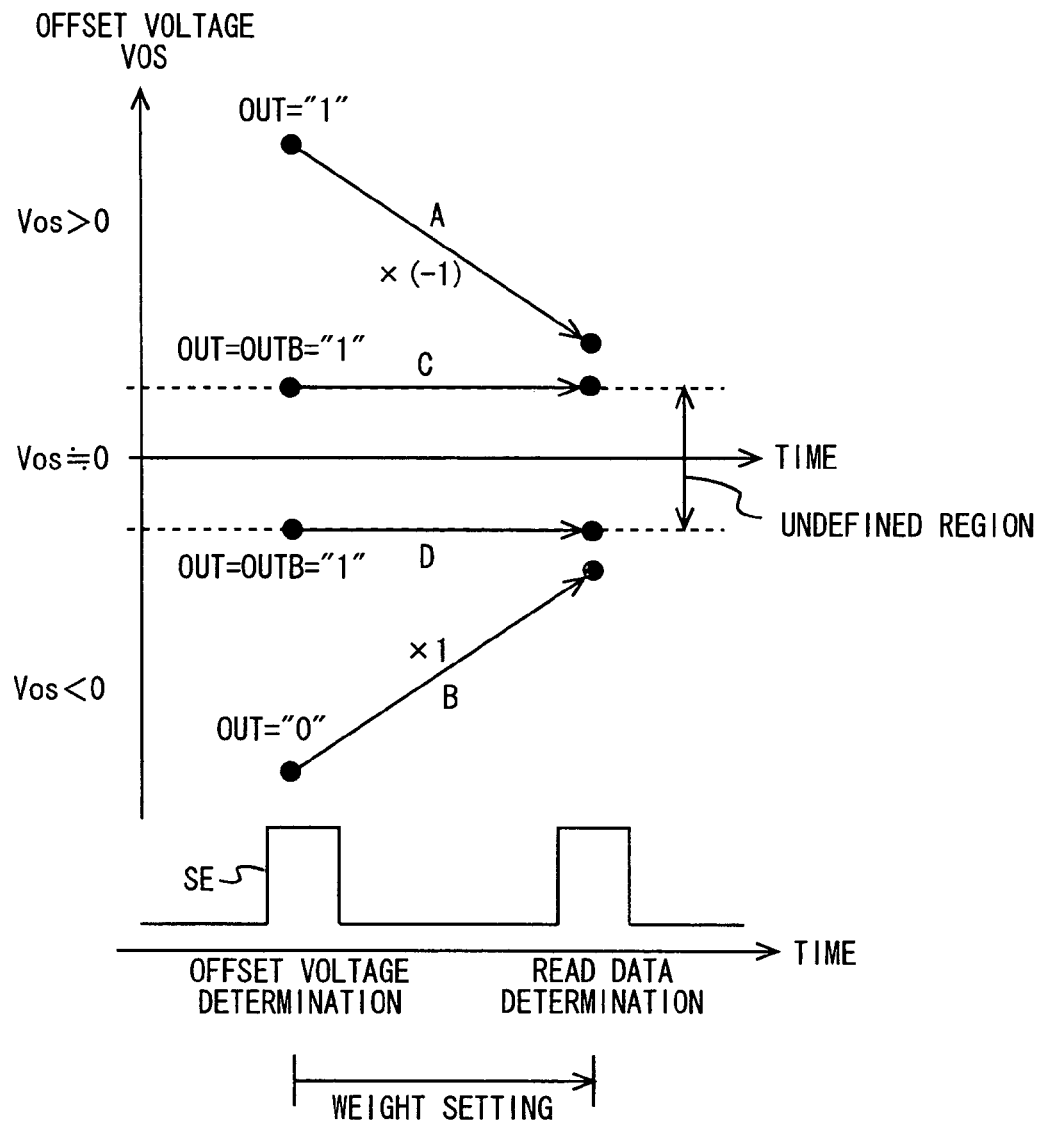
FIG. 22 is a schematic view to describe the effect of SRAM according to the third exemplary embodiment.

FIG. 22 is a schematic view to describe the offset voltage reduction effect according to the third exemplary embodiment described above. In FIG. 22, like FIG. 11, "Vos" indicates the offset voltage of the sense amplifier circuit 140, and when Vos>0, the output terminal OUT has a higher offset voltage than the output terminal OUTB. On the contrary, when Vos<0, the output terminal OUT has a smaller offset voltage than the output terminal OUTB.

Consider first the case where Vos>0 (the output terminal OUT has a larger offset voltage than the output terminal OUTB) and the output data OUT is "1" at the time of the offset voltage determination, which is the pattern A in FIG. 22. In this case, the weight setting×(−1) is made, so that the effective offset voltage of the sense amplifier circuit 140 is reduced, as in the first exemplary embodiment. Then, at the time of the read data determination, the sense amplifier circuit 140 operates with the effectively reduced offset voltage.

Consider next the case where Vos<0 (the output terminal OUT has a smaller offset voltage than the output terminal OUTB) and the output data OUT is "0" at the time of the offset voltage determination, which is the pattern B in FIG. 22. In this case also, the weight setting×1 is made, so that the effective offset voltage of the sense amplifier circuit 140 is reduced, as in the first exemplary embodiment. Then, at the time of the read data determination, the sense amplifier circuit 140 operates with the effectively reduced offset voltage.

Consider then the case where Vos>0 and the output data OUT and OUTB are both "1" at the time of the offset voltage determination as shown in the pattern C in FIG. 22. In this case, in spite of Vos>0, the output data OUT and OUTB are both "1" at the time of the offset voltage determination. It is assumed that the offset voltage of the sense amplifier circuit 140 is very low. In this case, in the third exemplary embodiment, the weight control signals (Z1, Z2)=(0, 0) are output as a result of the offset voltage determination of the weight control circuit 160. Therefore, differently from the first exemplary embodiment, the weight setting×1 is not made, so that the offset voltage of the sense amplifier circuit 140 does not change. Then, at the time of the read data determination, the sense amplifier circuit 140 operates with the small offset voltage.

Further, consider the case where Vos<0 and the output data OUT and OUTB are both "1" at the time of the offset voltage determination as shown in the pattern D in FIG. 22. In this case, in spite of Vos<0, the output data OUT and OUTB are both "1" at the time of the offset voltage determination. In this case also, it is assumed that the offset voltage of the sense amplifier circuit 140 is very low. Thus, just like the above case, the weight control signals (Z1, Z2)=(0, 0) are output as a result of the offset voltage determination of the weight control circuit 160 in the third exemplary embodiment. Therefore, differently from the first exemplary embodiment, the weight setting×(−1) is not made, so that the offset voltage of the sense amplifier circuit 140 does not change. Then, at the time of the read data determination, the sense amplifier circuit 140 operates with the small offset voltage.

As described above, in the first and second exemplary embodiments, there is a possibility that a large offset voltage is adversely applied to the sense amplifier circuit 140 with a sufficiently small offset voltage. However, in the third exemplary embodiment, it is possible to determine whether the offset voltage of the sense amplifier circuit 140 is sufficiently small during the offset voltage determination operation. It is thus possible to overcome the concern that an unnecessary offset voltage is applied when the offset voltage of the sense amplifier circuit 140 is sufficiently small, which has been pointed out in the first and second exemplary embodiments.

[Fourth Exemplary Embodiment]

Figure 23:
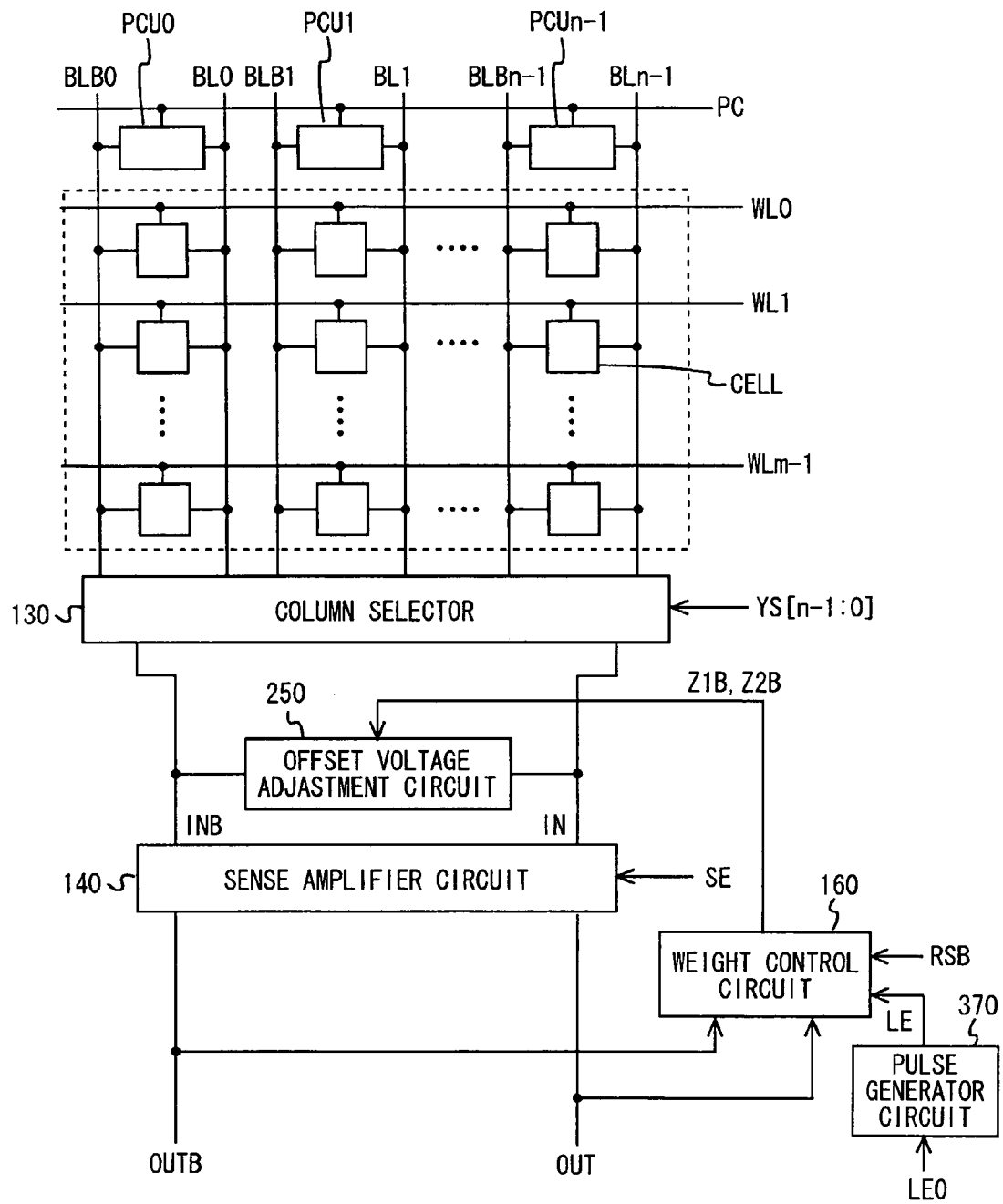
FIG. 23 shows a configuration of SRAM according to a fourth exemplary embodiment.

A fourth exemplary embodiment of the present invention is described hereinafter in detail with reference to the drawings. In the fourth exemplary embodiment, like the third exemplary embodiment, the present invention is applied to SRAM. FIG. 23 shows a configuration of SRAM 400 according to the fourth exemplary embodiment. Referring to FIG. 23, the SRAM 400 includes a memory cell array 110, precharge circuits PCU0 to PCU*n*−1, a column selector 130, a sense amplifier circuit 140, an offset voltage adjustment circuit 250, a weight control circuit 160, and a pulse generator circuit 370. Note that, in FIG. 23, the elements denoted by the same reference symbols as in FIGS. 12 and 15 are the same or similar elements as those in FIGS. 12 and 15. The fourth exemplary embodiment is different from the third exemplary embodiment in the configuration and the connected position of the offset voltage adjustment circuit 250. Thus, in the fourth exemplary embodiment, the different point is mainly described, and the same configuration as that of the third exemplary embodiment is not redundantly described.

Referring to FIG. 23, the offset voltage adjustment circuit 250 is connected to the sense amplifier input terminal pair IN and NB of the sense amplifier circuit 140. Further, the offset voltage adjustment circuit 250 performs the weight setting operation according to the weight control signals Z1B and Z2B, which are the inverted signals of the weight control signals Z1 and Z2 that are output from the weight control circuit 160. The offset voltage adjustment circuit 250 thereby sets the weights of drivabilities of the output terminals OUT and OUTB of the sense amplifier circuit 140. The pulse generator circuit 370 receives the weight control activation signal LE. Then, the pulse generator circuit 370 outputs the weight control activation signal LE with addition of the given period Tdly to the weight control circuit 160, just like in the third exemplary embodiment.

The weight control circuit 160 is connected to the output of the sense amplifier circuit 140. The weight control circuit 160 is activated by the weight control activation signal LE which is delayed for the period Tdly by the pulse generator circuit 370. Then, the weight control circuit 160 performs the offset voltage determination of the sense amplifier circuit 140 and outputs the weight control signals Z1B and Z2B based on its result. Note that the threshold voltage value Vth of the offset voltage determination is lower than the intermediate potential of the power supply voltage VDD. The offset voltage adjustment circuit 250 is controlled by the weight control signals Z1B and Z2B to thereby set the weights of drivabilities of the output terminals OUT and OUTB of the sense amplifier circuit 140. Further, the weight control circuit 160 performs a logical operation according to the truth table shown in FIG. 17. It should be noted that, however, the weight control signals Z1B and Z2B are the inverted signals of the weight control signals Z1 and Z2 shown in FIG. 17.

The offset voltage adjustment circuit 250 includes switch circuits SW251 and SW252, and NMOS transistors MN251 and MN252. This is the same as that of FIG. 13 according to the second exemplary embodiment, and a detailed explanation thereof is omitted. The connection and detailed configuration of the sense amplifier circuit 140 and the offset voltage adjustment circuit 250 are also the same as those of FIG. 13, and a detailed explanation thereof is omitted. Note that the connection between the sense amplifier circuit 140 and the offset voltage adjustment circuit 250 may be as shown in FIG. 14, as described in the second exemplary embodiment. Further, the timing chart and the flow chart of the SRAM 400 according to the fourth exemplary embodiment respectively correspond to those shown in FIGS. 18 to 21 in the third exemplary embodiment, and the timing chart and the flow chart are omitted.

The operation of the SRAM 400 is described hereinbelow. In this example also, data of the SRAM cell CELL that is connected to the word line WL0 and the bit line pair BL0 and BLB0 is read, as in the third exemplary embodiment. Specifically, the word line WL0 is selected out of the word lines WL0 to WL*m*−1, and the column selector 130 selects the bit line pair BL0 and BLB0 according to the column selection signal YS[n−1:0]. Further, the configuration of the offset voltage adjustment circuit 250 and the sense amplifier circuit 140 is the same as that shown in FIG. 13. Furthermore, in the period when the precharge signal PC is Low level, the sense amplifier input terminal pair IN and INB conducted and selected by the column selector 130 is pre-charged to the power supply voltage VDD together with the bit lines.

In the same manner as shown in FIG. 18, before time t1, the bit line pair BL0 and BLB0 is pre-charged to the power supply voltage VDD by the precharge circuit PCU0. At time t1, the word-line signal WL0 is activated. According to the data stored in the selected SRAM cell CELL, one potential of the bit line pair BL0 and BLB0 starts dropping gradually. Further, in response to the column selection signal YS[n−1:0], the column selector 130 selects the bit line pair BL0 and BLB0. Therefore, the input terminal pair of the sense amplifier circuit 140 and the bit line pair BL0 and BLB0 are connected.

Further, at the same time as when the word-line signal is activated at the time t1, the sense amplifier activation signal SE rises, and the sense amplifier circuit 140 is activated. Thus, "0" or "1" is output as the output data OUT according to the polarity of the offset voltage of the sense amplifier circuit 140. Note that the inverted signal of the output data OUT is output as the output data OUTB. Furthermore, at the same time as when the word-line signal is activated at time t1, the control signal LE0 rises.

When the control signal LE0 rises, the weight control activation signal LE having the given pulse width Tdly by the pulse generator circuit 370 rises, and the offset voltage determination operation is performed. At this time, when the output data OUT and OUTB are both "1", the weight control signals Z1 and Z2 are (Z1, Z2)=(0, 0), and the weight control signals Z1B and Z2B, which are their inverted signals, are (Z1B, Z2B)=(1, 1). Thus, both of the switch circuits SW251 and SW252 driven by the weight control signals Z1B and Z2B are not disconnected. Consequently, the offset voltage of the sense amplifier circuit 140 is not changed, and the process proceeds to the read data determination operation. Alternatively, when the output data OUT is defined as "0" or "1", and the output data OUTB is defined as the inverted value of the output data OUT during a given period when the weight control activation signal LE is High level, the weight control circuit 160 performs the same logical operation as that of the second exemplary embodiment, and the weight setting operation is performed. The operation is the weight setting operation according to the fourth exemplary embodiment.

After completion of the offset voltage determination and weight setting operation described above, the process proceeds to the determination operation of actual read data from the selected SRAM cell CELL. Specifically, when the sense amplifier activation signal SE rises at time t3, the read data corresponding to the data stored in the selected SRAM cell CELL appears at the output of the sense amplifier circuit 140.

Note that the offset voltage determination operation performed at the time t2 described above is also the same as the operation described in FIGS. 19 and 20 in the third exemplary embodiment, and an explanation thereof is omitted in the fourth exemplary embodiment.

As described above, in the fourth exemplary embodiment, by the weight control signals Z1B and Z2B (the inverted signals of the weight control signals Z1 and Z2) from the weight control circuit 160, the operation to change the weight setting of drive capability is performed when the offset voltage of the sense amplifier circuit 140 is high, thereby reducing the effective offset voltage. On the other hand, when the offset voltage of the sense amplifier circuit 140 is sufficiently low, the operation to change the weight setting of drive capability is not performed, thereby overcoming the concern that an unnecessary offset voltage is applied, just like in the third exemplary embodiment.

[Fifth Exemplary Embodiment]

Figure 24:
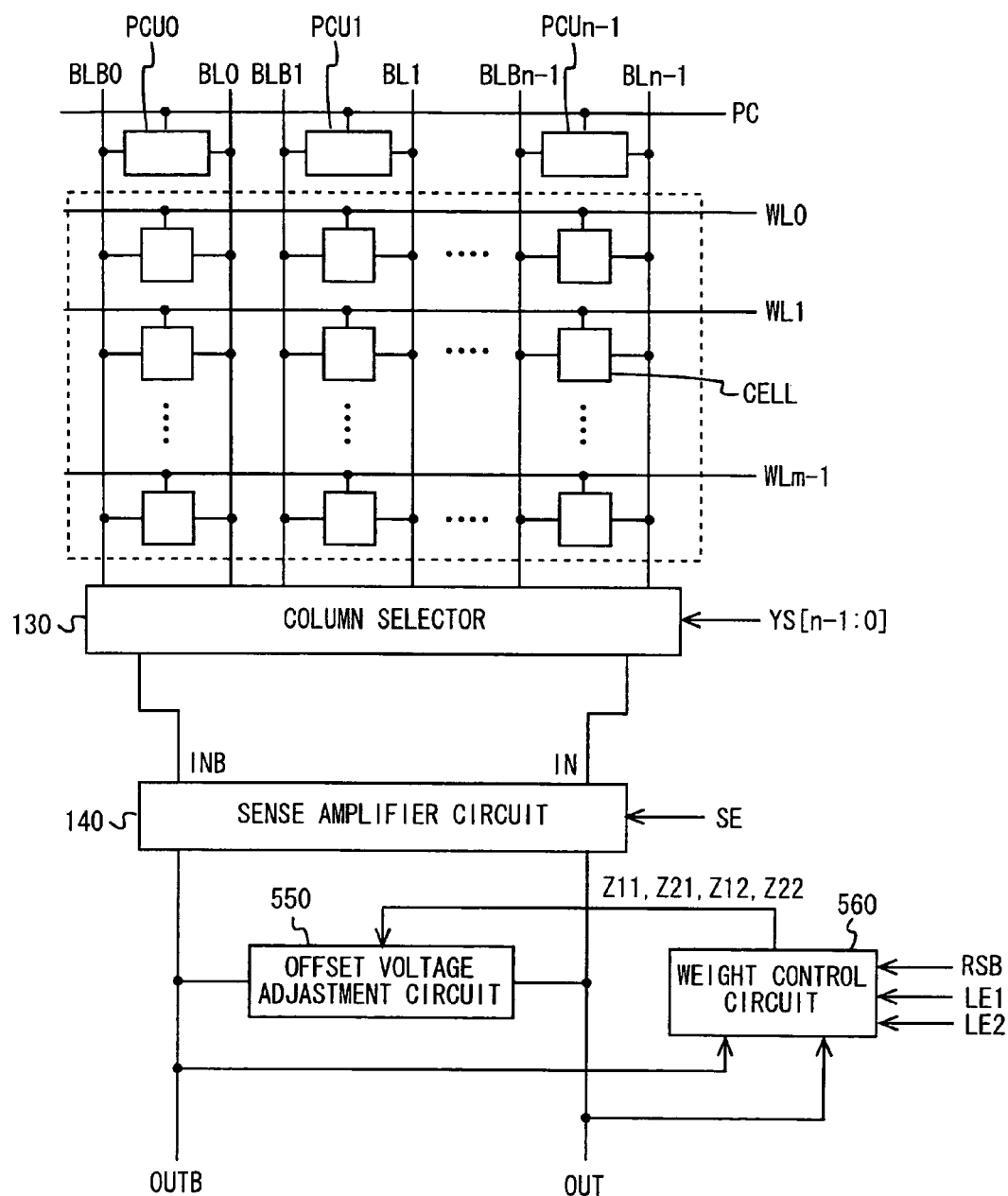
FIG. 24 shows a configuration of SRAM according to a fifth exemplary embodiment.

A fifth exemplary embodiment of the present invention is described hereinafter in detail with reference to the drawings. In the fifth exemplary embodiment, like the first exemplary embodiment, the present invention is applied to SRAM. FIG. 24 shows a configuration of SRAM 500 according to the fifth exemplary embodiment. Referring to FIG. 24, the SRAM 500 includes a memory cell array 110, precharge circuits PCU0 to PCUn−1, a column selector 130, a sense amplifier circuit 140, an offset voltage adjustment circuit 550, and a weight control circuit 560. Note that, in FIG. 24, the elements denoted by the same reference symbols as in FIG. 1 are the same or similar elements as those in FIG. 1. The fifth exemplary embodiment is different from the first exemplary embodiment in the operation of the weight control circuit 560, the offset voltage adjustment circuit 550 and the sense amplifier circuit 140. Thus, in the fifth exemplary embodiment, the different point is mainly described, and the same configuration as that of the first exemplary embodiment is not redundantly described.

The offset voltage adjustment circuit 550 is connected to the output of the sense amplifier circuit 140. The offset voltage adjustment circuit 550 performs the weight setting operation according to weight control signals Z11, Z21, Z12 and Z22 that are output from the weight control circuit 560. The offset voltage adjustment circuit 550 thereby sets the weights of drivabilities of the output terminals OUT and OUTB of the sense amplifier circuit 140.

Figure 25:
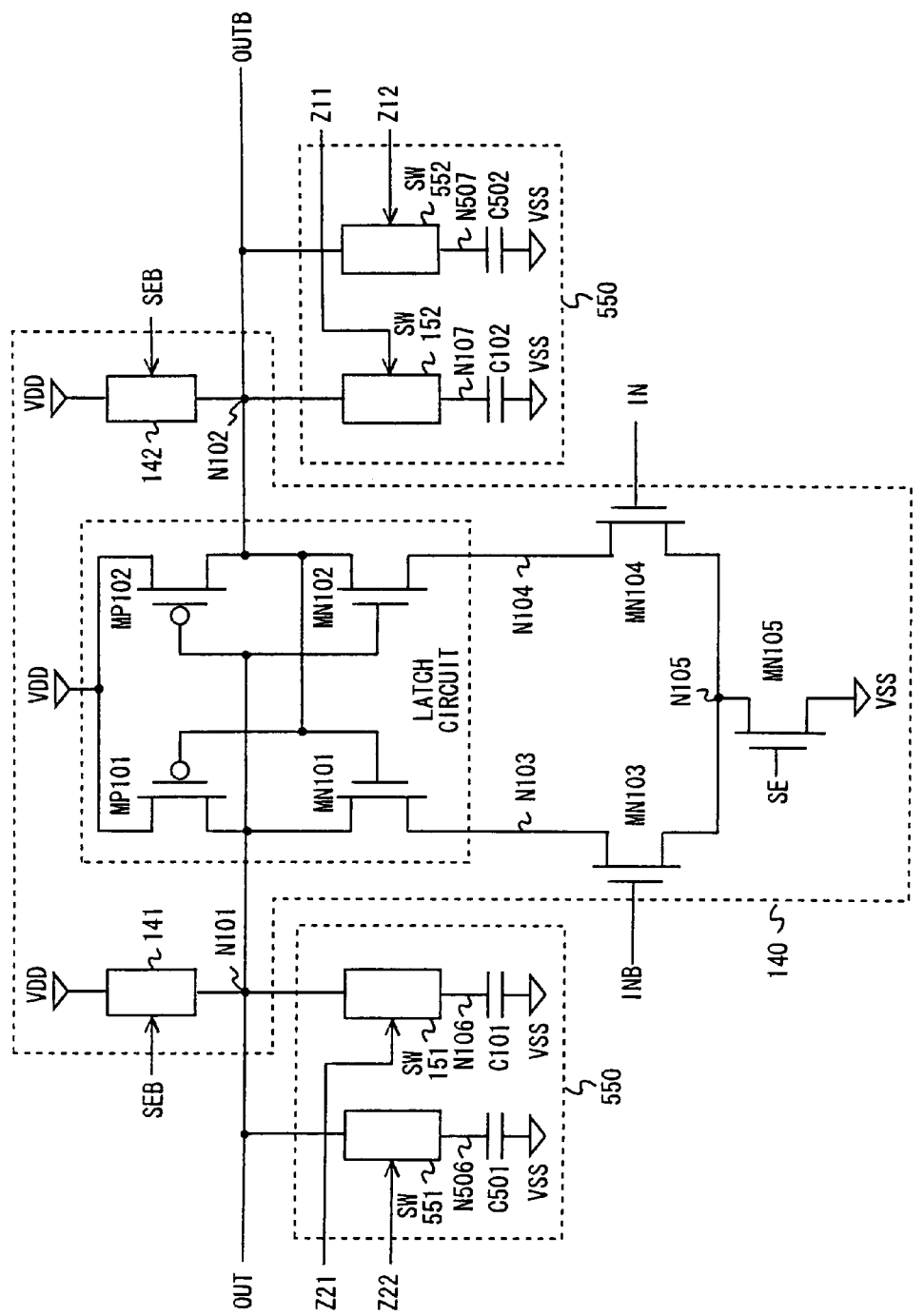
FIG. 25 shows a first configuration of a sense amplifier circuit and an offset voltage adjustment circuit according to the fifth exemplary embodiment.

FIG. 25 shows the connection and detailed configuration of the sense amplifier circuit 140 and the offset voltage adjustment circuit 550. The configuration of the sense amplifier circuit 140 is the same as that of FIG. 2, and a detailed explanation thereof is omitted. Referring to FIG. 25, the offset voltage adjustment circuit 550 includes switch circuits SW151 and SW152, SW551 and SW552 and load capacitors C101, C102, C501 and C502. The switch circuit SW151 has one end connected to a node N101 and the other end connected to a node N106. The switch circuit SW151 is driven by the weight control signal Z21. The load capacitor C101 has one end connected to the node N106 and the other end connected to the ground voltage terminal VSS. The switch circuit SW152 has one end connected to a node N102 and the other end connected to a node N107. The switch circuit SW152 is driven by the weight control signal Z11. The load capacitor C102 has one end connected to the node N107 and the other end connected to the ground voltage terminal VSS.

The switch circuit SW551 has one end connected to the node N101 and the other end connected to a node N506. The switch circuit SW551 is driven by the weight control signal Z22. The load capacitor C501 has one end connected to the node N506 and the other end connected to the ground voltage terminal VSS. The switch circuit SW552 has one end connected to a node N102 and the other end connected to a node N507. The switch circuit SW552 is driven by the weight control signal Z12. The load capacitor C502 has one end connected to the node N507 and the other end connected to the ground voltage terminal VSS.

The capacitance values of the load capacitors C101 and C102 are designed such that, when the SRAM 500 incorporates a plurality of sense amplifier circuits, the maximum value of the offset voltage of the plurality of sense amplifier circuits is reduced to 50% by the weight setting operation, for example. Such a capacitance value is just an example, and it is not limited to 50%. The capacitance values of the load capacitors C501 and C502 are half the capacitance values of the load capacitors C101 and C102, for example. The capacitance values of the load capacitors C501 and C502 are just an example, and they are not particularly limited.

Figure 26:
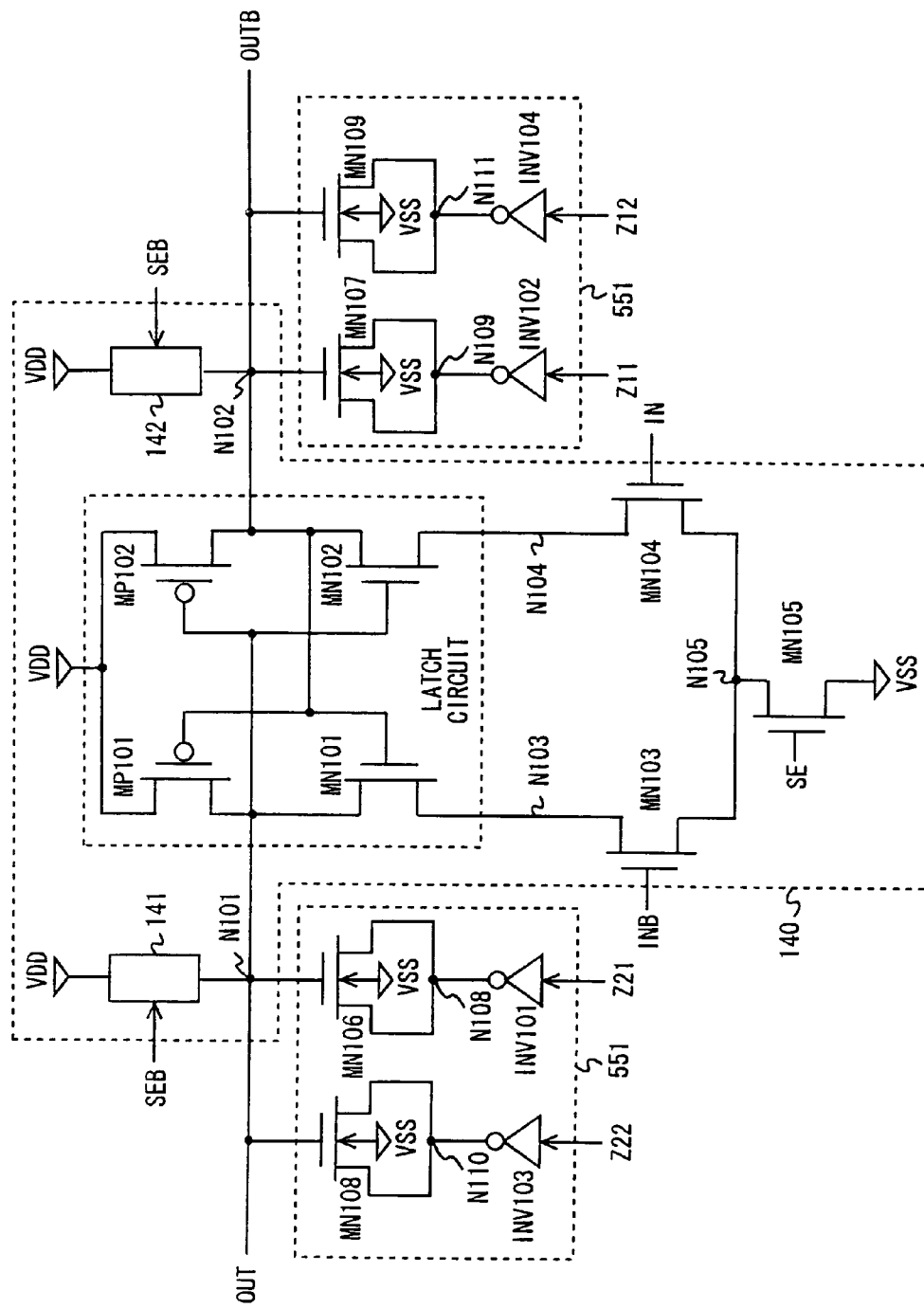
FIG. 26 shows a second configuration of the sense amplifier circuit and the offset voltage adjustment circuit according to the fifth exemplary embodiment.

FIG. 26 shows the sense amplifier circuit 140 shown in FIG. 25 and an offset voltage adjustment circuit 551, which is an alternative element of the offset voltage adjustment circuit 550. The sense amplifier circuit 140 has the same configuration as that of FIG. 2 and a detailed explanation thereof is omitted. The offset voltage adjustment circuit 551 includes NMOS transistors MN106 and MN109, and inverters INV101 and INV104.

The weight control signal Z21 is input to an input terminal of the inverter INV101. An output terminal of the inverter INV101 is connected to a node N108. The weight control signal Z11 is input to an input terminal of the inverter INV102. An output terminal of the inverter INV102 is connected to a node N109. The weight control signal Z22 is input to an input terminal of the inverter INV103. An output terminal of the inverter INV103 is connected to a node N110. The weight control signal Z12 is input to an input terminal of the inverter INV104. An output terminal of the inverter INV104 is connected to a node N111.

The NMOS transistor MN106 has a source and a drain connected to the node N108 and a gate connected to the node N101. As the substrate potential of the NMOS transistor MN106, the ground voltage VSS is applied from the ground voltage terminal VSS. The NMOS transistor MN107 has a source and a drain connected to the node N109 and a gate connected to the node N102. As the substrate potential of the NMOS transistor MN107, the ground voltage VSS is applied from the ground voltage terminal VSS. The NMOS transistor MN108 has a source and a drain connected to the node N110 and a gate connected to the node N101. As the substrate potential of the NMOS transistor MN108, the ground voltage VSS is applied from the ground voltage terminal VSS. The NMOS transistor MN109 has a source and a drain connected to the node N111 and a gate connected to the node N102. As the substrate potential of the NMOS transistor MN109, the ground voltage VSS is applied from the ground voltage terminal VSS.

The offset voltage adjustment circuit 551 uses the gate capacitors of the NMOS transistors MN106 to MN109 as alternatives of the load capacitors C101, C102, C501 and C502 of the offset voltage adjustment circuit 550 in FIG. 25.

The use of such a configuration eliminates the need for the switch circuits SW151 and SW152, SW551 and SW552 compared to the configuration of the offset voltage adjustment circuit 550 shown in FIG. 25. Thus, the offset voltage adjustment circuit 551 has an advantage that it has a smaller circuit area than the offset voltage adjustment circuit 550.

Further, the gate areas of the NMOS transistors MN106 and MN107 are designed such that, when the SRAM 500 incorporates a plurality of sense amplifier circuits, the maximum value of the offset voltage of the plurality of sense amplifier circuits is reduced to 50% by the weight setting operation, for example. This size is just an example, and it is not limited to 50%. Further, the gate areas of the NMOS transistors MN108 and MN109 are half the gate areas of the NMOS transistors MN106 and MN107. The gate areas of the NMOS transistors MN108 and MN109 are just an example, and they are not particularly limited thereto.

Figure 27:
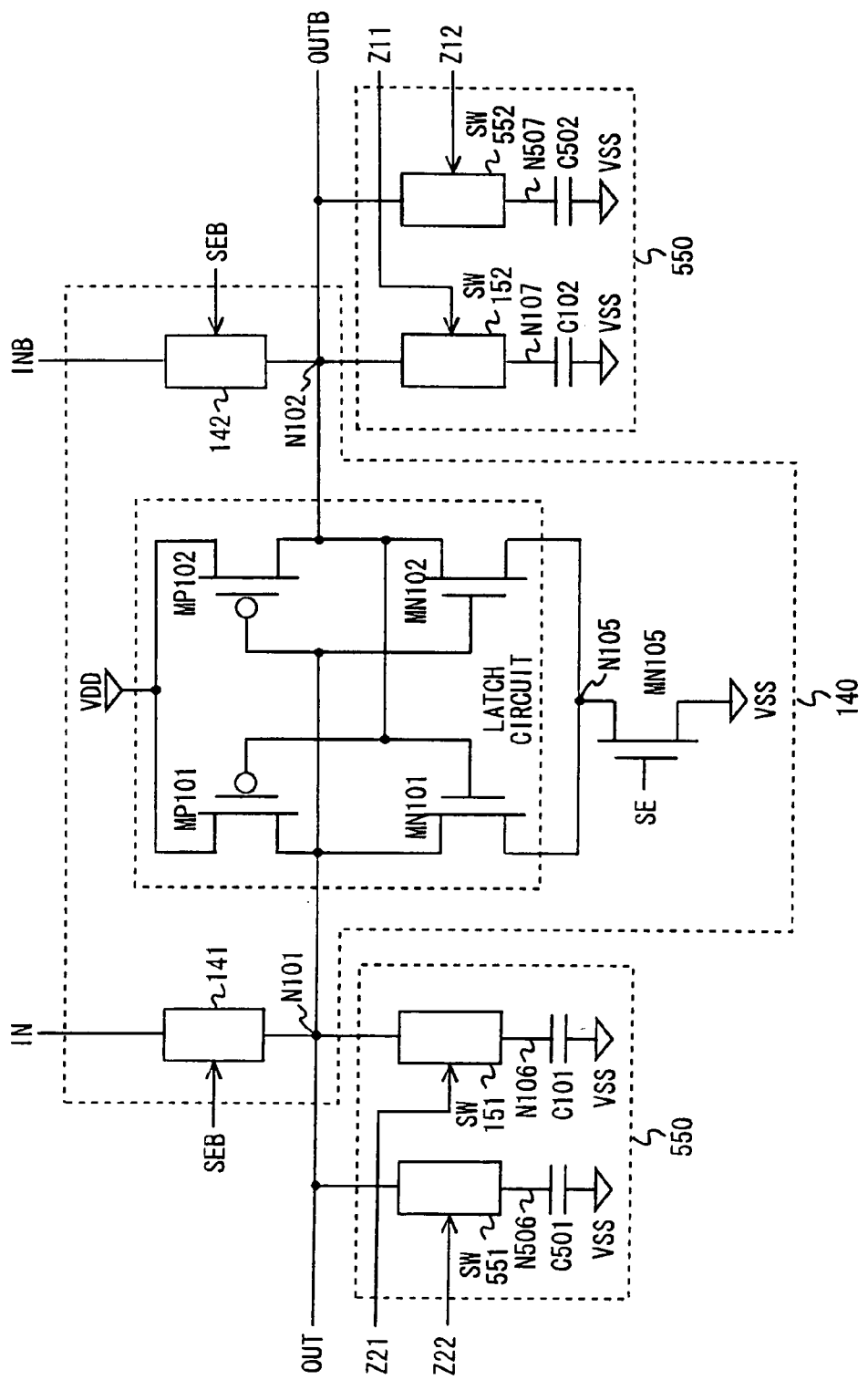
FIG. 27 shows a third configuration of the sense amplifier circuit and the offset voltage adjustment circuit according to the fifth exemplary embodiment.

FIG. 27 shows the connection and detailed configuration of the sense amplifier circuit 140 of a different variation from that of FIG. 25 and the offset voltage adjustment circuit 550. The configuration of the sense amplifier circuit 140 is the same as that of FIG. 4, and a detailed explanation thereof is omitted. Further, the configuration of the offset voltage adjustment circuit 550 is the same as that of FIG. 25, and a detailed explanation thereof is omitted.

Figure 28:
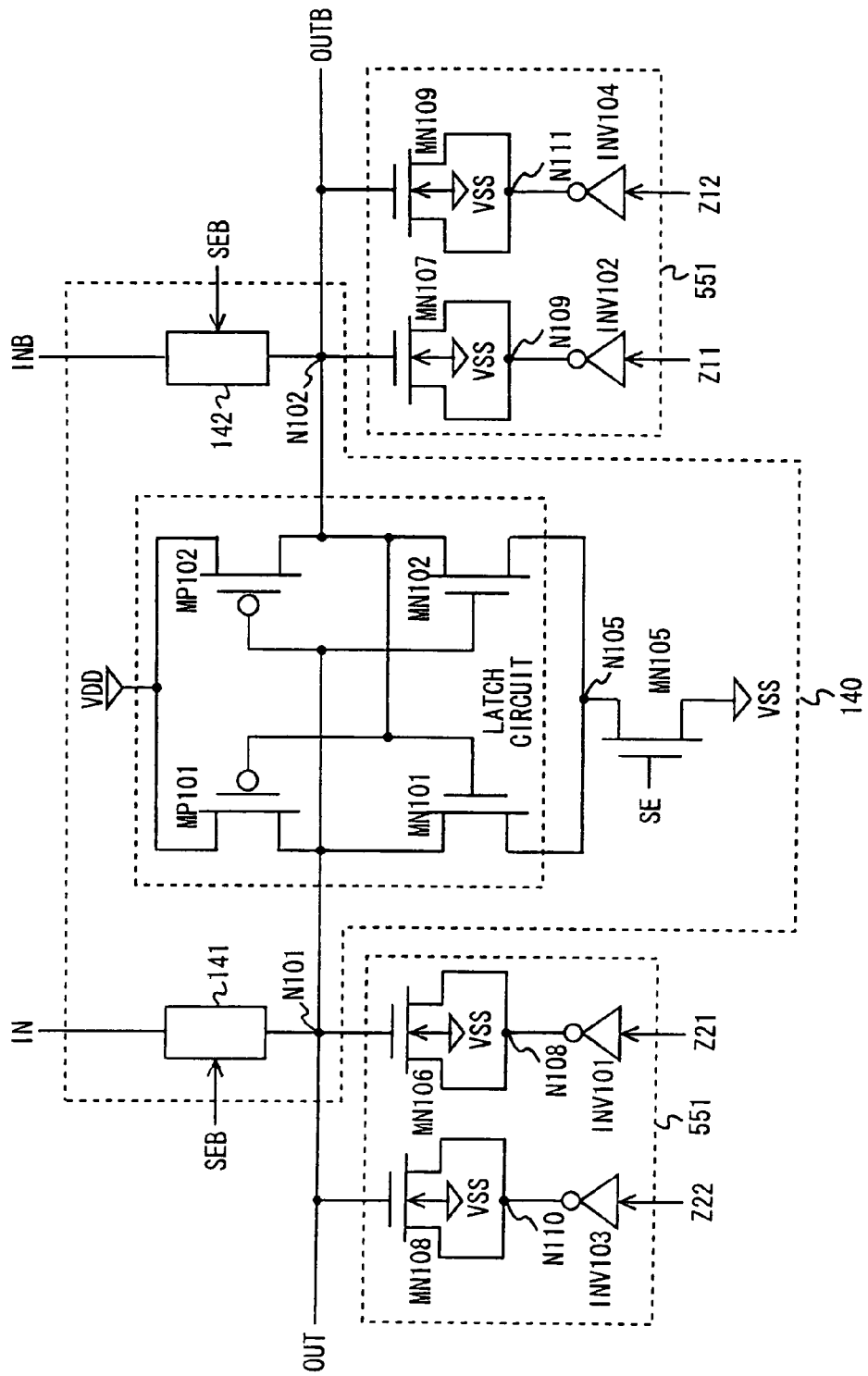
FIG. 28 shows a fourth configuration of the sense amplifier circuit and the offset voltage adjustment circuit according to the fifth exemplary embodiment.

FIG. 28 shows the sense amplifier circuit 140 shown in FIG. 27 and an offset voltage adjustment circuit 551, which is an alternative element of the offset voltage adjustment circuit 550. The sense amplifier circuit 140 has the same configuration as that of FIG. 4, and a detailed explanation thereof is omitted. Further, the configuration of the offset voltage adjustment circuit 551 is the same as that of FIG. 26, and a detailed explanation thereof is omitted.

Figure 29:
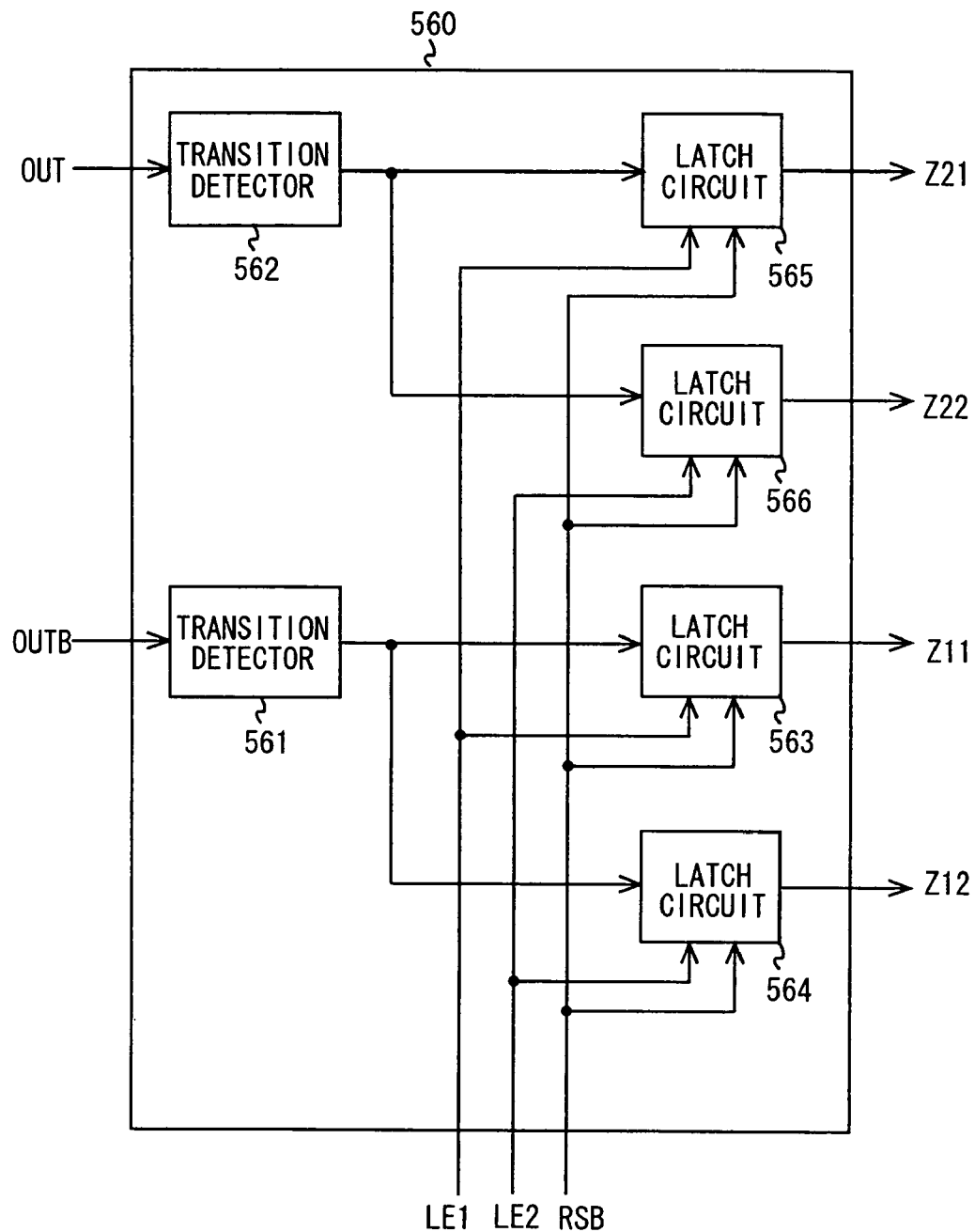
FIG. 29 shows a configuration of a weight control circuit according to the fifth exemplary embodiment.

FIG. 29 shows a configuration of the weight control circuit 560. Referring to FIG. 29, the weight control circuit 560 includes transition detectors 561 and 562 and latch circuits 563 to 566. The transition detectors 561 and 562 are connected to the output terminals OUT and OUTB, respectively. The latch circuits 563 and 564 are connected to the transition detector 561. The latch circuits 565 and 566 are connected to the transition detector 562. A weight control activation signal LE1 and a reset signal RSB are input to the latch circuits 563 and 565. A weight control activation signal LE2 and the reset signal RSB are input to the latch circuits 564 and 566. The latch circuits 563, 564, 565 and 566 output the weight control signals Z11, Z12, Z21 and Z22, respectively.

Figure 30:
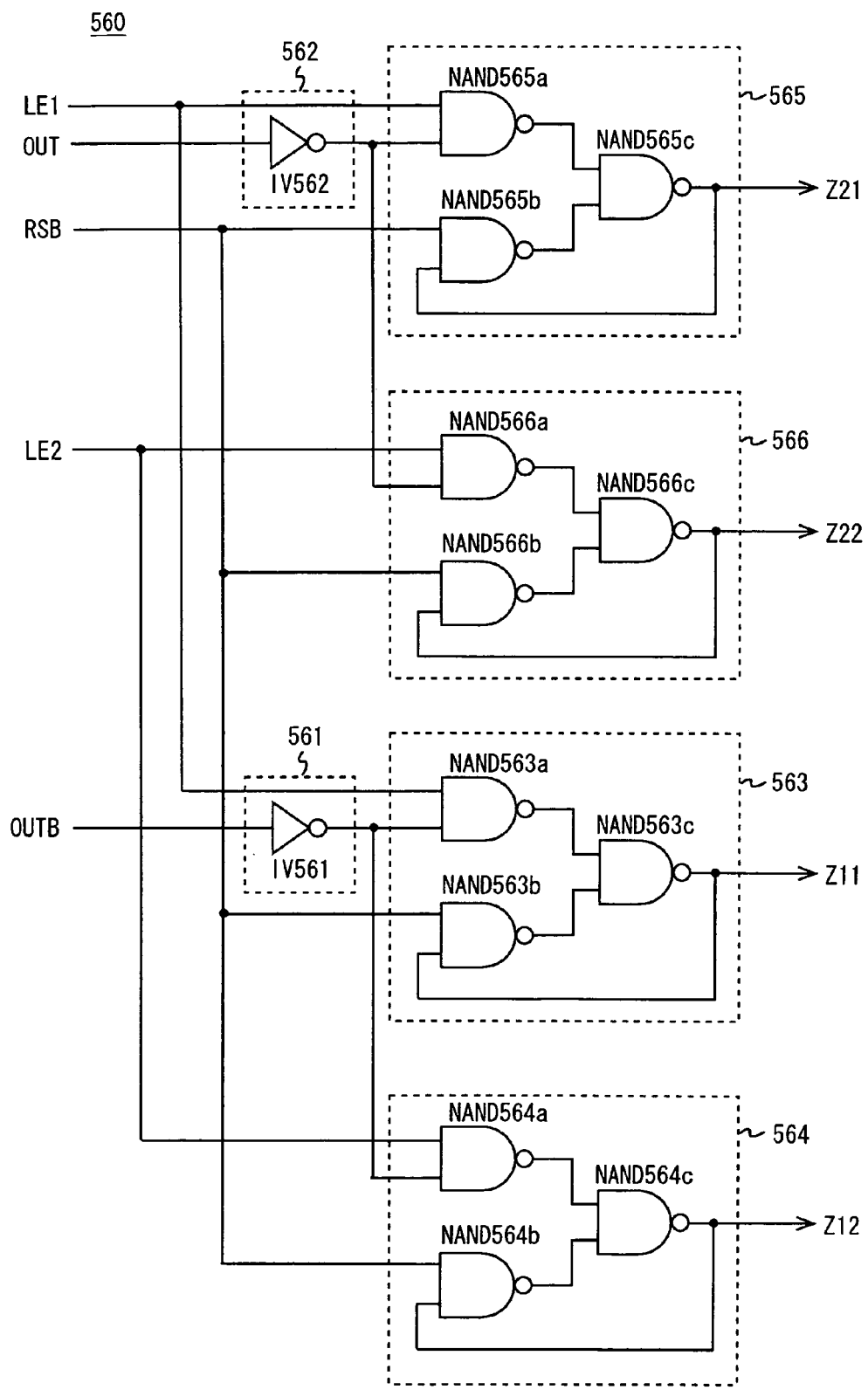
FIG. 30 shows a detailed configuration of the weight control circuit according to the fifth exemplary embodiment.

FIG. 30 shows a detailed configuration of the weight control circuit 560. Referring to FIG. 30, the transition detectors 561 and 562 include inverters IV561 and IV562, respectively. The logic threshold values of the inverters IV561 and IV562 are set lower than usual. The logic threshold values of the inverters IV561 and IV562 are set to about 40% of the power supply voltage VDD, for example.

The latch circuit 563 includes NAND circuits NAND563a, NAND563b and NAND563c.

The control activation signal LE1 is input to one input terminal of the NAND circuit NAND563a, and an output signal of the inverter IV561 is input to the other input terminal of the NAND circuit NAND563a. The NAND circuit NAND563a outputs an output signal to one input terminal of the NAND circuit NAND563c.

The reset signal RSB is input to one input terminal of the NAND circuit NAND563b, and an output signal of the NAND circuit NAND563c is input to the other input terminal of the NAND circuit NAND563b. The NAND circuit NAND563b outputs an output signal to the other input terminal of the NAND circuit NAND563c.

The output signal of the NAND circuit NAND563a is input to one input terminal of the NAND circuit NAND563c, and the output signal of the NAND circuit NAND563b is input to the other input terminal of the NAND circuit NAND563c. The NAND circuit NAND563c outputs the weight control signal Z11 as an output signal.

The latch circuit 564 includes NAND circuits NAND564a, NAND564b and NAND564c.

The control activation signal LE2 is input to one input terminal of the NAND circuit NAND564a, and an output signal of the inverter IV561 is input to the other input terminal of the NAND circuit NAND564a. The NAND circuit NAND564a outputs an output signal to one input terminal of the NAND circuit NAND564c.

The reset signal RSB is input to one input terminal of the NAND circuit NAND564b, and an output signal of the NAND circuit NAND564c is input to the other input terminal of the NAND circuit NAND564b. The NAND circuit NAND564b outputs an output signal to the other input terminal of the NAND circuit NAND564c.

The output signal of the NAND circuit NAND564a is input to one input terminal of the NAND circuit NAND564c, and the output signal of the NAND circuit NAND564b is input to the other input terminal of the NAND circuit NAND564c. The NAND circuit NAND564c outputs the weight control signal Z12 as an output signal.

The latch circuit 565 includes NAND circuits NAND565a, NAND565b and NAND565c.

The control activation signal LE1 is input to one input terminal of the NAND circuit NAND565a, and an output signal of the inverter IV562 is input to the other input terminal of the NAND circuit NAND565a. The NAND circuit NAND565a outputs an output signal to one input terminal of the NAND circuit NAND565c.

The reset signal RSB is input to one input terminal of the NAND circuit NAND565b, and an output signal of the NAND circuit NAND565c is input to the other input terminal of the NAND circuit NAND565b. The NAND circuit NAND565b outputs an output signal to the other input terminal of the NAND circuit NAND565c.

The output signal of the NAND circuit NAND565a is input to one input terminal of the NAND circuit NAND565c, and the output signal of the NAND circuit NAND565b is input to the other input terminal of the NAND circuit NAND565c. The NAND circuit NAND565c outputs the weight control signal Z21 as an output signal.

The latch circuit 566 includes NAND circuits NAND566a, NAND566b and NAND566c.

The control activation signal LE2 is input to one input terminal of the NAND circuit NAND566a, and an output signal of the inverter IV562 is input to the other input terminal of the NAND circuit NAND566a. The NAND circuit NAND566a outputs an output signal to one input terminal of the NAND circuit NAND566c.

The reset signal RSB is input to one input terminal of the NAND circuit NAND566b, and an output signal of the NAND circuit NAND566c is input to the other input terminal of the NAND circuit NAND566b. The NAND circuit NAND566b outputs an output signal to the other input terminal of the NAND circuit NAND566c.

The output signal of the NAND circuit NAND566a is input to one input terminal of the NAND circuit NAND566c, and the output signal of the NAND circuit NAND566b is input to the other input terminal of the NAND circuit NAND566c. The NAND circuit NAND566c outputs the weight control signal Z22 as an output signal.

The weight control circuit 560 having such a configuration performs a logical operation according to the truth table shown in FIG. 31. First, when the value of the reset signal RSB is "0" (Low level), the values of the weight control activation signals LE1 and LE2 are "0", and the values of the output data OUT and OUTB are both "1", the values of the weight control signals Z11, Z12, Z21 and Z22 are all "0". This is referred to hereinafter as the reset operation of the latch circuits. Further, when the value of the reset signal RSB is "0", combinations of the other values of the weight control activation signals LE1 and LE2 and the output data OUT and OUTB are all inhibit input.

When the value of the reset signal RSB is "1" (High level) and the value of the weight control activation signal LE1 is "1" and the value of LE2 is "0", the weight control signals Z11, Z12, Z21 and Z22 shown in FIG. 31 are output according to the values of the output data OUT and OUTB. For example, when the values of the output data OUT and OUTB are "0" and "1", respectively, the values of the weight control signals Z11 and Z21 are "1" and "0", respectively. Further, when the values of the output data OUT and OUTB are "1" and "0", respectively, the values of the weight control signals Z11 and Z21 are "0" and "1", respectively. At the same time, the values of the weight control signals Z11 and Z21 are stored in the latch circuits 563 and 565, respectively. This is referred to hereinafter as the latch operation of the latch circuits.

When the value of the reset signal RSB is "1" (High level) and the value of the weight control activation signal LE1 is "0" and the value of LE2 is "1", the weight control signals Z12 and Z22 shown in FIG. 31 are output according to the values of the output data OUT and OUTB. For example, when the values of the output data OUT and OUTB are "0" and "1", respectively, the values of the weight control signals Z12 and Z22 are "1" and "0", respectively. Further, when the values of the output data OUT and OUTB are "1" and "0", respectively, the values of the weight control signals Z12 and Z22 are "0" and "1", respectively. At the same time, the values of the weight control signals Z12 and Z22 are stored in the latch circuits 564 and 566, respectively. This is also referred to hereinafter as the latch operation of the latch circuits.

When the value of the reset signal RSB is "1" (High level) and the values of the weight control activation signals LE1 and LE2 are "0", the latch circuits 563 to 566 hold the current values of the weight control signals Z11, Z12, Z21 and Z22 regardless of the values of the output data OUT and OUTB.

Figure 32:
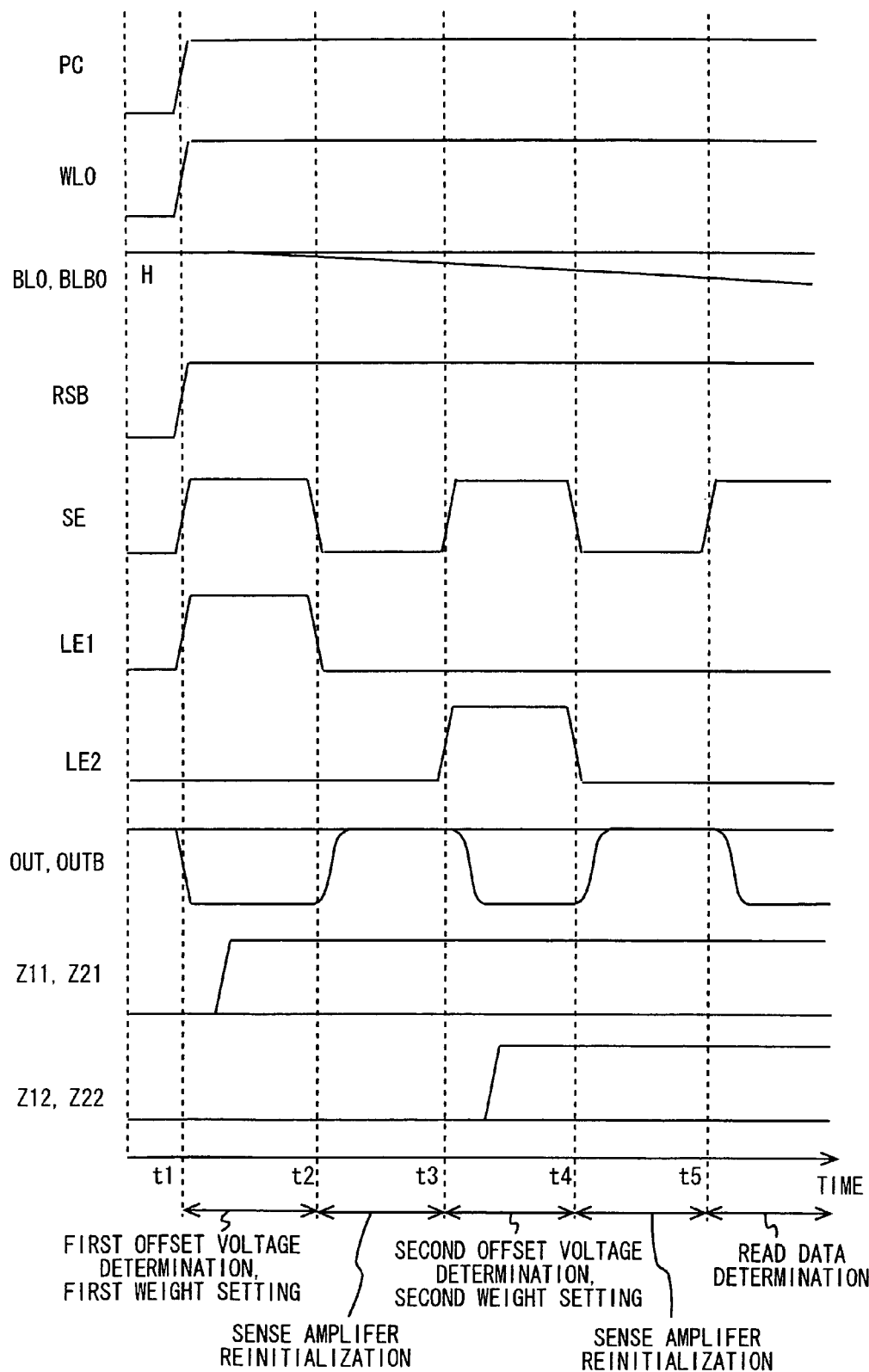
FIG. 32 shows a timing chart to describe the operation of SRAM according to the fifth exemplary embodiment.

FIG. 32 shows an operational timing chart of the SRAM 500 described above. The operation of the SRAM 500 is described hereinafter with reference to the operational timing chart shown in FIG. 32. Note that data of the SRAM cell CELL that is connected to the word line WL0 and the bit line pair BL0 and BLB0 is read in this example. Specifically, the word line WL0 is selected out of the word lines WL0 to WLm−1, and the column selector 130 selects the bit line pair BL0 and BLB0 according to the column selection signal YS[n−1:0]. The configuration of the offset voltage adjustment circuit 550 and the sense amplifier circuit 140 is the same as that of FIG. 25. Further, in the period when the precharge signal PC is Low level, the sense amplifier input terminal pair IN and INB conducted and selected by the column selector 130 is pre-charged to the power supply voltage VDD together with the bit lines.

Referring to FIG. 32, before time t1, the bit line pair BL0 and BLB0 is pre-charged to the power supply voltage VDD by the precharge circuit PCU0. At time t1, the word-line signal WL0 is activated. According to the data stored in the selected SRAM cell CELL, one potential of the bit line pair BL0 and BLB0 starts dropping gradually. Further, in response to the column selection signal YS[n−1:0], the column selector 130 selects the bit line pair BL0 and BLB0. Therefore, the input terminal pair of the sense amplifier circuit 140 and the bit line pair BL0 and BLB0 are connected.

On the other hand, before time t1, the value of the reset signal RSB is set to "0". The reset operation is thereby performed in the latch circuits 563 to 566 constituting the weight control circuit 560, and the values of the weight control signals Z11, Z12, Z21 and Z22 all both reset to "0".

At the same time as when the word-line signal is activated at time t1, the reset signal RSB and the sense amplifier activation signal SE rise. The sense amplifier activation signal SE thereby becomes High level, and the sense amplifier circuit 140 is activated. Thus, "0" or "1" is output as the output data OUT according to the polarity of the offset voltage of the sense amplifier circuit 140. Note that the inverted signal of the output data OUT is output as the output data OUTB. The operation is referred to hereinafter as the first offset voltage determination operation.

Further, at the same time as when the sense amplifier circuit 140 is activated, the weight control activation signal LE1 rises. The latch operation is thereby performed in the latch circuits 563 and 565 constituting the weight control circuit 560. Thus, the output data OUT and OUTB are stored in the latch circuits 563 and 565, and the weight control signals Z11 and Z12 are output. The logical operation is performed according to the truth table shown in FIG. 31 described above. However, because the weight control activation signal LE2 remains Low level, it corresponds to (LE1, LE2)=(1, 0) in the truth table shown in FIG. 31.

For example, when the values of the output data OUT and OUTB are "1" and "0", respectively, the weight control signals Z11 and Z21 are (Z11, Z21)=(0, 1). Note that the weight control signals Z12 and Z22 are (Z12, Z22)=(0, 0) at this time. Thus, the switch circuit SW151 driven by the weight control signal Z21 becomes continuous, and the node N101 and the load capacitor C101 are thereby electrically connected. Consequently, the drive capability on the output terminal OUT side (the node N101 side) of the sense amplifier circuit 140 decreases, and the weight setting×(−1) is made. The effective offset voltage of the sense amplifier circuit 140 is thereby reduced compared to the original offset voltage.

On the other hand, when the values of the output data OUT and OUTB are "0" and "1", respectively, the weight control signals Z11 and Z21 are (Z11, Z21)=(1, 0). Thus, the switch circuit SW152 driven by the weight control signal Z11 becomes continuous, and the node N102 and the load capacitor C102 are thereby electrically connected. Consequently, the drive capability on the output terminal OUTB side (the node N102 side) of the sense amplifier circuit 140 decreases, and the weight setting×1 is made. The effective offset voltage of the sense amplifier circuit 140 is thereby reduced compared to the original offset voltage. The operation from the time t1 to t2 is referred to hereinafter as the first offset voltage determination and weight setting operation.

The operation when using the offset voltage adjustment circuit 551 in place of the offset voltage adjustment circuit 550 is the same. The operation after the time t1 in the case of using the offset voltage adjustment circuit 551 is described hereinbelow.

At time t1, at the same time as the activation of the sense amplifier circuit 140, the weight control activation signal LE1 rises. The latch operation is thereby performed in the latch circuits 563 and 565 constituting the weight control circuit 560. Thus, the output data OUT and OUTB are stored in the latch circuits 563 and 565, and the weight control signals Z11 and Z21 are output. The logical operation is performed according to the truth table shown in FIG. 31. However, because the weight control activation signal LE2 remains Low level, it corresponds to (LE1, LE2)=(1, 0) in the truth table shown in FIG. 31.

For example, when the values of the output data OUT and OUTB are "1"and "0", respectively, the weight control signals Z11 and Z21 are (Z11, Z21)=(0, 1). Note that the weight control signals Z12 and Z22 are (Z12, Z22)=(0, 0) at this time. Thus, the inverter INV101 to which the weight control signal Z21 is input outputs the inverted signal "0". By the output signal of the inverter INV101, the drain and source potentials of the NMOS transistor MN106 are controlled. When the inverter INV101 outputs "0", the NMOS transistor MN106 turns on. This is equivalent to the state where the gate capacitor of the NMOS transistor MN106 is connected to the output terminal of the sense amplifier circuit 140. Consequently, the drive capability on the output terminal OUT side (the node N101 side) of the sense amplifier circuit 140 decreases. The effective offset voltage of the sense amplifier circuit 140 is thereby reduced compared to the original offset voltage.

On the other hand, when the values of the output data OUT and OUTB are "0" and "1", respectively, the weight control signals Z11 and Z21 are (Z11, Z12)=(1, 0). Thus, the inverter INV102 to which the weight control signal Z11 is input outputs the inverted signal "0". By the output signal of the inverter INV102, the drain and source potentials of the NMOS transistor MN107 are controlled. When the inverter INV102 outputs "0", the NMOS transistor MN107 turns on. This is equivalent to the state where the gate capacitor of the NMOS transistor MN107 is connected to the output terminal of the sense amplifier circuit 140. Consequently, the drive capability on the output terminal OUTB side (the node N102 side) of the sense amplifier circuit 140 decreases. The effective offset voltage of the sense amplifier circuit 140 is thereby reduced compared to the original offset voltage.

In this manner, the connection between the load capacitors C101 and C102 or the NMOS transistors MN106 and MN107 and the nodes N101 and N102 is switched so as to reduce the offset voltage of the sense amplifier circuit 140 by the weight control signals Z11 and Z21 of the weight control circuit 560. This operation is the weight setting operation in the fifth exemplary embodiment. The operation from the time t1 to t2 is referred to hereinafter as the first offset voltage determination and weight setting operation.

The operation after the time t3 in the case of using the offset voltage adjustment circuit 550 is described hereinbelow. At time t3, the sense amplifier activation signal SE rises again, and the sense amplifier circuit 140 is activated. Thus, "0" or "1" is output as the output data OUT according to the polarity of the offset voltage of the sense amplifier circuit 140 that reflects the first weight setting operation. Note that the inverted signal of the output data OUT is output as the output data OUTB. The operation is referred to hereinafter as the second offset voltage determination operation.

Further, at time t3, at the same time as the activation of the sense amplifier circuit 140, the weight control activation signal LE2 rises. The weight control circuit 560 thereby operates and performs the logical operation according to the truth table shown in FIG. 31 described above. Note that, because the weight control activation signal LE1 remains Low level, it corresponds to (LE1, LE2)=(0, 1) in the truth table shown in FIG. 31. At this time, the values in the first weight setting operation are held as the values of the weight control signals Z11 and Z21 as shown in FIG. 31.

For example, when the values of the output data OUT and OUTB are "1" and "0", respectively, the weight control signals Z12 and Z22 are (Z12, Z22)=(0, 1). Thus, the switch circuit SW551 driven by the weight control signal Z22 becomes continuous, and the node N101 and the load capacitor C501 are thereby electrically connected. Consequently, the drive capability on the output terminal OUT side (the node N101 side) of the sense amplifier circuit 140 decreases. However, because the capacitance value of the load capacitor C501 is half the capacitance value of the load capacitor C101, the decrease in drive capability is about half that in the first weight setting operation.

Hereinafter, the decrease in the drive capability on the output terminal OUT side (the node N101 side) is referred to as "weight setting×(−½)" where necessary. The effective offset voltage of the sense amplifier circuit 140 is thereby reduced compared to the offset voltage after the first weight setting operation.

On the other hand, when the values of the output data OUT and OUTB are "0" and "1", respectively, the weight control signals Z12 and Z22 are (Z12, Z22)=(1, 0). Thus, the switch circuit SW552 driven by the weight control signal Z12 becomes continuous, and the node N102 and the load capacitor C502 are thereby electrically connected. Consequently, the drive capability on the output terminal OUTB side (the node N102 side) of the sense amplifier circuit 140 decreases. However, because the capacitance value of the load capacitor C502 is half the capacitance value of the load capacitor C102, the decrease in drive capability is about half that in the first weight setting operation.

Hereinafter, the decrease in the drive capability on the output terminal OUTB side (the node N102 side) is referred to as "weight setting×½" where necessary. The effective offset voltage of the sense amplifier circuit 140 is thereby reduced compared to the offset voltage after the first weight setting operation. The operation from the time t3 to t4 is referred to hereinafter as the second offset voltage determination and weight setting operation.

The operation when using the offset voltage adjustment circuit 551 in place of the offset voltage adjustment circuit 550 is the same. The operation after the time t3 in the case of using the offset voltage adjustment circuit 551 is described hereinbelow. At time t3, at the same time as the activation of the sense amplifier circuit 140, the weight control activation signal LE2 rises. The weight control circuit 560 thereby operates and performs the logical operation according to the truth table shown in FIG. 31. However, because the weight control activation signal LE1 remains Low level in this time, it corresponds to (LE1, LE2)=(0, 1) in the truth table shown in FIG. 31. At this time, the values in the first weight setting operation are held as the values of the weight control signals Z11 and Z21 as shown in FIG. 31.

For example, when the values of the output data OUT and OUTB are "1" and "0", respectively, the weight control signals Z12 and Z22 are (Z12, Z22)=(0, 1). Thus, the inverter INV103 to which the weight control signal Z22 is input outputs the inverted signal "0". By the output signal of the inverter INV103, the drain and source potentials of the NMOS transistor MN108 are controlled. When the inverter INV103 outputs "0", the NMOS transistor MN108 turns on.

This is equivalent to the state where the gate capacitor of the NMOS transistor MN108 is connected to the output terminal of the sense amplifier circuit 140. Consequently, the drive capability on the output terminal OUT side (the node N101 side) of the sense amplifier circuit 140 decreases. However, because the gate area of the NMOS transistor MN108 is half that of the NMOS transistor MN106, the decrease in drive capability is about half that in the first weight setting operation. The effective offset voltage of the sense amplifier circuit 140 is thereby reduced compared to the original offset voltage.

On the other hand, when the values of the output data OUT and OUTB are "0" and "1", respectively, the weight control signals Z12 and Z22 are (Z12, Z22)=(1, 0). Thus, the inverter INV104 to which the weight control signal Z12 is input outputs the inverted signal "0". By the output signal of the inverter INV104, the drain and source potentials of the NMOS transistor MN109 are controlled. When the inverter INV104 outputs "0", the NMOS transistor MN109 turns on. This is equivalent to the state where the gate capacitor of the NMOS transistor MN109 is connected to the output terminal of the sense amplifier circuit 140. Consequently, the drive capability on the output terminal OUTB side (the node N102 side) of the sense amplifier circuit 140 decreases. The effective offset voltage of the sense amplifier circuit 140 is thereby reduced compared to the original offset voltage. However, because the gate area of the NMOS transistor MN109 is half that of the NMOS transistor MN107, the decrease in drive capability is also about half that in the first weight setting operation. The operation from the time t3 to t4 is referred to hereinafter as the second offset voltage determination and weight setting operation.

After completion of the second offset voltage determination and the second weight setting operation described above, the process proceeds to the determination operation of actual read data from the selected SRAM cell CELL. Specifically, when the sense amplifier activation signal SE rises at time t5, the read data corresponding to the data stored in the selected SRAM cell CELL appears at the output of the sense amplifier circuit 140.

Figure 33:
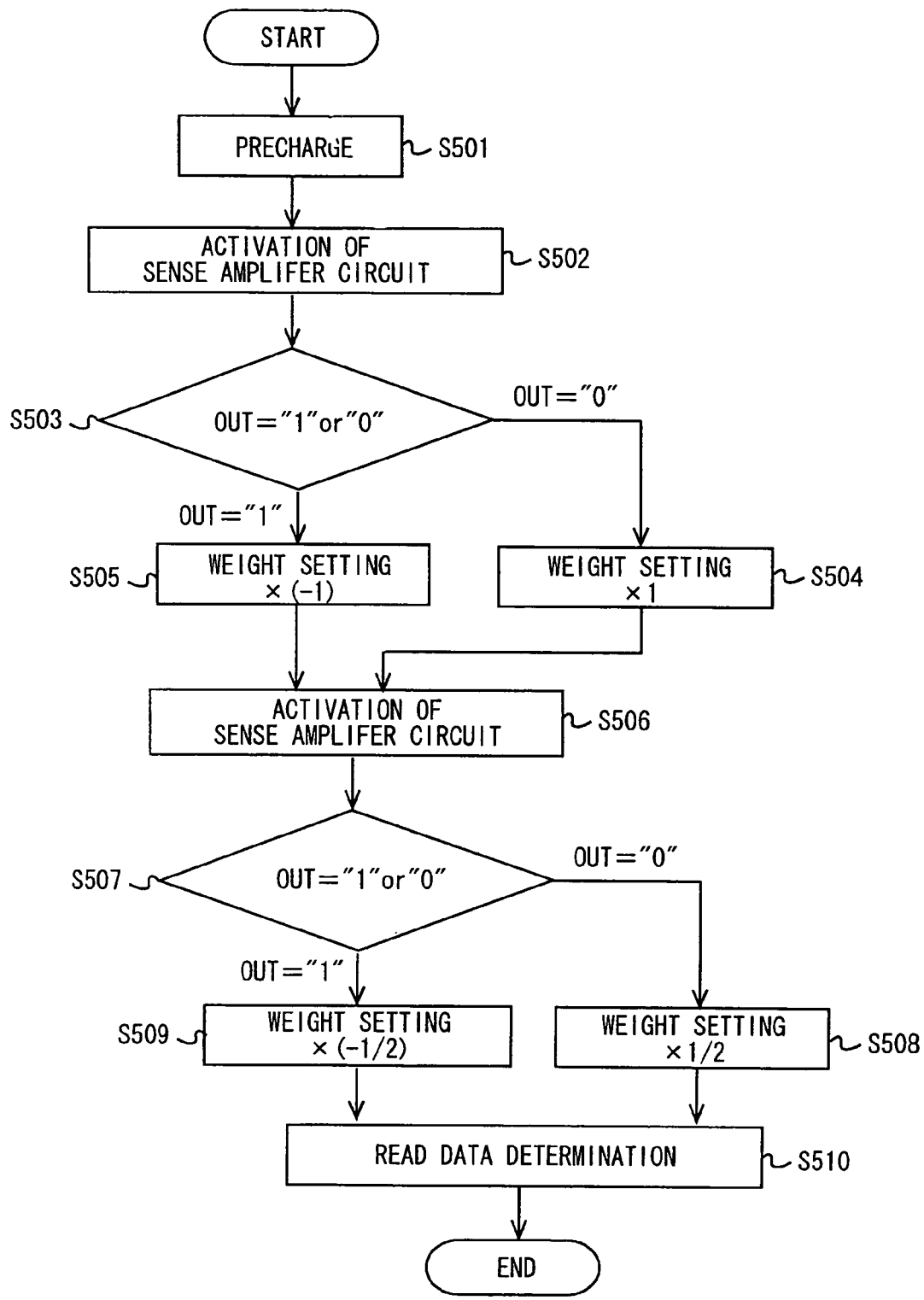
FIG. 33 is a flowchart to describe the operation of SRAM according to the fifth exemplary embodiment.

FIG. 33 is a flowchart showing the first and second offset voltage determination operations and the first and second weight setting operations according to the fifth exemplary embodiment. Referring to FIG. 33, the bit line pairs BL0 and BLB0 to BLn-1 and BLBn-1 are pre-charged to the power supply voltage VDD by the precharge circuits PCU0 to PCUn-1 (S501).

Next, the sense amplifier circuit 140 is activated to make the first offset voltage determination (S502).

Then, the weight control circuit 560 determines whether the value of the output data OUT is "1" or "0" as the first offset voltage determination (S503). When the value of the output data OUT is "1", the weight control signals Z11 and Z21 are (Z11, Z21)=(0, 1), and the weight setting×(−1) is made in the offset voltage adjustment circuit 550 (S504). When the value of the output data OUT is "0", the weight control signals Z11 and Z21 are (Z11, Z21)=(1, 0), and the weight setting×1 is made in the offset voltage adjustment circuit 550 (S505).

After that, the sense amplifier circuit 140 is activated to make the second offset voltage determination (S506).

Then, the weight control circuit 560 determines whether the value of the output data OUT is "1" or "0" as the second offset voltage determination (S507). When the value of the output data OUT is "0", the weight control signals Z12 and Z22 are (Z12, Z22)=(0, 1), and the weight setting×(−½) is made in the offset voltage adjustment circuit 550 (S508). When the value of the output data OUT is "0", the weight control signals Z12 and Z22 are (Z12, Z22)=(1, 0), and the weight setting×½ is made in the offset voltage adjustment circuit 550 (S509).

After that, the determination about read data from the selected SRAM cell CELL is performed (S510).

Figure 34:
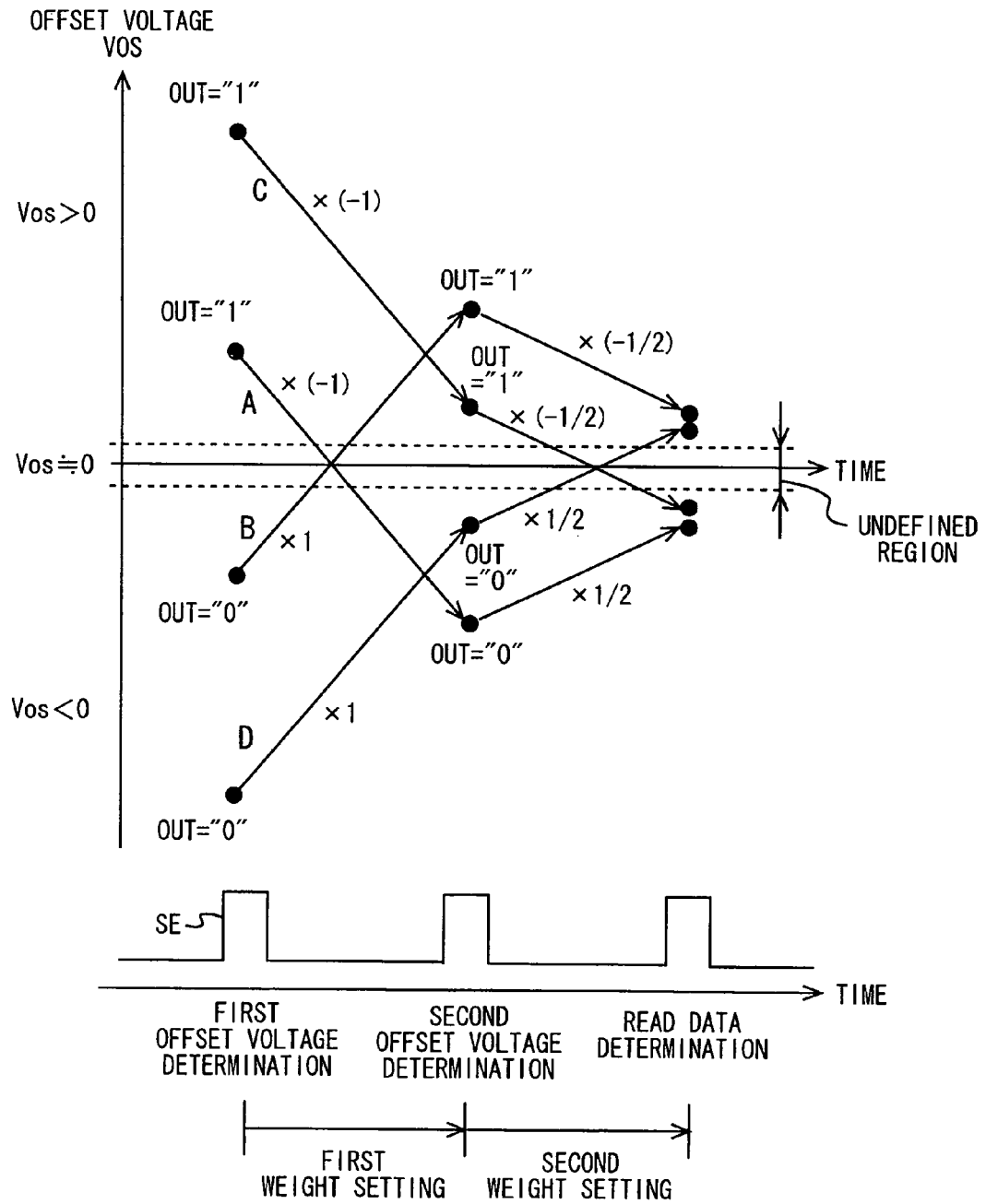
FIG. 34 is a schematic view to describe the effect of SRAM according to the fifth exemplary embodiment.

FIG. 34 is a schematic view to describe the offset voltage reduction effect according to the fifth exemplary embodiment described above. In FIG. 34, like in FIG. 9, "Vos" indicates the offset voltage of the sense amplifier circuit 140, and when Vos>0, the output terminal OUT has a larger offset voltage than the output terminal OUTB. On the contrary, when Vos<0, the output terminal OUT has a smaller offset voltage than the output terminal OUTB.

Consider first the case where Vos>0 (the output terminal OUT has a larger offset voltage than the output terminal OUTB) and the output data OUT is "1" at the time of the offset voltage determination, which is the pattern A in FIG. 34. In this case, the weight setting×(−1) is made by the first weight setting operation. The drive capability on the output terminal OUT side of the sense amplifier circuit 140 thereby decreases.

However, the output data OUT is "0" at the time of the second offset voltage determination, and the polarity of the offset voltage is inverted. This means that the drive capability on the output terminal OUT side of the sense amplifier circuit 140 decreases excessively by the above-described weight setting×(−1). Therefore, the weight setting×½ is made by the second weight setting operation. The drive capability on the output terminal OUTB side of the sense amplifier circuit 140 thereby decreases. As a result of the first and second weight setting operations, the effective offset voltage of the sense amplifier circuit 140 decreases. Then, at the time of the read data determination, the sense amplifier circuit 140 operates with the effectively reduced offset voltage.

Consider next the case where Vos<0 (the output terminal OUT has a smaller offset voltage than the output terminal OUTB) and the output data OUT is "0" at the time of the offset voltage determination, which is the pattern B in FIG. 34. In this case, the weight setting×1 is made by the first weight setting operation. The drive capability on the output terminal OUTB side of the sense amplifier circuit 140 thereby decreases.

However, the output data OUT is "1" at the time of the second offset voltage determination, and the polarity of the offset voltage is inverted. This means that the drive capability on the output terminal OUTB side of the sense amplifier circuit 140 decreases excessively by the above-described weight setting×1. Therefore, the weight setting×(−½) is made by the second weight setting operation. The drive capability on the output terminal OUTB side of the sense amplifier circuit 140 thereby decreases. As a result of the first and second weight setting operations, the effective offset voltage of the sense amplifier circuit 140 decreases. Then, at the time of the read data determination, the sense amplifier circuit 140 operates with the effectively reduced offset voltage.

Note that there are cases where the polarity of the offset voltage is not inverted by the first weight setting operation as shown in the pattern C or D in FIG. 34. In this case, there is a possibility that the polarity of the offset voltage is inverted by the second weight setting operation as in the pattern C or D. However, even in such a case, because a decrease in the drivabilities of the output terminals OUT and OUTB is moderate with the weight setting×½ or ×(−½) compared to the weight setting×1 or ×(−1), there is a small possibility that the effective offset voltage of the sense amplifier circuit 140 deteriorates. Further, by adjusting the capacitance values of the load capacitors C501 and C502 to appropriate values, it is possible to adjust the decrease in the drivabilities of the output terminals OUT and OUTB by the second weight setting operation to an appropriate level.

As described above, in the fifth exemplary embodiment, by performing the offset voltage determination and the weight change operation twice, it is possible to further reduce the offset voltage compared to the case of performing the operation once as in the first exemplary embodiment.

[Sixth Exemplary Embodiment]

Figure 35:
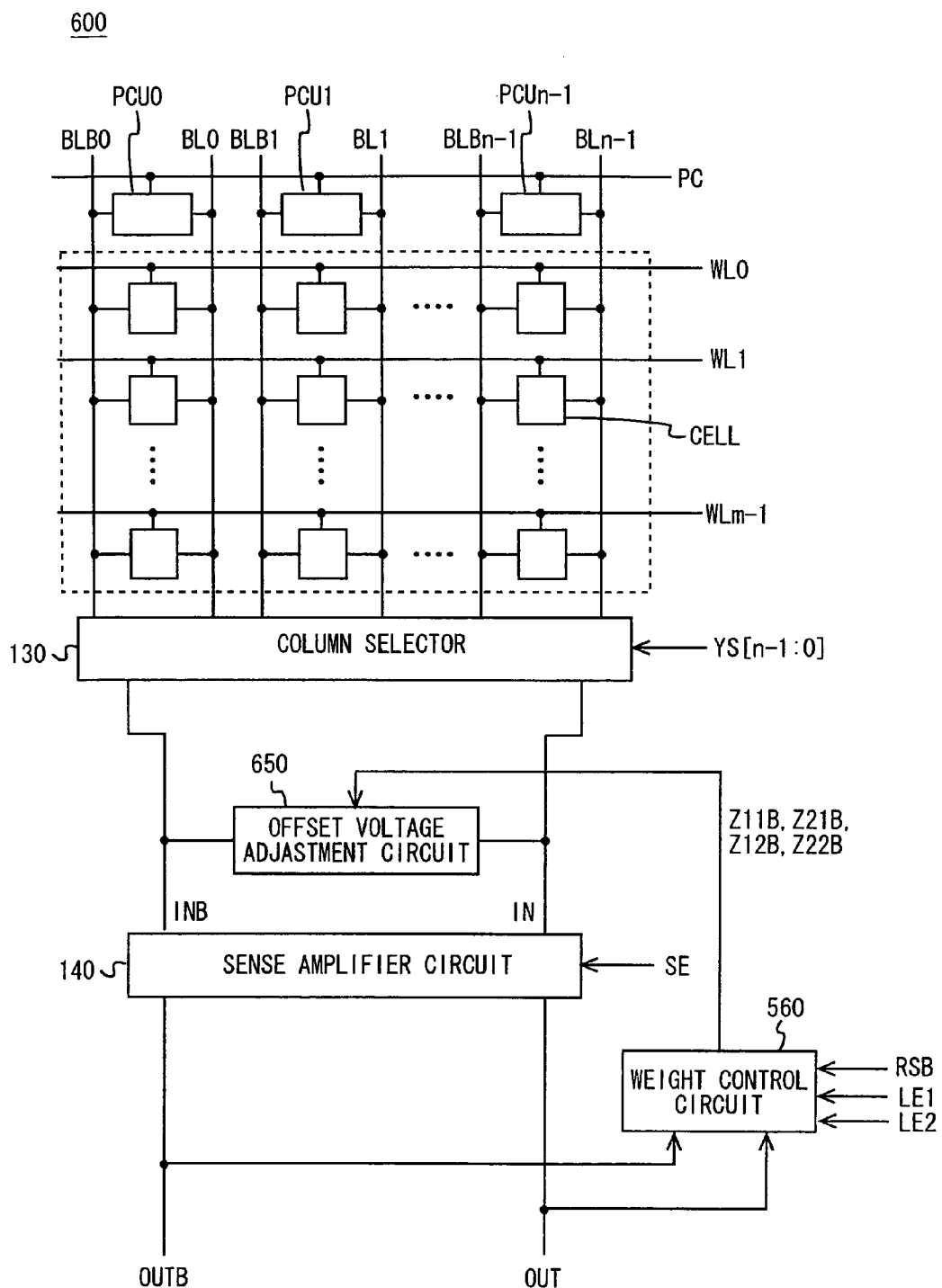
FIG. 35 shows a configuration of SRAM according to a sixth exemplary embodiment.

A sixth exemplary embodiment of the present invention is described hereinafter in detail with reference to the drawings. In the sixth exemplary embodiment, like the fifth exemplary embodiment, the present invention is applied to SRAM. FIG. 35 shows a configuration of SRAM 600 according to the sixth exemplary embodiment. Referring to FIG. 35, the SRAM 600 includes a memory cell array 110, precharge circuits PCU0 to PCUn−1, a column selector 130, a sense amplifier circuit 140, an offset voltage adjustment circuit 650, and a weight control circuit 560. The sixth exemplary embodiment is different from the fifth exemplary embodiment in the configuration and the connected position of the offset voltage adjustment circuit 650. Thus, in the sixth exemplary embodiment, the different point is mainly described, and the same configuration as that of the fifth exemplary embodiment is not redundantly described.

Referring to FIG. 35, the offset voltage adjustment circuit 650 is connected to the sense amplifier input terminal pair IN and INB of the sense amplifier circuit 140. Further, the offset voltage adjustment circuit 650 performs the weight setting operation according to weight control signals Z11B, Z21B, Z12B and Z22B, which are the inverted signals of the weight control signals Z11, Z21, Z12 and Z22 that are output from the weight control circuit 560. The offset voltage adjustment circuit 650 thereby sets the weights of drivabilities of the output terminals OUT and OUTB of the sense amplifier circuit 140.

The weight control circuit 560 is connected to the output of the sense amplifier circuit 140, just like in the fifth exemplary embodiment. The weight control circuit 560 is activated by weight control activation signals LE1 and LE2. The weight control circuit 560 according to the sixth exemplary embodiment performs the offset voltage determination of the sense amplifier circuit 140 and outputs the weight control signals Z11B, Z21B, Z12B and Z22B to the offset voltage adjustment circuit 650 based on its result. The offset voltage adjustment circuit 650 is controlled by the weight control signals Z11B, Z21B, Z12B and Z22B to thereby set the weights of drivabilities of the output terminals OUT and OUTB of the sense amplifier circuit 140.

Figure 36:
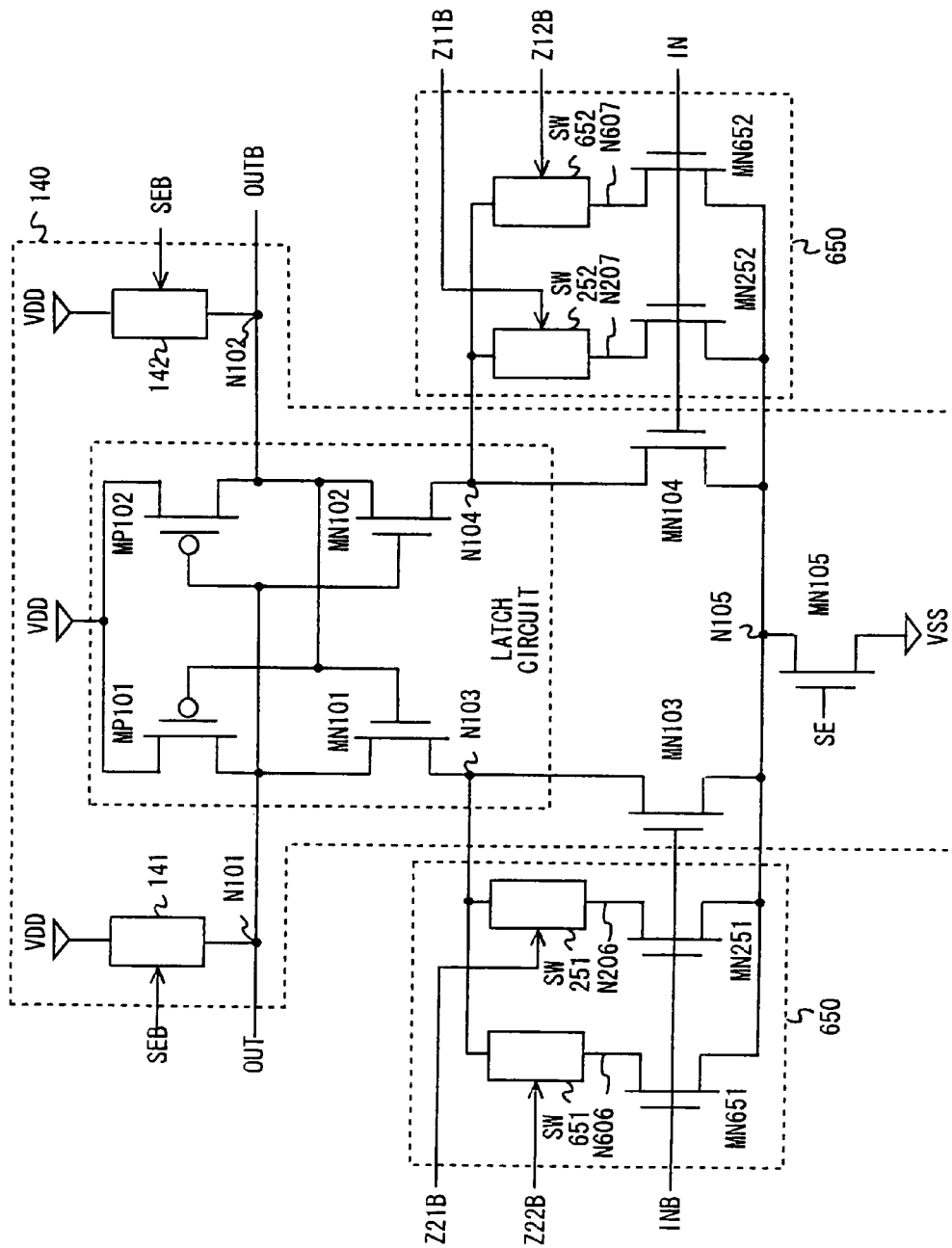
FIG. 36 shows a first configuration of a sense amplifier circuit and an offset voltage adjustment circuit according to the sixth exemplary embodiment.

FIG. 36 shows the connection and detailed configuration of the sense amplifier circuit 140 and the offset voltage adjustment circuit 650. The configuration of the sense amplifier circuit 140 is the same as that of FIG. 2, and a detailed explanation thereof is omitted. Referring to FIG. 36, the offset voltage adjustment circuit 650 includes switch circuits SW251 and SW252, SW651 and SW652, and NMOS transistors MN251, MN252, MN651 and MN652.

The switch circuit SW251 has one end connected to a node N103 and the other end connected to a node N206. The switch circuit SW251 is driven by the weight control signal Z21B. The NMOS transistor MN251 has a drain connected to the node N206, a source connected to a node N105, and a gate connected to the sense amplifier input terminal INB. Further, the gate width of the NMOS transistor MN251 is set to the same value as the gate width of the NMOS transistor MN103 of the sense amplifier circuit 140, for example. However, the value of the gate width is just an example, and it is not particularly limited thereto.

The switch circuit SW651 has one end connected to the node N103 and the other end connected to a node N606. The switch circuit SW651 is driven by the weight control signal Z22B. The NMOS transistor MN651 has a drain connected to the node N606, a source connected to the node N105, and a gate connected to the sense amplifier input terminal INB. Further, the gate width of the NMOS transistor MN651 is set to ½ the gate width of the NMOS transistor MN251, for example. However, the value of the gate width is just an example, and it is not particularly limited thereto.

The switch circuit SW152 has one end connected to a node N104 and the other end connected to a node N207. The switch circuit SW252 is driven by the weight control signal Z11B. The NMOS transistor MN252 has a drain connected to the node N207, a source connected to the node N105, and a gate connected to the sense amplifier input terminal IN. Further, the gate width of the NMOS transistor MN252 is set to the same value as the gate width of the NMOS transistor MN104 of the sense amplifier circuit 140, for example. However, the value of the gate width is just an example, and it is not particularly limited thereto.

The switch circuit SW652 has one end connected to the node N104 and the other end connected to a node N607. The switch circuit SW652 is driven by the weight control signal Z12B. The NMOS transistor MN652 has a drain connected to the node N607, a source connected to the node N105, and a gate connected to the sense amplifier input terminal IN. Further, the gate width of the NMOS transistor MN652 is set to ½ the gate width of the NMOS transistor MN252, for example. However, the value of the gate width is just an example, and it is not particularly limited thereto.

Figure 37:
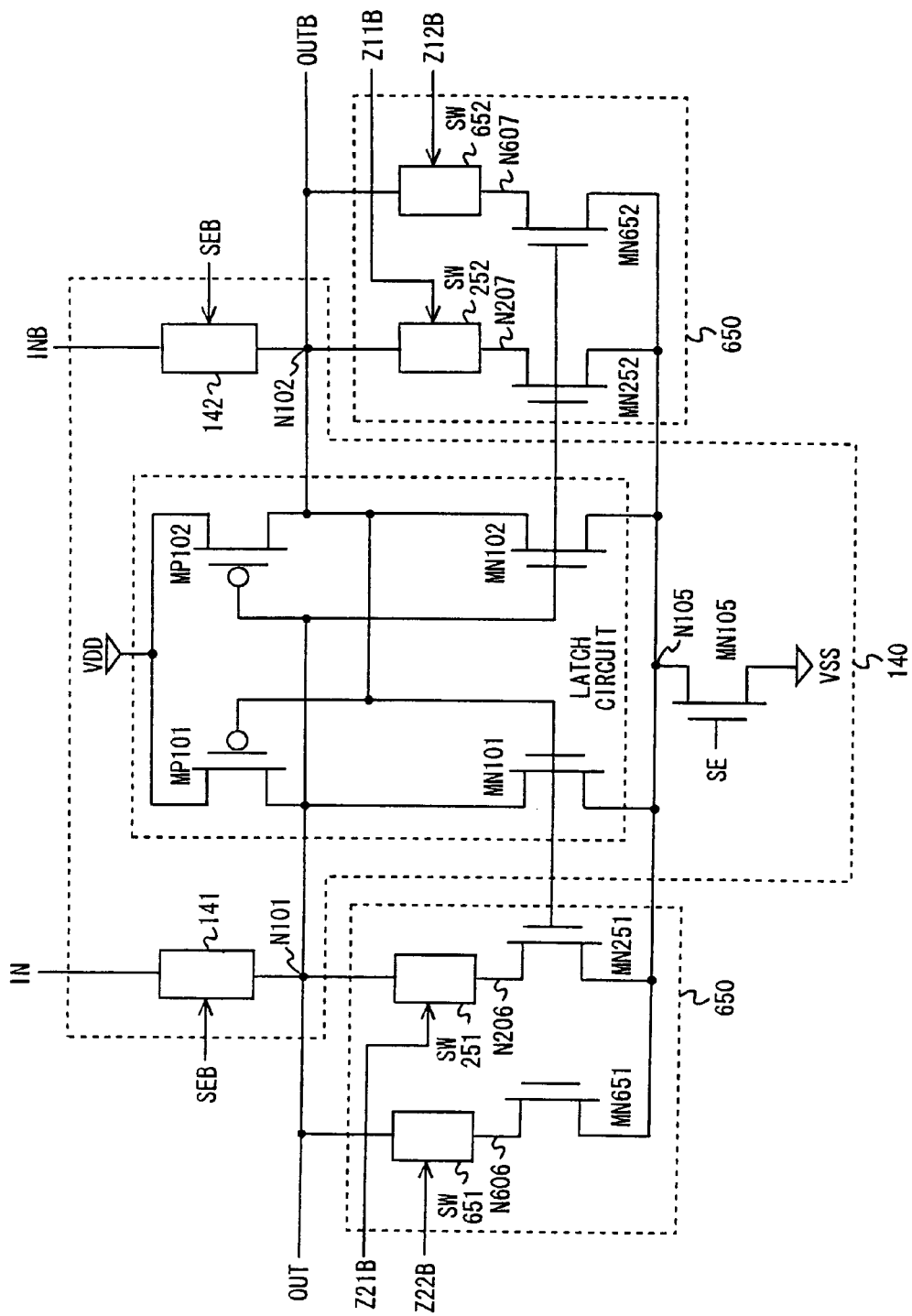
FIG. 37 shows a second configuration of the sense amplifier circuit and the offset voltage adjustment circuit according to the sixth exemplary embodiment.
Figure 38:
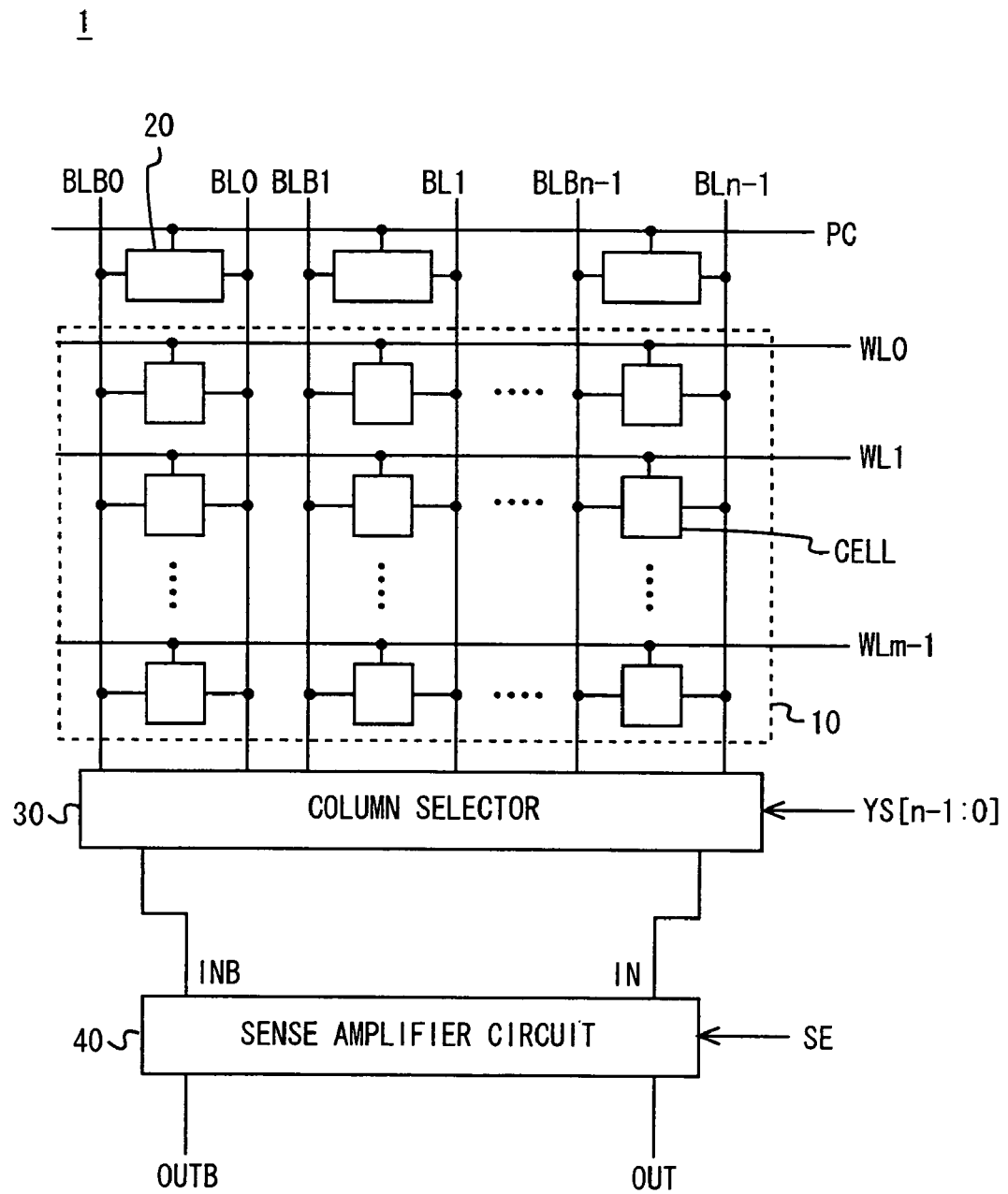
FIG. 38 shows a configuration of SRAM according to a related art.

FIG. 37 shows a configuration where the offset voltage adjustment circuit 650 having the same configuration as that of FIG. 36 is connected to the sense amplifier circuit 140 of a different variation from that of FIG. 36. The configuration of the sense amplifier circuit 140 is the same as that of FIG. 4, and a detailed explanation thereof is omitted. Referring to FIG. 32, the offset voltage adjustment circuit 650 includes switch circuits SW251, SW252, SW651 and SW652, and NMOS transistors MN251, MN252, MN651 and MN652.

The switch circuit SW251 has one end connected to a node N101 and the other end connected to a node N206. The switch circuit SW251 is driven by the weight control signal Z21B. The NMOS transistor MN251 has a drain connected to the node N206, a source connected to a node N105, and a gate connected to a node N102. Further, the gate width of the NMOS transistor MN251 is set to the same value as the gate width of the NMOS transistor MN103 of the sense amplifier circuit 140, for example. However, the value of the gate width is just an example, and it is not particularly limited thereto.

The switch circuit SW651 has one end connected to the node N101 and the other end connected to a node N606. The switch circuit SW651 is driven by the weight control signal Z22B. The NMOS transistor MN651 has a drain connected to the node N606, a source connected to the node N105, and a gate connected to the node N102. Further, the gate width of the NMOS transistor MN651 is set to ½ the gate width of the NMOS transistor MN251, for example. However, the value of the gate width is just an example, and it is not particularly limited thereto.

The switch circuit SW252 has one end connected to a node N102 and the other end connected to a node N207. The switch circuit SW252 is driven by the weight control signal Z11B. The NMOS transistor MN252 has a drain connected to the node N207, a source connected to the node N105, and a gate connected to a node N101. Further, the gate width of the NMOS transistor MN252 is set to the same value as the gate width of the NMOS transistor MN104 of the sense amplifier circuit 140, for example. However, the value of the gate width is just an example, and it is not particularly limited thereto.

The switch circuit SW652 has one end connected to the node N102 and the other end connected to a node N607. The switch circuit SW652 is driven by the weight control signal Z12B. The NMOS transistor MN652 has a drain connected to the node N607, a source connected to the node N105, and a gate connected to the node N101. Further, the gate width of the NMOS transistor MN652 is set to ½ the gate width of the NMOS transistor MN252, for example. However, the value of the gate width is just an example, and it is not particularly limited thereto.

The weight control circuit 560 used in the sixth exemplary embodiment is a logical circuit according to the table of FIG. 31, as in the fifth exemplary embodiment. However, the weight control signals Z11B, Z21B, Z12B and Z22B are the inverted signals of the weight control signals Z11, Z21, Z12 and Z22 in FIG. 31. Further, the timing chart and the flow chart of the SRAM 600 according to the sixth exemplary embodiment respectively correspond to those shown in FIGS. 32 and 33 in the fifth exemplary embodiment, and the timing chart and the flow chart are omitted.

The operation of the SRAM 600 is described hereinbelow. In this exemplary embodiment, like the first exemplary embodiment, data of the SRAM cell CELL that is connected to the word line WL0 and the bit line pair BL0 and BLB0 is read, for example. Specifically, the word line WL0 is selected out of the word lines WL0 to WLm−1, and the column selector 130 selects the bit line pair BL0 and BLB0 according to the column selection signal YS[n−1:0]. The configuration of the offset voltage adjustment circuit 650 and the sense amplifier circuit 140 is the same as that shown in FIG. 36. Further, in the period when the precharge signal PC is Low level, the sense amplifier input terminal pair IN and INB conducted and selected by the column selector 130 is pre-charged to the power supply voltage VDD together with the bit lines.

Referring to FIG. 32, before time t1, the bit line pair BL0 and BLB0 is pre-charged to the power supply voltage VDD by the precharge circuit PCU0. At time t1, the word-line signal WL0 is activated. According to the data stored in the selected SRAM cell CELL, one potential of the bit line pair BL0 and BLB0 starts dropping gradually. Further, in response to the column selection signal YS[n−1:0], the column selector 130 selects the bit line pair BL0 and BLB0. Therefore, the input terminal pair of the sense amplifier circuit 140 and the bit line pair BL0 and BLB0 are connected.

Further, at the same time as when the word-line signal is activated, the sense amplifier activation signal SE rises, and the sense amplifier circuit 140 is activated. Thus, "0" or "1" is output as the output data OUT according to the polarity of the offset voltage of the sense amplifier circuit 140. Note that the inverted signal of the output data OUT is output as the output data OUTB. Note that the inverted signal of the output data OUT is output as the output data OUTB. The operation is referred to hereinafter as the first offset voltage determination operation.

At the same time as when the sense amplifier circuit 140 is activated at time t1, the weight control activation signal LE1 rises. The latch operation is thereby performed in the latch circuits 563 and 565 constituting the weight control circuit 560. Thus, the output data OUT and OUTB are stored in the latch circuits 563 and 565, and the weight control signals Z11 and Z12 are output. The logical operation is performed according to the truth table shown in FIG. 31 described above. However, because the weight control activation signal LE2 remains Low level, it corresponds to (LE1, LE2)=(1, 0) in the truth table shown in FIG. 31.

For example, when the values of the output data OUT and OUTB are "1" and "0", respectively, the weight control signals Z11 and Z21 are (Z11, Z21)=(0, 1), and the weight control signals Z11B and Z21B are (Z11B, Z21B)=(1, 0). Note that the weight control signals Z12 and Z22 are (Z12, Z22)=(0, 0), and the weight control signals Z12B and Z22B are (Z12B, Z22B)=(1, 1) at this time.

Thus, only the switch circuit SW251 driven by the weight control signal Z21B is disconnected. Consequently, the drive capability on the output terminal OUT side (the node N101 side) of the sense amplifier circuit 140 decreases, and the weight setting×(−1) is made. The effective offset voltage of the sense amplifier circuit 140 is thereby reduced compared to the original offset voltage.

On the other hand, when the values of the output data OUT and OUTB are "0" and "1", respectively, the weight control signals Z11 and Z21 are (Z11, Z21)=(1, 0), and the weight control signals Z11B and Z21B are (Z11B, Z21 B)=(0, 1).

Thus, only the switch circuit SW252 driven by the weight control signal Z11B is disconnected. Consequently, the drive capability on the output terminal OUTB side (the node N102 side) of the sense amplifier circuit 140 decreases, and the weight setting×1 is made. The effective offset voltage of the sense amplifier circuit 140 is thereby reduced compared to the original offset voltage. The operation from the time t1 to t2 is referred to hereinafter as the first weight setting operation.

Then, at time t3, the sense amplifier activation signal SE rises again, and the sense amplifier circuit 140 is activated. Thus, "0" or "1" is output as the output data OUT according to the polarity of the offset voltage of the sense amplifier circuit 140 that reflects the first weight setting operation. Note that the inverted signal of the output data OUT is output as the output data OUTB. The operation is referred to hereinafter as the second offset voltage determination operation.

Further, at time t3, at the same time as the activation of the sense amplifier circuit 140, the weight control activation signal LE2 rises. The weight control circuit 560 thereby operates and performs the logical operation according to the truth table shown in FIG. 31. However, because the weight control activation signal LE1 remains Low level, it corresponds to (LE1, LE2)=(0, 1) in the truth table shown in FIG. 31. At this time, the values in the first weight setting operation are held as the values of the weight control signals Z11 and Z21 as shown in FIG. 31.

For example, when the values of the output data OUT and OUTB are "1" and "0", respectively, the weight control signals Z12 and Z22 are (Z12, Z22)=(0, 1), and the weight control signals Z12B and Z22B are (Z12B, Z22B)=(1, 0). Thus, only the switch circuit SW651 driven by the weight control signal Z22B is disconnected. Consequently, the drive capability on the output terminal OUT side (the node N101 side) of the sense amplifier circuit 140 decreases, and the weight setting×(−½) is made. The effective offset voltage of the sense amplifier circuit 140 is thereby reduced compared to the offset voltage after the first weight setting operation.

On the other hand, when the values of the output data OUT and OUTB are "0" and "1", respectively, the weight control signals Z12 and Z22 are (Z12, Z22)=(1, 0), and the weight control signals Z12B and Z22B are (Z12B, Z22B)=(0, 1). Thus, only the switch circuit SW652 driven by the weight control signal Z12B is disconnected. Consequently, the drive capability on the output terminal OUTB side (the node N102 side) of the sense amplifier circuit 140 decreases, and the weight setting×½ is made. The effective offset voltage of the sense amplifier circuit 140 is thereby reduced compared to the offset voltage after the first weight setting operation. The operation from the time t3 to t4 is referred to hereinafter as the second weight setting operation.

After completion of the second offset voltage determination and the second weight setting operation described above, the process proceeds to the determination operation of actual read data from the selected SRAM cell CELL. Specifically, when the sense amplifier activation signal SE rises at time t5, the read data corresponding to the data stored in the selected SRAM cell CELL appears at the output of the sense amplifier circuit 140.

The offset voltage reduction effect in the above-described configuration according to the sixth exemplary embodiment is the same as that shown in FIG. 34 according to the fifth exemplary embodiment. Thus, in the sixth exemplary embodiment also, by performing the offset voltage determination and the weight change operation twice, it is possible to further reduce the offset voltage compared to the case of performing the operation once as in the second exemplary embodiment.

The present invention is not restricted to the above-described exemplary embodiments, and various changes and modifications may be made without departing from the scope of the invention. For example, although the offset voltage is reduced by the first and second weight setting operations in the fifth exemplary embodiment, the weight setting operation may be performed a plurality of more times. However, in this case, switch circuits that connect load capacitors having smaller capacitance values than those of the load capacitors C501 and C502 to the output terminals OUT and OUTB are necessary. This configuration enables further reduction of the offset voltage.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

The first to sixth exemplary embodiments can be combined as desirable by one of ordinary skill in the art.

What is claimed is:

1. A semiconductor memory device comprising:
   a plurality of memory cells that are connected to a word line and read data;
   a plurality of bit line pairs that are connected respectively to the plurality of memory cells;
   a precharge circuit that pre-charges the plurality of bit line pairs according to a precharge signal;
   a column selector that selects one of the plurality of bit line pairs according to a column selection signal;
   a sense amplifier circuit that has an input terminal pair connected to the column selector and is activated according to a sense amplifier activation signal;
   a weight control circuit that is connected to an output terminal pair of the sense amplifier circuit and outputs a weight control signal with a value corresponding to an output of the activated sense amplifier circuit; and
   an offset voltage adjustment circuit that is connected to the sense amplifier circuit and adjusts an offset voltage of the sense amplifier circuit according to the weight control signal.

2. The semiconductor memory device according to claim 1, wherein the offset voltage adjustment circuit is connected to the output terminal pair of the sense amplifier circuit.

3. The semiconductor memory device according to claim 2, wherein the offset voltage adjustment circuit includes:
   first and second load capacitors; and
   first and second switch circuits that are respectively connected between the first and second load capacitors and the output terminal pair of the sense amplifier circuit and controlled to turn on and off according to the weight control signal.

4. The semiconductor memory device according to claim 2, wherein the offset voltage adjustment circuit includes:
   first and second inverters to which the weight control signal is input; and
   first and second MOS transistors that have gate terminals respectively connected to the output terminal pair of the sense amplifier circuit and drain terminals and source terminals respectively connected to output terminals of the first and second inverters, and are controlled to turn on and off by output signals of the first and second inverters.

5. The semiconductor memory device according to claim 2, wherein the offset voltage adjustment circuit includes:
   a first transistor that is connected between a first power supply terminal and one of the output terminal pair of the sense amplifier circuit, and has a control terminal connected to the other one of the output terminal pair of the sense amplifier circuit;
   a second transistor that is connected between the first power supply terminal and the other one of the output terminal pair of the sense amplifier circuit, and has a control terminal connected to one of the output terminal pair of the sense amplifier circuit;
   a first switch circuit that is connected between the first transistor and one of the output terminal pair of the sense amplifier circuit and controlled to turn on and off according to the weight control signal; and
   a second switch circuit that is connected between the second transistor and the other one of the output terminal pair of the sense amplifier circuit and controlled to turn on and off according to the weight control signal.

6. The semiconductor memory device according to claim 1, wherein the offset voltage adjustment circuit is connected to the input terminal pair of the sense amplifier circuit.

7. The semiconductor memory device according to claim 6, wherein the sense amplifier circuit includes:
   third and fourth transistors that have drive states controlled according to respective potential levels of the input terminal pair and output currents corresponding to the drive states to first and second nodes; and
   a latch circuit that include first and second inverter circuits having outputs connected to inputs of one another and supplied with drive currents from the first and second nodes, and the offset voltage adjustment circuit includes:
   a fifth transistor that is connected in parallel with the third transistor, has a drive state controlled according to a potential level of one of the input terminal pair, and outputs a current corresponding to the drive state to the first node;
   a sixth transistor that is connected in parallel with the fourth transistor, has a drive state controlled according to a potential level of one of the input terminal pair, and outputs a current corresponding to the drive state to the second node;

a first switch circuit that is connected between the fifth transistor and the first node; and a second switch circuit that is connected between the sixth transistor and the second node.

8. The semiconductor memory device according to claim 3, wherein the weight control circuit outputs the weight control signal to turn on one of the first and second switch circuits and turn off the other one of the first and second switch circuits or to maintain current switch states according to an output of the sense amplifier circuit activated at substantially the same timing as activation of a word-line signal.

9. The semiconductor memory device according to claim 4, wherein the weight control circuit outputs the weight control signal to turn on one of the first and second MOS transistors and turn off the other one of the first and second MOS transistors or to maintain current states of the first and second MOS transistors according to an output of the sense amplifier circuit activated at substantially the same timing as activation of a word-line signal.

10. The semiconductor memory device according to claim 5, wherein the weight control circuit outputs the weight control signal to turn on one of the first and second switch circuits and turn off the other one of the first and second switch circuits or to maintain current switch states according to an output of the sense amplifier circuit activated at substantially the same timing as activation of a word-line signal.

11. The semiconductor memory device according to claim 7, wherein the weight control circuit outputs the weight control signal to turn on one of the first and second switch circuits and turn off the other one of the first and second switch circuits or to maintain current switch states according to an output of the sense amplifier circuit activated at substantially the same timing as activation of a word-line signal.

12. The semiconductor memory device according to claim 3, wherein the weight control circuit outputs the weight control signal to turn on one of the first and second switch circuits and turn off the other one of the first and second switch circuits or to turn off both of the first and second switch circuits according to an output of the sense amplifier circuit in a time delayed for a given period from activation timing of the sense amplifier circuit activated at substantially the same timing as activation of a word-line signal.

13. The semiconductor memory device according to claim 4, wherein the weight control circuit outputs the weight control signal to turn on one of the first and second MOS transistors and turn off the other one of the first and second MOS transistors or to turn off both of the first and second MOS transistors according to an output of the sense amplifier circuit in a time delayed for a given period from activation timing of the sense amplifier circuit activated at substantially the same timing as activation of a word-line signal.

14. The semiconductor memory device according to claim 5, wherein the weight control circuit outputs the weight control signal to turn on one of the first and second switch circuits and turn off the other one of the first and second switch circuits or to turn off both of the first and second switch circuits according to an output of the sense amplifier circuit in a time delayed for a given period from activation timing of the sense amplifier circuit activated at substantially the same timing as activation of a word-line signal.

15. The semiconductor memory device according to claim 7, wherein the weight control circuit outputs the weight control signal to turn on one of the first and second switch circuits and turn off the other one of the first and second switch circuits or to turn off both of the first and second switch circuits according to an output of the sense amplifier circuit in a time delayed for a given period from activation timing of the sense amplifier circuit activated at substantially the same timing as activation of a word-line signal.

16. The semiconductor memory device according to claim 1, wherein the weight control circuit includes:

first and second latch circuits that output the weight control signal according to a weight control activation signal, a reset signal, and an output of the sense amplifier circuit, and the first and second latch circuits latch a value corresponding to an output of the sense amplifier circuit and output the value as the weight control signal when the weight control activation signal and the reset signal are in a combination of a first value, hold the weight control signal regardless of an output value of the activated sense amplifier circuit when the weight control activation signal and the reset signal are in a combination of a second value, and reset the weight control signal regardless of an output value of the activated sense amplifier circuit when the weight control activation signal and the reset signal are in a combination of a third value.

17. The semiconductor memory device according to claim 16, wherein the weight control circuit includes:

a first transition detector that is connected between one of the output terminal pair of the sense amplifier circuit and the first latch circuit; and a second transition detector that is connected between the other one of the output terminal pair of the sense amplifier circuit and the second latch circuit, and the first and second transition detectors respectively include inverter circuits with a logic threshold voltage set smaller than ½ of a power supply voltage.

18. The semiconductor memory device according to claim 17, wherein the first and second latch circuits respectively include first to third NAND circuits, the first NAND circuit has one input terminal to receive an output signal of the first or second transition detector and the other input terminal to receive the weight control activation signal, and outputs an operation result to one input terminal of the third NAND circuit, the second NAND circuit has one input terminal to receive the reset signal and the other input terminal to receive an output signal of the third NAND circuit, and outputs an operation result to the other input terminal of the third NAND circuit, and the third NAND circuit has one input terminal to receive an output signal of the first NAND circuit and the other input terminal to receive an output signal of the second NAND circuit, and outputs an operation result as the weight control signal.

19. The semiconductor memory device according to claim 3, wherein the offset voltage adjustment circuit includes:

third and fourth load capacitors respectively having smaller capacitance values than the first and second load capacitors; and third and fourth switch circuits that are respectively connected between the third and fourth load capacitors and the output terminal pair of the sense amplifier circuit and controlled to turn on and off according to the weight control signal.

20. The semiconductor memory device according to claim 4, wherein the offset voltage adjustment circuit includes:

third and fourth inverters to which the weight control signal is input; and third and fourth MOS transistors respectively having smaller gate areas than the first and second MOS transistors, that have gate terminals respectively connected to the output terminal pair of the sense amplifier circuit and drain terminals and source terminals respectively connected to output terminals of the third and fourth inverters, and are controlled to turn on and off by output signals of the third and fourth inverters.

21. The semiconductor memory device according to claim 5, wherein the offset voltage adjustment circuit includes:
a seventh transistor that has a lower drive capability than the first transistor, is connected between the first power supply terminal and one of the output terminal pair of the sense amplifier circuit, and has a control terminal connected to the other one of the output terminal pair of the sense amplifier circuit;
an eighth transistor that has a lower drive capability than the second transistor, is connected between the first power supply terminal and the other one of the output terminal pair of the sense amplifier circuit, and has a control terminal connected to one of the output terminal pair of the sense amplifier circuit;
a third switch circuit that is connected between the seventh transistor and one of the output terminal pair of the sense amplifier circuit and controlled to turn on and off according to the weight control signal; and
a fourth switch circuit that is connected between the eighth transistor and the other one of the output terminal pair of the sense amplifier circuit and controlled to turn on and off according to the weight control signal.

22. The semiconductor memory device according to claim 7, wherein the offset voltage adjustment circuit includes:
a seventh transistor that has a lower drive capability than the fifth transistor, is connected in parallel with the third transistor, has a drive state controlled according to a potential level of one of the input terminal pair, and outputs a current corresponding to the drive state to the first node;
an eighth transistor that has a lower drive capability than the sixth transistor, is connected in parallel with the fourth transistor, has a drive state controlled according to a potential level of one of the input terminal pair, and outputs a current corresponding to the drive state to the second node;
a third switch circuit that is connected between the seventh transistor and the first node; and
a fourth switch circuit that is connected between the eighth transistor and the second node.

23. The semiconductor memory device according to claim 19, wherein the weight control circuit outputs the weight control signal to turn on one of the first and second switch circuits and turn off the other one of the first and second switch circuits or to maintain current switch states according to an output of the sense amplifier circuit activated during a first period at substantially the same timing as activation of a word-line signal, and outputs the weight control signal to turn on one of the third and fourth switch circuits and turn off the other one of the third and fourth switch circuits or to maintain current switch states according to an output of the sense amplifier circuit activated during a subsequent second period.

24. The semiconductor memory device according to claim 20, wherein the weight control circuit outputs the weight control signal to turn on one of the first and second MOS transistors and turn off the other one of the first and second MOS transistors or to maintain current states of the first and second MOS transistors according to an output of the sense amplifier circuit activated during a first period at substantially the same timing as activation of a word-line signal, and outputs the weight control signal to turn on one of the third and fourth MOS transistors and turn off the other one of the third and fourth MOS transistors or to maintain current states of the third and fourth MOS transistors according to an output of the sense amplifier circuit activated during a subsequent second period.

25. The semiconductor memory device according to claim 21, wherein the weight control circuit outputs the weight control signal to turn on one of the first and second switch circuits and turn off the other one of the first and second switch circuits or to maintain current switch states according to an output of the sense amplifier circuit activated during a first period at substantially the same timing as activation of a word-line signal, and outputs the weight control signal to turn on one of the third and fourth switch circuits and turn off the other one of the third and fourth switch circuits or to maintain current switch states according to an output of the sense amplifier circuit activated during a subsequent second period.

26. The semiconductor memory device according to claim 22, wherein the weight control circuit outputs the weight control signal to turn on one of the first and second switch circuits and turn off the other one of the first and second switch circuits or to maintain current switch states according to an output of the sense amplifier circuit activated during a first period at substantially the same timing as activation of a word-line signal, and outputs the weight control signal to turn on one of the third and fourth switch circuits and turn off the other one of the third and fourth switch circuits or to maintain current switch states according to an output of the sense amplifier circuit activated during a subsequent second period.

27. The semiconductor memory device according to claim 1, wherein the weight control circuit includes:
first to fourth latch circuits that output the weight control signal according to first and second weight control activation signals, a reset signal, and an output of the sense amplifier circuit,
the first latch circuit latches a value corresponding to one output of the sense amplifier circuit when the first and second weight control activation signals and the reset signal are in a combination of a first value,
the second latch circuit latches a value corresponding to one output of the sense amplifier circuit when the first and second weight control activation signals and the reset signal are in a combination of a second value,
the third latch circuit latches a value corresponding to the other output of the sense amplifier circuit when the first and second weight control activation signals and the reset signal are in a combination of the first value,
the fourth latch circuit latches a value corresponding to the other output of the sense amplifier circuit and outputs the value as the weight control signal when the first and second weight control activation signals and the reset signal are in a combination of the second value,
the first to fourth latch circuits
hold the weight control signal regardless of an output value of the activated sense amplifier circuit when the first and second weight control activation signals and the reset signal are in a combination of a third value, and
reset the weight control signal regardless of an output value of the activated sense amplifier circuit when the first and second weight control activation signals and the reset signal are in a combination of a fourth value.

28. The semiconductor memory device according to claim 27, wherein the weight control circuit includes:
- a first transition detector that is connected between one of the output terminal pair of the sense amplifier circuit and the first and second latch circuits; and
- a second transition detector that is connected between the other one of the output terminal pair of the sense amplifier circuit and the third and fourth latch circuits, and
- the first and second transition detectors respectively include inverter circuits with a logic threshold voltage set smaller than ½ of a power supply voltage.

29. The semiconductor memory device according to claim 28, wherein
- the first to fourth latch circuits respectively include first to third NAND circuits,
- the first NAND circuit has one input terminal to receive an output signal of the first or second transition detector and the other input terminal to receive the first or second weight control activation signal, and outputs an operation result to one input terminal of the third NAND circuit,
- the second NAND circuit has one input terminal to receive the reset signal and the other input terminal to receive an output signal of the third NAND circuit, and outputs an operation result to the other input terminal of the third NAND circuit, and
- the third NAND circuit has one input terminal to receive an output signal of the first NAND circuit and the other input terminal to receive an output signal of the second NAND circuit, and outputs an operation result as the weight control signal.

30. The semiconductor memory device according to claim 1, wherein data of a bit line pair selected by the column selector is read after adjusting an offset voltage of the sense amplifier circuit.

* * * * *